United States Patent
Shim et al.

(10) Patent No.: US 9,209,244 B2
(45) Date of Patent: Dec. 8, 2015

(54) SEMICONDUCTOR DEVICE WITH VERTICAL STRUCTURES THAT PENETRATE CONDUCTIVE PATTERNS AND INTERLAYER INSULATING PATTERNS

(71) Applicants: Jae-Joo Shim, Gyeonggi-do (KR); Han-Soo Kim, Gyeonggi-do (KR); Woon-Kyung Lee, Gyeonggi-do (KR); Ju-Young Lim, Seoul (KR); Sung-Min Hwang, Seoul (KR)

(72) Inventors: Jae-Joo Shim, Gyeonggi-do (KR); Han-Soo Kim, Gyeonggi-do (KR); Woon-Kyung Lee, Gyeonggi-do (KR); Ju-Young Lim, Seoul (KR); Sung-Min Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 119 days.

(21) Appl. No.: 13/717,803

(22) Filed: Dec. 18, 2012

(65) Prior Publication Data
US 2013/0168800 A1 Jul. 4, 2013

(30) Foreign Application Priority Data
Jan. 4, 2012 (KR) .................. 10-2012-0001074

(51) Int. Cl.
*H01L 29/06* (2006.01)
*H01L 27/02* (2006.01)
*H01L 27/115* (2006.01)

(52) U.S. Cl.
CPC ........ *H01L 29/0657* (2013.01); *H01L 27/1157* (2013.01); *H01L 27/11582* (2013.01); *H01L 27/0207* (2013.01)

(58) Field of Classification Search
None
See application file for complete search history.

(56) References Cited

U.S. PATENT DOCUMENTS

| 6,255,170 | B1* | 7/2001 | Yu | H01L 27/115 257/E21.68 |
| 2010/0133598 | A1 | 6/2010 | Chae et al. | |
| 2010/0133599 | A1 | 6/2010 | Chae et al. | |
| 2010/0163968 | A1 | 7/2010 | Kim et al. | |
| 2010/0320528 | A1* | 12/2010 | Jeong | H01L 27/105 257/324 |
| 2011/0049646 | A1* | 3/2011 | Lim | H01L 21/28556 257/410 |
| 2011/0065270 | A1 | 3/2011 | Shim et al. | |
| 2011/0291172 | A1* | 12/2011 | Hwang | H01L 27/11578 257/314 |
| 2012/0068247 | A1* | 3/2012 | Lee | H01L 27/11551 257/316 |

FOREIGN PATENT DOCUMENTS

KR 1020100063385 A 6/2010
KR 1020100078776 A 7/2010

* cited by examiner

*Primary Examiner* — Steven Loke
*Assistant Examiner* — Juanita B Rhodes
(74) *Attorney, Agent, or Firm* — Myers Bigel Sibley & Sajovec, P.A.

(57) ABSTRACT

Provided is a semiconductor device that includes first and second isolation patterns disposed on a substrate. Alternately stacked interlayer insulating patterns and a conductive patterns are disposed on a surface of the substrate between the first and second isolation patterns. A support pattern penetrates the conductive patterns and the interlayer insulating patterns and has a smaller width than the first and second isolation patterns. First and second vertical structures are disposed between the first isolation and the support pattern and penetrate the conductive patterns and the interlayer insulating patterns. A second vertical structure is disposed between the second isolation pattern and the support pattern and penetrates the conductive patterns and the interlayer insulating patterns. A distance between top and bottom surfaces of the support pattern is greater than a distance between a bottom surface of the support pattern and the surface of the substrate.

20 Claims, 96 Drawing Sheets

SEMICONDUCTOR DEVICE WITH VERTICAL STRUCTURES THAT PENETRATE CONDUCTIVE PATTERNS AND INTERLAYER INSULATING PATTERNS

CROSS-REFERENCE TO RELATED APPLICATION

This application claims priority under 35 U.S.C. §119 to Korean Patent Application No. 10-2012-0001074 filed on Jan. 4, 2012, the disclosure of which is hereby incorporated by reference in its entirety.

BACKGROUND

Embodiments of the inventive concept relate to semiconductor devices, methods of fabricating the same, and related electronic devices and electronic systems.

Research into various methods of vertically forming a plurality of memory cells on a substrate has progressed in order to downscale semiconductor devices and improve the performance of semiconductor devices.

SUMMARY

Embodiments of the inventive concept provide semiconductor devices having highly reliable 3-dimensional transistors.

Other embodiments of the inventive concept provide methods of fabricating the semiconductor devices.

Other embodiments of the inventive concept provide electronic devices and electronic systems having the semiconductor devices.

Aspects of the inventive concept should not be limited by the above description, and other unmentioned aspects will be clearly understood by one of ordinary skill in the art from example embodiments described herein.

In accordance with an aspect of the inventive concept, a semiconductor device is provided. The device includes first and second isolation patterns disposed on a substrate. The device also may include alternately stacked interlayer insulating patterns and conductive patterns on a surface of the substrate between the first and second isolation patterns. A support pattern penetrates the conductive patterns and the interlayer insulating patterns and has a smaller width than the first and second isolation patterns. A first vertical structure penetrates the plurality of conductive patterns and the plurality of interlayer insulating patterns between the first isolation pattern and the support pattern. A second vertical structure penetrates the plurality of conductive patterns and the plurality of interlayer insulating patterns between the second isolation pattern and the support pattern. A distance between top and bottom surfaces of the support pattern is greater than a distance between the bottom surface of the support pattern and the surface of the substrate.

From a plan view, the first and second isolation patterns may have linear shapes substantially parallel to one another.

From a plan view, the support pattern may have a linear shape substantially parallel to the first and second isolation patterns.

The support pattern may include first portions having a first width, and second portions having a second width less than the first width.

The first portions of the support pattern may be disposed between the interlayer insulating patterns, and the second portions of the support pattern may be disposed between the conductive patterns.

Each of the first and second isolation patterns may have a third width at substantially the same level as the interlayer insulating patterns, and have a fourth width greater than the third width at substantially the same level as the conductive patterns.

The support pattern may have a top surface disposed at a different level from top surfaces of the first and second vertical structures.

The support pattern may include a main support pattern and subsidiary support patterns disposed on side surfaces of the main support pattern. The subsidiary support patterns may be disposed between the interlayer insulating patterns and the main support pattern and formed of a material different from a material of the main support pattern.

The conductive patterns may include at least one lower conductive pattern, a plurality of middle conductive patterns disposed on the at least one lower conductive pattern, and at least one upper conductive pattern disposed on the middle conductive patterns.

The first and second isolation patterns may have top surfaces disposed at a higher level than the support pattern and the first and second vertical structures.

A distance between the first isolation pattern and the first vertical structure may be different from a distance between the support pattern and the first vertical structure.

Each of the first and second vertical structures may include an active pattern and a dielectric material. The dielectric material may be interposed between the active pattern and the conductive patterns and extend between the active pattern and the interlayer insulating patterns.

In accordance with another aspect of the inventive concept, a semiconductor device is provided. The device includes isolation patterns disposed on a semiconductor substrate. Alternately stacked conductive patterns and interlayer insulating patterns are disposed on the substrate between the isolation patterns. Vertical structures penetrate the conductive patterns and the interlayer insulating patterns. A support pattern penetrates the plurality of conductive patterns and the plurality of interlayer insulating patterns between the vertical structures and has a smaller width than the isolation patterns. The support pattern has a first width in portions adjacent to the interlayer insulating patterns, and has a second width in portions adjacent to the conductive patterns, and the second width is different from the first width.

The first width of the support pattern may be greater than the second width thereof.

The support pattern may include a main support pattern and subsidiary support patterns formed of a material layer having an etch selectivity with respect to the main support pattern. The main support pattern may penetrate the conductive patterns and the interlayer insulating patterns. The subsidiary support patterns may include side subsidiary patterns interposed between the interlayer insulating patterns and the main support pattern, and a bottom subsidiary pattern interposed between the main support pattern and the substrate.

Each of the vertical structures may include an active pattern penetrating the conductive patterns and the interlayer insulating patterns, and a first dielectric pattern interposed between the active pattern and the conductive patterns and extending between the active pattern and the interlayer insulating patterns.

The semiconductor device may further include a second dielectric pattern interposed between the corresponding one of the vertical structures and the conductive patterns and extending between the conductive patterns and the interlayer insulating patterns and extending between the conductive patterns and the support patterns.

Each of the vertical structures may further include a protection dielectric pattern between the first dielectric pattern and the interlayer insulating patterns.

The semiconductor device may further include a recess region disposed in a surface of the semiconductor substrate. The support pattern may extend into the recess region.

The support pattern may include a conductive material layer and an insulating oxide interposed between the conductive material layer and the semiconductor substrate.

In accordance with another aspect of the inventive concept, a semiconductor device is provided. The device includes first and second isolation patterns disposed on a semiconductor substrate. A stack structure is disposed on the semiconductor substrate between the first and second isolation patterns. The stack structure includes conductive patterns, interlayer insulating patterns, and a capping pattern. A support pattern is disposed in the stack structure and having a smaller width than the first and second isolation patterns where the support pattern includes first portions contacting the interlayer insulating pattern and second portions contacting the conductive patterns, and wherein the first portions are wider than the second portions. A vertical active pattern structure is disposed in the stack structure and spaced apart from the support pattern. The conductive patterns include a lower conductive pattern, a plurality of middle conductive patterns disposed on the lower conductive pattern, and an upper conductive pattern disposed on the plurality of middle conductive patterns. The interlayer insulating patterns include a lowermost insulating pattern interposed between the lower conductive pattern and the semiconductor substrate, the lower insulating pattern interposed between the lower conductive pattern and the plurality of middle conductive patterns, middle interlayer patterns interposed between the plurality of middle conductive patterns, an upper insulating pattern interposed between the plurality of middle conductive patterns and the upper conductive pattern, and an uppermost insulating pattern disposed on the upper conductive pattern. The capping pattern is disposed on the uppermost insulating pattern. The support pattern penetrates the uppermost insulating pattern, the upper conductive pattern, the upper insulating pattern, the plurality of middle conductive patterns, and the middle interlayer patterns.

The support pattern may further extend into the lower insulating pattern. A bottom surface of the support pattern may be disposed at a higher level than the lower conductive pattern. A distance between bottom and top surfaces of the support pattern may be greater than a distance between the bottom surface of the support pattern and a surface of the semiconductor substrate The support pattern may penetrate the conductive patterns and the insulating patterns and extend below a surface of the semiconductor substrate.

The semiconductor device may further include a conductive line disposed on the stack structure. The conductive line may have a smaller width than the vertical active pattern structure.

One of the vertical active pattern structure and the support pattern may extend upward to penetrate the capping pattern, and the other thereof may be covered with the capping pattern.

The semiconductor device may further include an electrically conductive contact plug extending from the conductive line to the vertical active pattern structure. Additionally, the conductive contact plug may penetrate the capping pattern.

From a plan view, the plurality of vertical active pattern structures may be arranged such that vertical active pattern structures adjacent one another are non-colinear in between the isolation patterns and support patterns.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
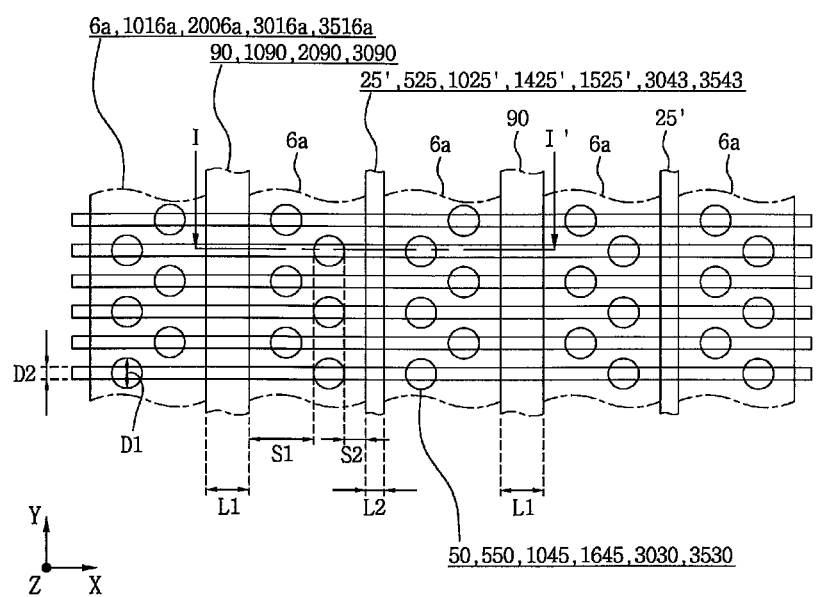
FIG. 1 is a plan view of a semiconductor device according to a first embodiment of the inventive concept.

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the sizes and relative sizes of layers and regions are exaggerated for clarity. Like numbers refer to like element throughout.

Embodiments of the inventive concept are described herein with reference to cross-section, plan, and block illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the inventive concept.

In the drawings, the thicknesses of layers and regions are exaggerated for clarity. It will also be understood that when a layer is referred to as being "on" another layer or substrate, it can be directly on the other layer or substrate or intervening layers may also be present. In contrast, when a layer is "directly on" another layer or substrate, no intervening layers are present. Portions denoted by the same reference numerals refer to the same components throughout.

Spatially relative terms, such as "top end", "bottom end", "top surface", "bottom surface", "upper", "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of lower and upper. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept.

It will be understood that, although terms, such as "support" or "isolation" may be used herein to describe various elements, components, regions, layers and/or sections, these elements, components, regions, layers and/or sections should not be limited by these terms. These terms are only used to distinguish one element, component, region, layer or section from another region, layer or section. Thus, a support pattern or isolation pattern discussed below could be termed, for example, a first pattern or second pattern without departing from the teachings of the inventive concept. For example, in the specification, a "support pattern" and an "isolation pattern" may be replaced with a "first pattern" and a "second pattern", respectively.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2A:
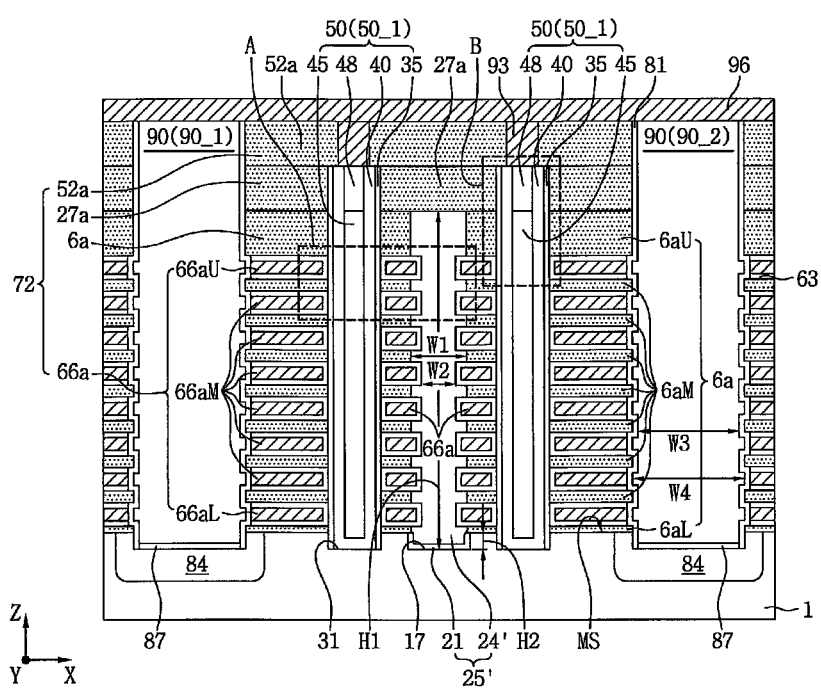
FIG. 2A is a cross-sectional view of the semiconductor device according to the first embodiment of the inventive concept.
Figure 2B:
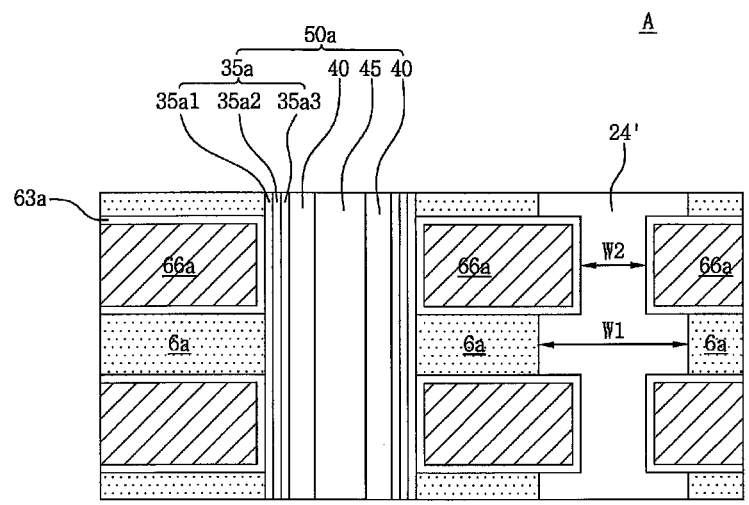
FIGS. 2B through 2D are respectively partial enlarged views of modified examples of portion "A" of FIG. 2A.
Figure 2C:
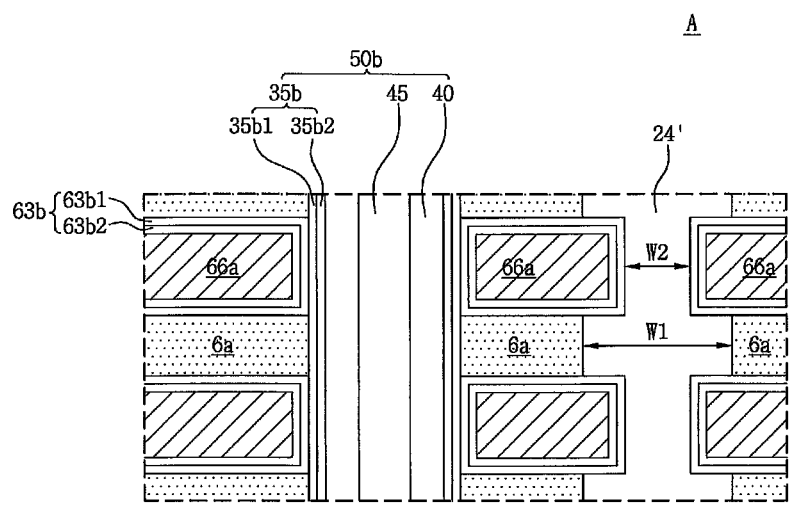
Figure 2D:
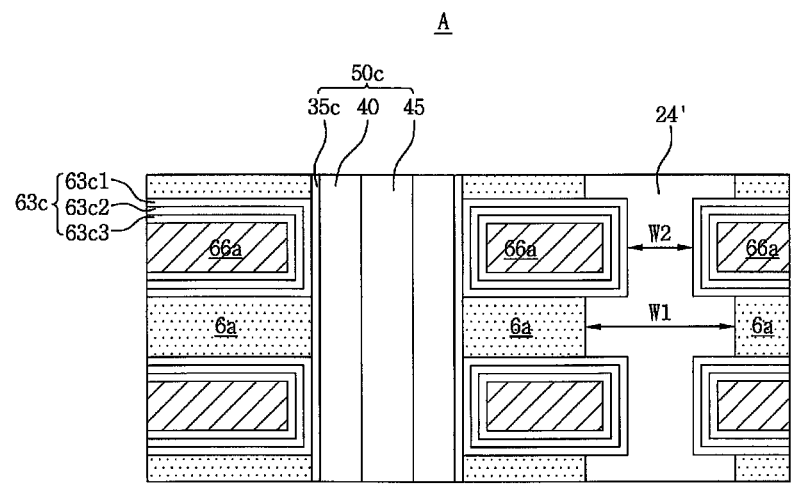
Figure 2E:
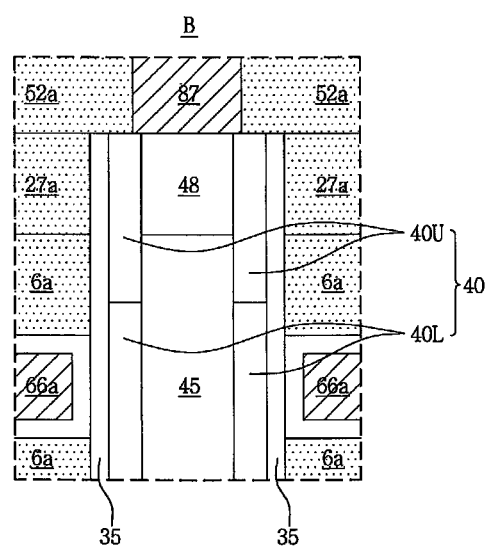
FIG. 2E is a partial enlarged view of portion "B" of FIG. 2A.

FIG. 1 is a plan view of a semiconductor device according to a first embodiment of the inventive concept. FIG. 2A is a cross-sectional view of the semiconductor device according to the first embodiment of the inventive concept. FIGS. 2B through 2D are respectively partial enlarged views of modified examples of portion "A" of FIG. 2A. FIG. 2E is a partial enlarged view of portion "B" of FIG. 2A. Here, FIG. 2A shows a region taken along line I-I' of FIG. 1.

To begin with, a semiconductor device according to the first embodiment of the inventive concept will be described with reference to FIGS. 1 and 2A.

Referring to FIGS. 1 and 2A, a substrate 1 may be provided. The substrate 1 may be a semiconductor substrate. For example, the substrate 1 may be a silicon (Si) substrate, a germanium (Ge), or a silicon-germanium (SiGe) substrate. Meanwhile, the substrate 1 may be a silicon-on-insulator (SOI) layer. The substrate 1 may include a memory cell array region in which memory cells are formed, and a peripheral circuit region in which peripheral circuits for operating the memory cells are formed.

Stack structures 72 may be disposed on the substrate 1. Each of the stack structures 72 may include a plurality of interlayer insulating patterns 6a and a plurality of conductive patterns 66a alternately and repetitively stacked on the substrate 1 in a vertical direction. In addition, each of the stack structures 72 may further include a first capping pattern 27a and a second capping pattern 52a.

The conductive patterns 66a may be spaced apart from one another by the interlayer insulating patterns 6a and vertically stacked. The conductive patterns 66a may include a lowermost conductive pattern 66aL, a plurality of middle conductive patterns 66aM disposed on the lowermost conductive pattern 66aL, and an uppermost conductive pattern 66aU disposed on the middle conductive patterns 66aM. The conductive patterns 66a may include at least one of a doped semiconductor (e.g., a doped silicon), a metal (e.g., tungsten (W), copper (Cu), or aluminum (Al)), a conductive metal nitride (e.g., titanium nitride (TiN), tantalum nitride (TaN), or tungsten nitride (WN)), a conductive metal-semiconductor compound (e.g., a metal silicide), or a transition metal (e.g., titanium (Ti) or tantalum (Ta)). For example, each of the conductive patterns 66a may include a tungsten layer and a titanium nitride layer.

When a semiconductor device according to embodiments of the inventive concept is used in a non-volatile memory device, such as a flash memory device, the lowermost conductive pattern 66aL may be used as a ground selection gate electrode, and the uppermost conductive pattern 66aU may be used as a string selection gate electrode. Most or all of the middle conductive patterns 66aM may be used as cell gate electrodes.

The interlayer insulating patterns 6a may include a lowermost interlayer insulating pattern 6aL, middle interlayer insulating patterns 6aM disposed on the lowermost interlayer insulating pattern 6aL, and an uppermost interlayer insulating pattern 6aU disposed on the middle interlayer insulating patterns 6aM. The uppermost interlayer insulating pattern 6aU may be thicker than the lowermost interlayer insulating pattern 6aL. Each of the middle interlayer insulating patterns 6aM may be thicker than the lowermost interlayer insulating pattern 6aL. Each of the middle interlayer insulating patterns 6aM may be thinner than the uppermost interlayer insulating pattern 6aU. The interlayer insulating patterns 6a may be formed of an insulating material, such as silicon oxide. The first capping pattern 27*a* and the second capping pattern 52*a* may be disposed on the uppermost interlayer insulating pattern 6*a*U and formed of an insulating material, such as silicon oxide.

A plurality of isolation patterns 90 may be disposed on the substrate 1. The isolation patterns 90 may be formed of an insulating material (e.g., silicon oxide). From a plan view, the isolation patterns 90 may have linear shapes substantially parallel to one another. From a plan view, the stack structures 72 and the isolation patterns 90 may be alternately and repetitively arranged. For instance, a single stack structure 72 may be disposed on a surface MS of the substrate 1 between a first isolation pattern 90_1 and a second isolation pattern 90_2 disposed adjacent to each other. Similarly, a single isolation pattern 90 may be disposed on the substrate 1 between two adjacent stack structures 72. Accordingly, the stack structure 72 including the plurality of interlayer insulating patterns 6*a* and the plurality of conductive patterns 66*a* alternately and repetitively stacked on the surface MS of the substrate 1 between the first and second isolation patterns 90_1 and 90_2 disposed adjacent to each other may be disposed.

Insulating spacers 81 may be disposed between the isolation patterns 90 and the stack structures 72. The insulating spacers 81 may be formed of an insulating material, such as silicon oxide or silicon nitride.

Impurity regions 84 may be disposed in the substrate 1 under the isolation patterns 90. The impurity regions 84 may have a different conductivity type from the substrate 1 disposed adjacent to the impurity regions 84. The impurity regions 84 may have an N conductivity type, while the substrate 1 disposed adjacent to the impurity regions 84 may have a P conductivity type. The impurity regions 84 may be used as common source regions of a non-volatile memory device, such as a flash memory device.

Metal-semiconductor compounds 87 may be disposed between the substrate 1 where the impurity regions 84 are formed, and the isolation patterns 90. The metal-semiconductor compounds 87 may be formed of a metal silicide, such as cobalt silicide, titanium silicide, or nickel silicide.

Support patterns 25 may be disposed between the adjacent isolation patterns 90. For example, at least one support pattern 25' may be disposed between the adjacent first and second isolation patterns 90_1 and 90_2 out of the isolation patterns 90. Top surfaces of the support patterns 25' may be disposed at a lower level than top surfaces of the isolation patterns 90. A width L2 of the support patterns 25' may be less than a width L1 of the isolation patterns 90. The width L1 of the isolation patterns 90 may be about 1.5 times greater than the width L2 of the support patterns 25'.

Each of the support patterns 25' may have a first portion having a first width W1, and a second portion having a second width W2 less than the first width W1. Each of the isolation patterns 90 has a third width W3 that may be at substantially the same level as the interlayer insulating patterns 6*a*, and has a fourth width W4 greater than the third width W3 that may be at substantially the same level as the conductive patterns 66*a*.

The support patterns 25' may be disposed in the stack structures 72. The support patterns 25 may have linear shapes. The support patterns 25 may be substantially parallel to the isolation patterns 90. For example, the support patterns 25 and the isolation patterns 90 may have linear shapes substantially parallel to one another.

The support patterns 25' may penetrate the interlayer insulating patterns 6*a* and the conductive patterns 66*a* of the stack structures 72. Furthermore, each of the support patterns 25' may extend to a recess region 17 of the substrate 1. The recess region 17 of the substrate 1 may have a bottom surface disposed at a lower level than the surface MS of the substrate 1. Accordingly, bottom surfaces of the support patterns 25' may be disposed at a lower level than the surface MS of the substrate 1.

A distance H2 between the bottom surfaces of the support patterns 25' and the surface MS of the substrate 1 may be less than a distance H1 between top surfaces of the support patterns 25' and the bottom surfaces thereof. The support patterns 25', between the interlayer insulating patterns 6*a*, may be in direct contact with side surfaces of the interlayer insulating patterns 6*a*. Accordingly, the support patterns 25' may serve to prevent warping or deformation of the interlayer insulating patterns 6*a* and prevent the occurrence of failures, such as cracks, in the interlayer insulating patterns 6*a*.

Each of the support patterns 25' may include a main support pattern 24' and an insulating oxide 21 disposed under the main support pattern 24'. The insulating oxide 21 may cover a bottom surface and sidewalls of the recess region 17. The insulating oxide 21 may be interposed between the main support pattern 24' and the substrate 1. The insulating oxide 21 may include silicon oxide obtained by oxidizing the substrate 1. The main support pattern 24' may be formed of an insulating material (e.g., silicon nitride or silicon oxide) or a conductive material (e.g., polysilicon (poly-Si)). When the main support pattern 24' includes a conductive material layer, the insulating oxide 21 may electrically insulate the main support pattern 24' from the substrate 1. The support patterns 25' may be covered with the first capping pattern 27*a*.

A plurality of vertical structures 50 may be disposed in the stack structures 72. The vertical structures 50 may penetrate the interlayer insulating patterns 6*a*, the conductive patterns 66*a*, and first capping patterns 27*a* in the stack structures 72. The vertical structures 50 may include a first vertical structure 50_1 interposed between the support pattern 25' and the first isolation pattern 90_1, and a second vertical structure 50_2 interposed between the support pattern 25 and the second isolation pattern 90_2. A distance S1 between the first vertical structure 50_1 and the first isolation pattern 90_1 may be different from a distance S2 between the first vertical structure 50_1 and the support pattern 25'. A plurality of vertical structures 50 may be arranged in zigzag or non-colinear arrangement between the isolation patterns 90 and the support patterns 25' disposed adjacent to one another.

The vertical structures 50 may have top surfaces disposed at a higher level than the top surfaces of the support patterns 25'. The vertical structures 50' may have top surfaces disposed at a lower level than the top surfaces of the isolation patterns 90. The isolation patterns 90 may have top surfaces disposed at a higher level than the support patterns 25'.

Each of the vertical structures 50 may have an active pattern 40 and a first dielectric pattern 35. The active pattern 40 may have a vertical shape. The active pattern 40 may be a semiconductor pattern that may be used as a channel region of a transistor. For example, the active pattern 40 may be a semiconductor pattern formed of poly-Si or single crystalline silicon.

The active pattern 40 may be electrically connected to a predetermined region of the substrate 1. The active pattern 40 may extend into the recess region 31 formed in the substrate 1. The recess region 31 may have a bottom surface disposed at a lower level than the surface MS of the substrate 1. In some embodiments, the active pattern 40 may have a hollow shape, for example, a pipe shape or macaroni shape. In this case, a bottom end of the active pattern 40 may be in a closed state. For example, each of the vertical structures 50 may have a gap filling pattern 45, a pad pattern 48 disposed on the gap filling pattern 45, and the active pattern 40 that covers side and bottom surfaces of the gap filling pattern 45 and extend onto side surfaces of the pad pattern 48. Furthermore, in the vertical structures 50, the first dielectric pattern 35 may be interposed between the active pattern 40 and the conductive patterns 66a and extend between the active pattern 40 and the interlayer insulating patterns 6a. Accordingly, the first dielectric pattern 35 may be interposed between the stack structure 72 and an outer side surface of the active pattern 40. The pad pattern 48 may include crystalline silicon. For example, the pad pattern 48 may be formed of poly-Si. The side surfaces of the pad pattern 48 may be in contact with the active pattern 40. The gap fill pattern 45 may be formed of an insulating material (e.g., silicon oxide).

In the vertical structures 50, the first dielectric patterns 35 may include a material layer having an etch selectivity with respect to the main support patterns 24' of the support patterns 25'.

Second dielectric patterns 63 may be interposed between the vertical structure 50 and the conductive patterns 66a and extend between the interlayer insulating patterns 6a and the conductive patterns 66a, and also between the support patterns 25 and the conductive patterns 66a.

During semiconductor processes and/or a process of transferring a semiconductor wafer to perform the semiconductor processes, the support patterns 25' may prevent occurrence of failures (e.g., cracks) in the middle interlayer insulating patterns 6aM, or damage to the middle interlayer insulating pattern 6aM due to deformation or warping of the middle interlayer insulating patterns 6aM caused by stress applied to the interlayer insulating patterns 6a, particularly, the middle interlayer insulating patterns 6aM. Also, the vertical structures 50 may prevent occurrence of failures (e.g., cracks) in the vertical structures 50 using the middle interlayer insulating patterns 6aM, which may be prevented from failing or being damaged using the support patterns 25'. That is, the support patterns 25' may be in contact with any one side surfaces of the middle interlayer insulating patterns 6aM and prevent deformation of or damage to the middle interlayer insulating patterns 6aM. Since the middle interlayer insulating patterns 6aM are not deformed or damaged, occurrence of failures, such as cracks, in the vertical structures 50 may be prevented.

A plurality of conductive lines 96 may be disposed on the isolation patterns 80 and the stack structures 72. Conductive contact plugs 93 may be disposed to electrically connect the conductive lines 96 with the vertical structures 50. The conductive contact plugs 93 may penetrate the second capping pattern 52a and electrically connect the conductive lines 96 with the pad patterns 48 of the vertical structures 50.

The vertical structures 50 may have a first width D1, while the conductive lines 91 may have a second width D2 less than the first width D1.

In the first embodiment according to the inventive concept, the first and second dielectric patterns 35 and 63 may be variously modified. The variously modified first and second dielectric patterns 35 and 63 will now be respectively described with reference to FIGS. 2B through 2D.

To begin with, the first and second dielectric patterns 35 and 63 according to the first embodiment will be described in further detail with reference to FIG. 2B.

Referring to FIGS. 2A and 2B, the first dielectric patterns 35 of FIG. 2A may include first dielectric patterns 35a including a plurality of dielectric layers. For example, each of the first dielectric patterns 35a may include a first dielectric layer 35a1, a second dielectric layer 35a2, and a third dielectric layer 35a3. The second dielectric layer 35a2 may be interposed between the first and third dielectric layers 35a1 and 35a3. The third dielectric layer 35a3 may be adjacent to the active pattern 40. The first dielectric layer 35a1 may be adjacent to the conductive patterns 66a and the interlayer insulating patterns 6a. Accordingly, vertical structures 50a including the first through third dielectric layers 35a1, 35a2, and 35a3 may be provided.

In some embodiments, the first dielectric layer 35a1 may be a barrier dielectric layer, and the second dielectric layer 35a2 may be a layer for storing information or charges, that is, a data storage layer. The third dielectric layer 35a3 may be a tunnel dielectric layer. Also, the second dielectric pattern 63 may be a blocking dielectric layer 63a.

The tunnel dielectric layer may include at least one of a silicon oxide layer and a nitrogen-doped silicon oxide layer. For example, when the third dielectric layer 35a3 is a tunnel dielectric layer, the third dielectric layer 35a3 may include a silicon oxide layer and/or a nitrogen-doped silicon oxide layer.

The data storage layer may be a layer for storing information in a non-volatile memory device, such as a flash memory device. For instance, the data storage layer may be a material layer capable of trapping charges to store information.

Accordingly, the second dielectric layer 35a2 serving as the data storage layer may be formed of a material capable of trapping and retaining electrons injected from the active pattern 40 through the third dielectric layer 35a3 serving as the tunnel dielectric layer, or a material capable of erasing the electrons trapped in the second dielectric layer 35a2 serving as the data storage layer based on operating conditions of a memory device. For example, the second dielectric layer 35a2 serving as the data storage layer may include at least one of silicon nitride and a high-k dielectric material. The high-k dielectric material may include a dielectric material (e.g., aluminum oxide (AlO), zirconium oxide (ZrO), hafnium oxide (HfO), or lanthanum oxide (LaO)) having a higher dielectric constant than silicon oxide.

The first dielectric layer 35a1 serving as a barrier dielectric layer may be formed of a dielectric material (e.g., silicon oxide) having a larger energy bandgap than a high-k dielectric material.

The second dielectric pattern 63a serving as a blocking dielectric layer may include a high-k dielectric material (e.g., a metal oxide, such as hafnium oxide and/or aluminum oxide) having a higher dielectric constant than the third dielectric layer 35a3 serving as the tunnel dielectric layer.

Among the support patterns 25', the main support pattern 24' may be formed of a material layer (e.g., a silicon nitride layer or a poly-Si layer) having an etch selectivity with respect to the first dielectric layer 35a1.

Next, a modified example of the first and second dielectric patterns 35 and 63 according to the first embodiment will be described in further detail with reference to FIG. 2C.

Referring to FIGS. 2A and 2C, each of the first and second dielectric patterns 35 and 63 of FIG. 2A may include a plurality of dielectric layers. For example, the first dielectric patterns 35 may be first dielectric patterns 35 including a first dielectric layer 35b1 and a second dielectric layer 35b2, and the second dielectric patterns 63 may be second dielectric patterns 63 including a third dielectric layer 63b1 and a fourth dielectric layer 63b2. Accordingly, vertical structures 50b including the first and second dielectric layers 35b1 and 35b2 may be provided.

In the first dielectric patterns 35b, the first dielectric layer 35b1 may be adjacent to the interlayer insulating patterns 6a and the conductive patterns 66a, while the second dielectric layer 35b2 may be adjacent to the active pattern 40. Accordingly, vertical structures 50b including modified dielectric patterns 35b may be provided.

In the second dielectric patterns 63b, the third dielectric layer 63b1 may be interposed between the conductive patterns 66a and the vertical structures 50b and extend between the interlayer insulating patterns 6a and the conductive patterns 66a, and the fourth dielectric layer 63b2 may be interposed between the third dielectric layer 63b1 and the conductive patterns 66a.

Any one of the first and second dielectric layers 35b1 and 63b1 may be a data storage layer. For instance, in the first dielectric patterns 35b, the first dielectric layer 35b1 may be a data storage layer, and the second dielectric layer 35b2 may be a tunnel dielectric layer. In the second dielectric patterns 63b, the third dielectric layer 63b1 may be a barrier dielectric layer, and the fourth dielectric layer 63b2 may be a blocking dielectric layer. In another case, in the first dielectric patterns 35b, the first dielectric layer 35b1 may be a barrier dielectric layer, and the second dielectric layer 35b2 may be a tunnel dielectric layer. In the second dielectric patterns 63b, the third dielectric layer 63b1 may be a data storage layer, and the fourth dielectric layer 63b2 may be a blocking dielectric layer.

Among the support patterns 25, the main support pattern 24 may be formed of a material layer (e.g., a poly-Si layer or a silicon oxide layer) having an etch selectivity with respect to the first dielectric layer 35b1.

Next, another modified example of the first and second dielectric patterns 35 and 63 according to the first embodiment will be described in further detail with reference to FIG. 2D.

Referring to FIGS. 2A and 2D, the first dielectric patterns 35 of FIG. 2A may be first dielectric patterns 35c including a tunnel dielectric layer, and the second dielectric patterns 63 of FIG. 2A may be second dielectric patterns 63c including a data storage layer 63c1 interposed between the conductive patterns 66a and the vertical structures 50c, a barrier dielectric layer 63c2 interposed between the data storage layer 63c1 and the conductive patterns 66a, and a blocking layer 63c3 interposed between the barrier dielectric layer 63c2 and the conductive patterns 66a. Vertical structures 50c including the first dielectric patterns 35c may be provided.

Next, the active pattern 40 and the pad pattern 48 according to the first embodiment will be described in further detail with reference to FIG. 2E.

Referring to FIGS. 2A and 2E, the active pattern 40 may include a first portion 40L and a second portion 40U having different electrical properties. The second portion 40U may be disposed on the first portion 40L and have the same conductivity type as the pad pattern 48.

The second portion 40U may be disposed in an upper region of the active region 40, and the first portion 40L may be disposed in the active region 40 disposed under the second portion 40U. The second portion 40U may be disposed in the active pattern 40 on the side surfaces of the pad pattern 48 and extend into the active region 40 disposed at a lower level than the pad pattern 48. A bottom portion of the second portion 40U may be interposed between the pad pattern 48 and the uppermost conductive pattern 66aU of the conductive patterns 66a. In another case, the bottom portion of the second portion 40U may be disposed at substantially the same level as a top surface of the uppermost conductive pattern 66aU, or interposed between top and bottom surfaces of the uppermost conductive pattern 66aU.

The first and second portions 40L and 40U of the active pattern 40 may have different electrical properties. For example, the second portion 40U may have an N-type semiconductor property, while the first portion 40L may have a P-type semiconductor property. In another case, the second portion 40U may have an N-type semiconductor property, and the first portion 40L may have an intrinsic semiconductor property. The second portion 40U of the active pattern 40 may have the same electrical properties as the pad pattern 48, for example, an N-type semiconductor property.

In the following embodiments, it is assumed that upper regions of active patterns and pad patterns have the same conductivity type, for example, an N-type semiconductor property. Hereinafter, detailed description thereof will be omitted for brevity.

A modified example of the semiconductor device according to the first embodiment according to the inventive concept will now be described with reference to FIG. 3A. Here, modified portions of the above-described semiconductor device according to the first embodiment will be chiefly described.

Figure 3A:
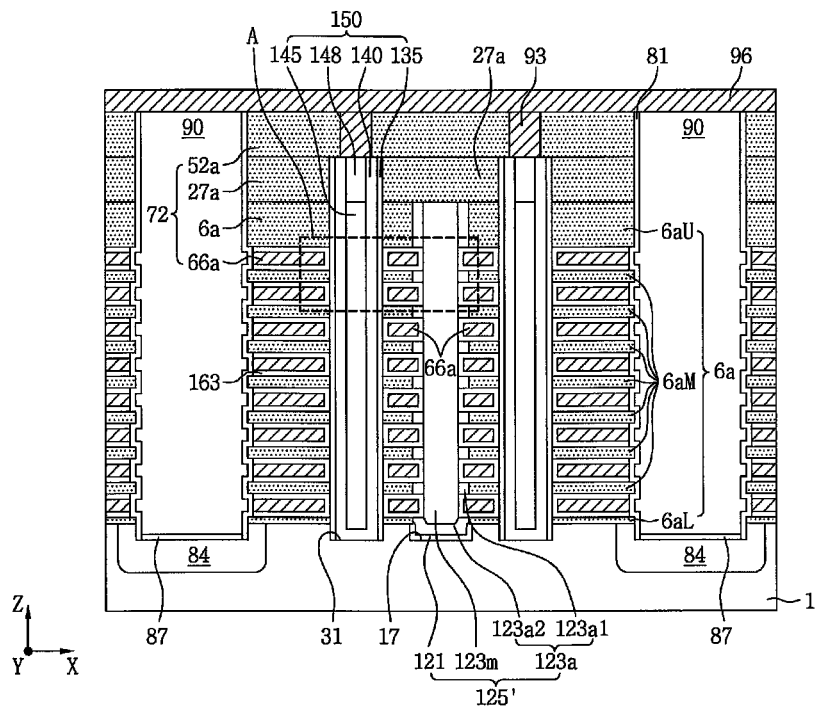
FIG. 3A is a cross-sectional view of a modified example of the semiconductor device according to the first embodiment of the inventive concept.

Referring to FIG. 3A, as described with reference to FIG. 2A, stack structures 72 including a plurality of interlayer insulating patterns 6a and a plurality of conductive patterns 66a may be disposed on a substrate 1. Each of the stack structures 72 may be disposed between a pair of isolation patterns 90 disposed adjacent to each other. Also, as described with reference to FIG. 2A, vertical structures 150 including a first dielectric pattern 135, a gap filling pattern 145, a pad pattern 148, and an active pattern 140 may be provided. Furthermore, as described with reference to FIG. 2A, second dielectric patterns 163 may be interposed between the interlayer insulating patterns 6a and the conductive patterns 66a and extend between the conductive patterns 66a and the vertical structures 150. Since the stack structures 72, the vertical structures 150, and the second dielectric patterns 163 are described above, a detailed description thereof will be omitted.

Modified support patterns 125' of the support patterns 25' of FIG. 2A may be provided. For example, each of the modified support patterns 125' may include a main support pattern 123m and subsidiary support patterns 123a.

As described with reference to FIGS. 2A and 2B, each of the support patterns 125' may include a first portion having a first width, and a second portion having a second width less than the first width. The main support patterns 123m may penetrate the interlayer insulating patterns 6a and the conductive patterns 66a.

The subsidiary support patterns 123a may include side subsidiary support patterns 123a1 interposed between the interlayer insulating patterns 6a and the main support patterns 123m, and bottom subsidiary support patterns 123a2 interposed between the main support patterns 123m and the substrate 1.

In some embodiments, the support patterns 125' may further include an insulating oxide 121 interposed between the bottom subsidiary support patterns 123a2 disposed under the main support patterns 123m and the substrate 1.

The subsidiary support patterns 123a may be formed of a material (e.g., poly-Si) having an etch selectivity with respect to the first dielectric pattern 135, and the main support patterns 123m may be formed of a material (e.g., silicon oxide or silicon nitride) having an etch selectivity with respect to the subsidiary support patterns 123a. The insulating oxide 121 may be formed of a material (e.g., silicon oxide) capable of electrically insulating the subsidiary support patterns 123a from the substrate 1.

The first dielectric pattern 135 and the second dielectric pattern 163 may be variously modified as described with reference to FIGS. 2B through 2D. Thus, the variously modified first and second dielectric patterns 135 and 163 will be described with reference to FIGS. 3B through 3D.

Figure 3B:
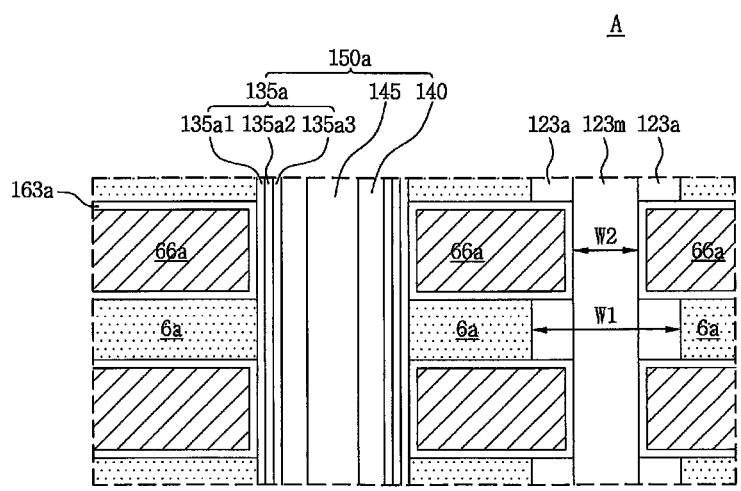
FIGS. 3B through 3D are respectively partial enlarged views of modified examples of portion "A" of FIG. 3A.

To begin with, referring to FIGS. 3A and 3B, as described with reference to FIG. 2B, each of the first dielectric patterns 135 of FIG. 3A may be modified into a first dielectric pattern 135a including a tunnel dielectric layer 135a3, a data storage layer 135a2, and a barrier dielectric layer 135a1. Thus, vertical structures 150a including the modified first dielectric patterns 135a may be provided. Also, the second dielectric patterns 163 of FIG. 3A may be modified into second dielectric patterns 163a including a blocking dielectric layer. Accordingly, since the modified first and second dielectric patterns 135a and 163a are substantially similar to those described with reference to FIG. 2B, a detailed description thereof will be omitted.

Among the support patterns 125', the subsidiary support patterns 123a may be formed of a material layer (e.g., a poly-Si layer) having an etch selectivity with respect to the barrier dielectric layer 135a1 of the first dielectric patterns 135a, and the main support patterns 123m may be formed of a material layer (e.g., a silicon oxide layer or a silicon nitride layer) having an etch selectivity with respect to the subsidiary support patterns 123a.

Figure 3C:
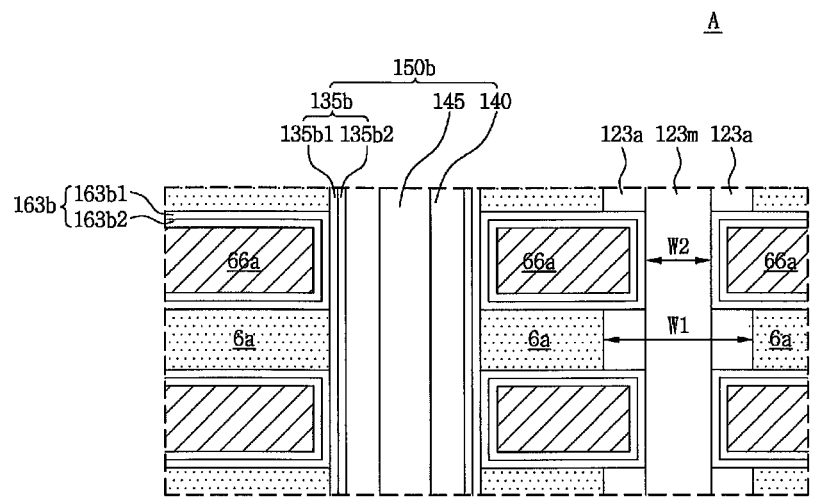

Next, another modified example of the first and second dielectric patterns 135 and 163 will be described with reference to FIG. 3C. Referring to FIGS. 3A and 3C, each of the first and second dielectric patterns 135 and 163 of FIG. 3A may include a plurality of dielectric layers as described with reference to FIG. 2C. For instance, the first dielectric patterns 135 may be first dielectric patterns 135b including a first dielectric layer 135b1 and a second dielectric layer 135b2, and vertical structures 150b including the first dielectric patterns 135b may be provided. Also, the second dielectric patterns 163 may be second dielectric patterns 163b including a third dielectric layer 163b1 and a fourth dielectric layer 163b2. Accordingly, since the modified first and second dielectric patterns 135b and 163b are substantially similar to those described with reference to FIG. 2C, a detailed description thereof will be omitted.

Among the support patterns 125', the subsidiary support patterns 123a may be formed of a material layer (e.g., a poly-Si layer) having an etch selectivity with respect to the first dielectric material layer 135b1 of the first dielectric patterns 135b, and the main support patterns 123m may be formed of a material layer (e.g., a silicon oxide layer or a silicon nitride layer) having an etch selectivity with respect to the subsidiary support patterns 123a.

Figure 3D:
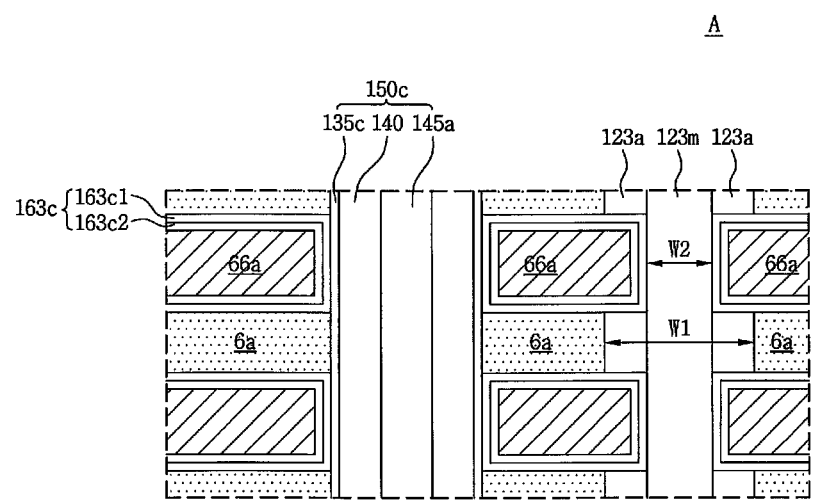

Next, another modified example of the first and second dielectric patterns 135 and 163 will be described with reference to FIG. 3D. Referring to FIGS. 3A and 3D, the first dielectric pattern 135 of FIG. 3A may be first dielectric patterns 135c including a tunnel dielectric layer, and vertical structures 150c including the first dielectric patterns 135c may be provided. Also, as described with reference to FIG. 2D, the second dielectric patterns 163 of FIG. 3A may be second dielectric patterns 163c including a data storage layer 163c1 and a blocking layer 163c2. Accordingly, since the modified first and second dielectric patterns 135c and 163c are substantially similar to those described with reference to FIG. 2D, a detailed description thereof will be omitted.

Another modified example of the semiconductor device according to the first embodiment will be described with reference to FIG. 4A. Here, modified portions of the above-described semiconductor device according to the first embodiment will be chiefly described.

Figure 4A:
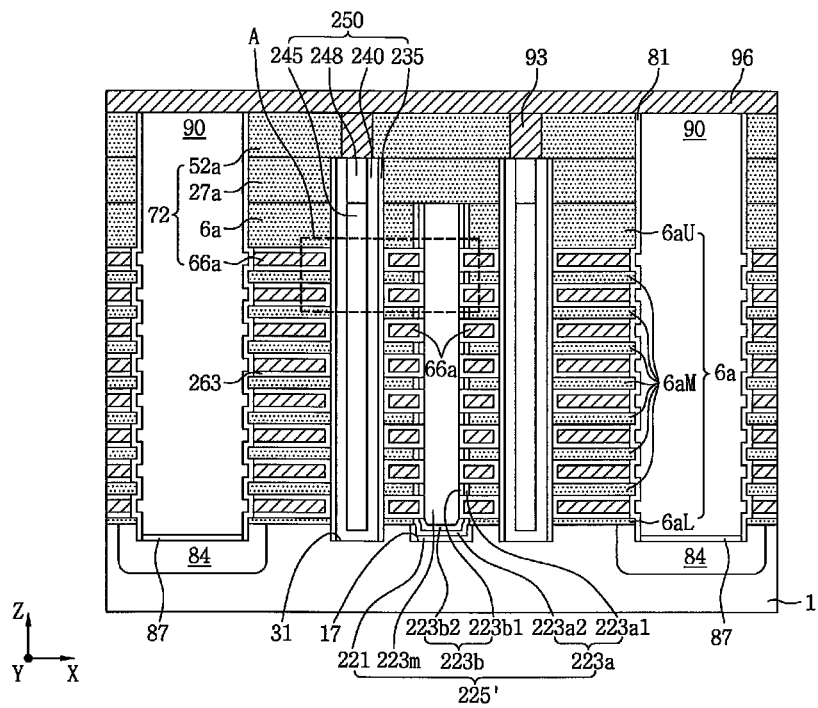
FIG. 4A is a cross-sectional view of another modified example of the semiconductor device according to the first embodiment of the inventive concept.

Referring to FIG. 4A, as described with reference to FIG. 3A, stack structures 72 including a plurality of interlayer insulating patterns 6a and a plurality of conductive patterns 66a may be disposed on a substrate 1. Each of the stack structures 72 may be interposed between a pair of adjacent isolation patterns 90. Also, as described with reference to FIG. 3A, vertical structures 250 including a first dielectric pattern 235, a gap filling pattern 245, a pad pattern 248, and an active pattern 237 may be provided. Second dielectric patterns 263 may be interposed between the interlayer insulating patterns 6a and the conductive patterns 66a and extend between the conductive patterns 66a and the vertical structure 250.

Modified support patterns 225' of the support patterns 125' of FIG. 3A may be provided. For example, each of the support patterns 225' may be a composite layer including at least three layers. For instance, each of the support patterns 225' may include a main support pattern 223m, and first and second subsidiary support patterns 223a and 223b.

Each of the support patterns 225 may include a first portion having a first width, and a second portion having a second width less than the first width. Main support patterns 223m may penetrate the interlayer insulating patterns 6a and the conductive patterns 66a. Also, the first and second subsidiary support patterns 223a and 223b may be interposed between the interlayer insulating patterns 6a and the main support patterns 223m, and interposed between the main support patterns 223m and the substrate 1. The second subsidiary support patterns 223b may be interposed between the first subsidiary support patterns 223a and the main support patterns 223m.

As described with reference to FIG. 3A, each of the first subsidiary support patterns 223a may include side subsidiary support patterns 223a1 and a bottom subsidiary support pattern 223a2, and each of the second subsidiary support patterns 223b may include side subsidiary support patterns 223a1 and a bottom subsidiary support pattern 223b2.

The first subsidiary support patterns 223a may be formed of a material layer (e.g., a poly-Si layer) having an etch selectivity with respect to a dielectric material forming portions of the first dielectric patterns 235, which are disposed adjacent to the stack structures 72. The second subsidiary support patterns 223b may be formed of a material layer (e.g., a silicon oxide layer or a silicon nitride layer) having an etch selectivity with respect to a dielectric material forming the portions of the first dielectric patterns 235, which are disposed adjacent to the stack structures 72, and the first subsidiary support patterns 223a. The main support patterns 223m may be formed of a material layer (e.g., a poly-Si layer, a silicon oxide layer, or a silicon nitride layer) having an etch selectivity with respect to the second subsidiary support patterns 223b.

In some embodiments, as described with reference to FIG. 3A, the support patterns 225' may further include an insulating oxide 221 interposed between the subsidiary support patterns 223a and 223b and the substrate 1.

The first and second dielectric patterns 235 and 263 may be variously modified. Thus, the variously modified first and second dielectric patterns 235 and 263 and the support patterns 225 will be respectively described with reference to FIGS. 4B through 4D.

Figure 4B:
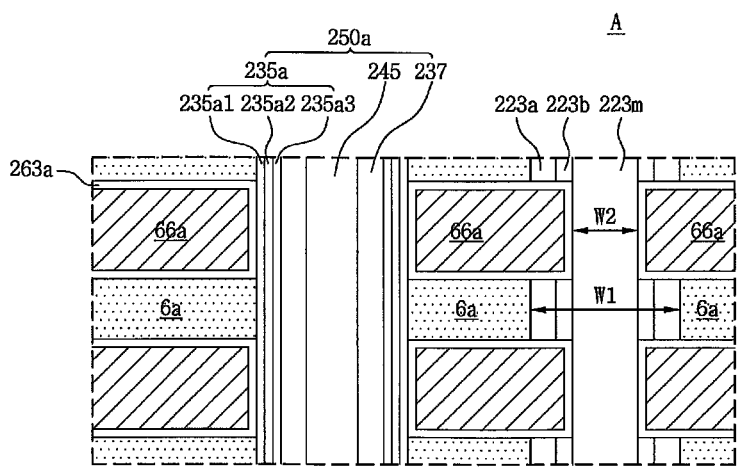
FIGS. 4B through 4D are respectively partial enlarged views of modified examples of portion "A" of FIG. 4A.

To begin with, a modified example of the first and second dielectric patterns 235 and 263 will be described with reference to FIG. 4B. Referring to FIGS. 4A and 4B, as described with reference to FIG. 3B, the first dielectric patterns 235 of FIG. 4A may be modified into first dielectric patterns 235a including a tunnel dielectric layer 235a3, a data storage layer 235a2, and a barrier dielectric layer 235a1, and vertical structures 250a including the modified first dielectric patterns 235a may be provided. The second dielectric patterns 263 of FIG. 4A may be modified into second dielectric patterns 263a including a blocking dielectric layer.

When the barrier dielectric layer 235a1 is formed of a silicon oxide layer, the first subsidiary support patterns 223a may be formed of a material layer (e.g., a poly-Si layer) having an etch selectivity with respect to the barrier dielectric layer 235a1, and the second subsidiary support patterns 223b may be formed of a material layer (e.g., a silicon nitride layer) having an etch selectivity with respect to the first subsidiary support patterns 223a. The main support patterns 223m may be formed of a material layer (e.g., a silicon oxide layer) having an etch selectivity with respect to the second subsidiary support patterns 223b.

Figure 4C:
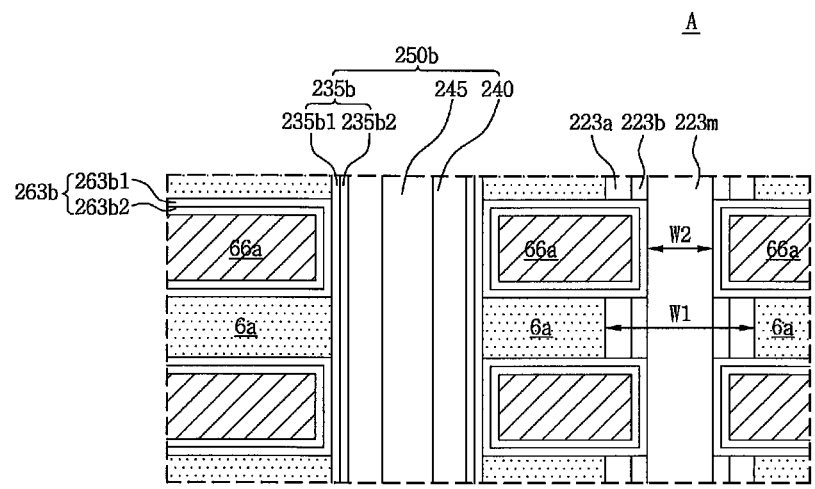

Next, another modified example of the first and second dielectric patterns 235 and 263 will be described with reference to FIG. 4C. Referring to FIGS. 4A and 4C, as described with reference to FIG. 3C, the first and second dielectric patterns 235 and 263 of FIG. 4A may be modified into first and second dielectric patterns 235b and 263b including a plurality of dielectric layers. For example, the first dielectric patterns 235 may be first dielectric patterns 235b including a first dielectric layer 235b1 and a second dielectric layer 235b2, and vertical structures 250b including the first dielectric patterns 235b may be provided. Also, the second dielectric patterns 263 may be second dielectric patterns 263b including a third dielectric layer 263b1 and a fourth dielectric layer 263b2. Accordingly, since the modified first and second dielectric patterns 235b and 263b are substantially similar to those described with reference to FIG. 3C, a detailed description thereof will be omitted.

Figure 4D:
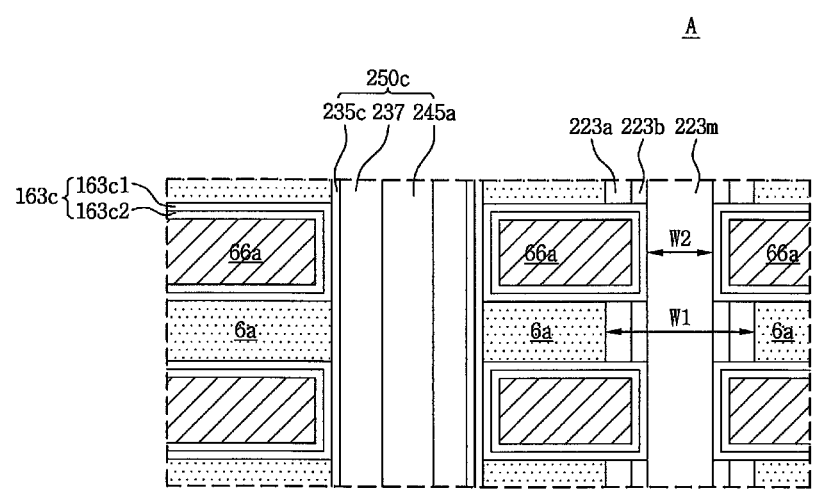

Next, another modified example of the first and second dielectric patterns 235 and 263 will be described with reference to FIG. 4D. Referring to FIGS. 4A and 4D, the first dielectric patterns 235 of FIG. 4A may be first dielectric patterns 235c including a tunnel dielectric layer, and vertical structures 250c including the first dielectric patterns 235c may be provided. Also, as described with reference to FIG. 2D, the second dielectric patterns 263 of FIG. 4A may be second dielectric patterns 263c including a data storage layer 263c1 and a blocking layer 263c2. Accordingly, since the modified first and second dielectric patterns 235c and 263c are substantially similar to those described with reference to FIG. 2D, a detailed description thereof will be omitted.

Another modified example of the semiconductor device according to the first embodiment of the inventive concept will be described with reference to FIG. 5A. Here, modified portions of the semiconductor device according to the first embodiment will be chiefly described.

Figure 5A:
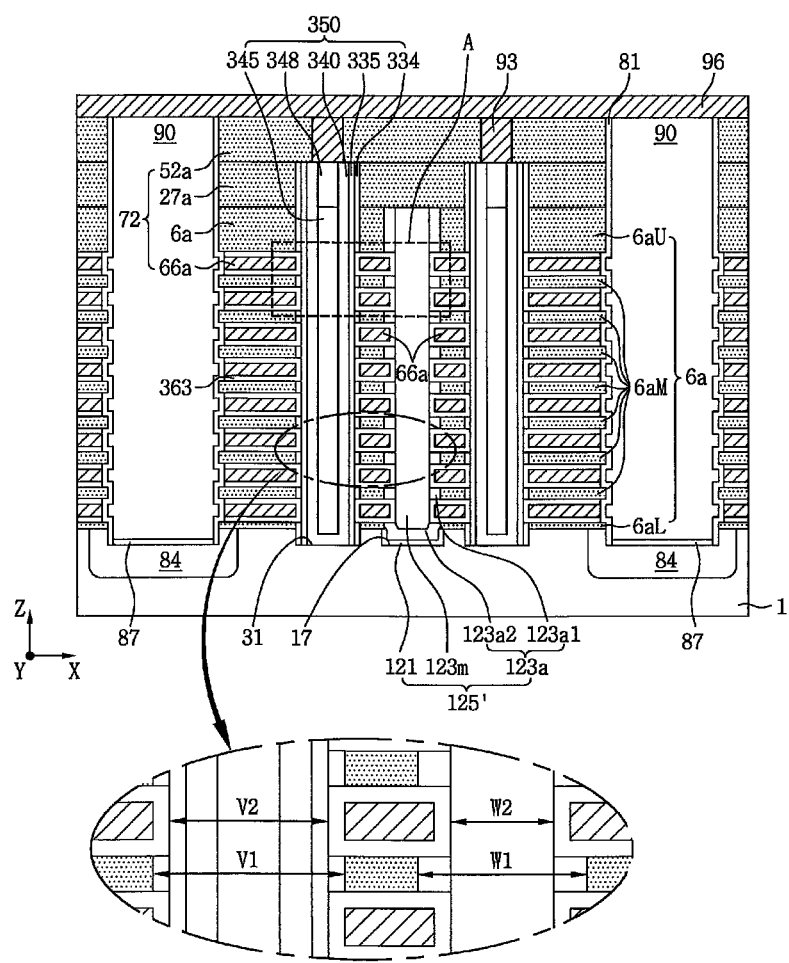
FIG. 5A is a cross-sectional view of another modified example of the semiconductor device according to the first embodiment of the inventive concept.

Referring to FIG. 5A, as described with reference to FIG. 3A, stack structures 72 including a plurality of interlayer insulating patterns 6a, a plurality of conductive patterns 66a, and first and second capping patterns 27a and 52a may be disposed on a substrate 1. Each of the stack structures 72 may be interposed between a pair of adjacent isolation patterns 90.

In the stack structures 72, vertical structures 350 may be disposed to penetrate the first capping patterns 27a, the conductive patterns 66a, and the interlayer insulating patterns 6a.

Each of the vertical structures 350 may include a gap filling pattern 345, a pad pattern 348, an active pattern 340, a first dielectric pattern 335, and a protection dielectric pattern 334. The pad pattern 348 may be disposed on the gap filling pattern 345. The active pattern 340 may surround side surfaces of the gap filling pattern 345 and the pad pattern 48 and cover a bottom surface of the gap filling pattern 345. The first dielectric pattern 335 may be disposed on an outer side surface of the active pattern 340. The protection dielectric pattern 334 may be interposed between the first dielectric pattern 335 and the interlayer insulating patterns 6a, and interposed between the first dielectric pattern 335 and the first capping patterns 27a. The protection dielectric pattern 334 may be formed of an insulating material layer (e.g., a silicon nitride layer or a silicon oxide layer).

Each of the vertical structures 350 may include a first portion having a first width V1, and a second portion having a second width V2 less than the first width V1. In the vertical structures 350, the protection dielectric patterns 335 may be disposed in the second portions having the relatively great width V1. In each of the vertical structures 350, the first portion may be disposed at substantially the same level as the insulating patterns 6a, while the second portion may be disposed at substantially the same level as the conductive patterns 66a.

In the stack structures 72, support patterns may be disposed to penetrate the interlayer insulating patterns 6a and the conductive patterns 66a. The support patterns may be the support patterns 125' described with reference to FIG. 3A.

For example, each of the modified support patterns 125' may include a main support pattern 124m and subsidiary support patterns 123a. The support patterns 125' may respectively include main support patterns 123m, subsidiary support patterns 123a, and an oxide 121. The main support patterns 123m may penetrate the interlayer insulating patterns 6a and the conductive patterns 66a, respectively. The subsidiary support patterns 123a may be interposed between the main support patterns 123m and the interlayer insulating patterns 6a, and interposed between the main support patterns 123m and the substrate 1. The oxide 121 may be interposed between the main support patterns 123a and the substrate 1. However, the inventive concept is not limited thereto, and the support patterns may be the support patterns 25' described with reference to FIG. 2A, or the support patterns 225' described with reference to FIG. 4A.

When the protection dielectric patterns 334 is formed of an insulating material layer (e.g., a silicon nitride layer or a silicon oxide layer), the subsidiary support patterns 323a may be formed of a material layer (e.g., a poly-Si layer) having an etch selectivity with respect to the protection dielectric patterns 334, and the main support patterns 123m may be formed of a material layer (e.g., a silicon oxide layer or a silicon nitride layer) having an etch selectivity with respect to the subsidiary support patterns 123a.

The first and second dielectric patterns 335 and 363 may be variously modified. Thus, the variously modified first and second dielectric patterns 335 and 363 will be described with reference to FIGS. 5B and 5C.

Figure 5B:
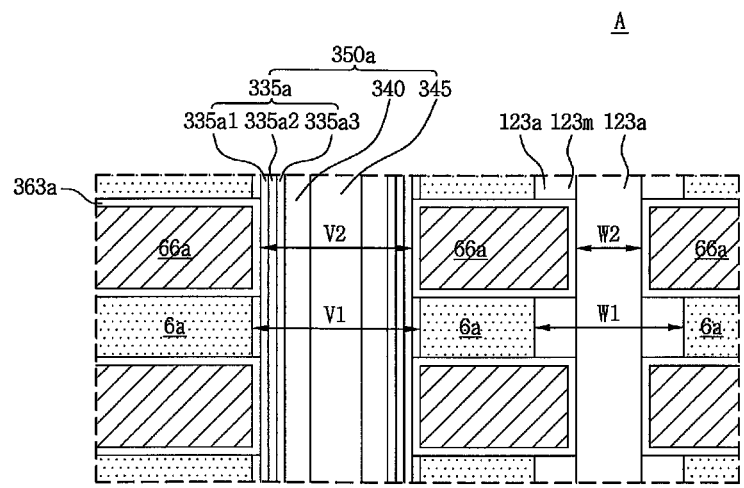
FIGS. 5B through 5C are respectively partial enlarged views of modified examples of portion "A" of FIG. 5A.

To begin with, a modified example of the first and second dielectric patterns 335 and 363 will be described with reference to FIG. 5B. Referring to FIGS. 5A and 5B, the first dielectric pattern 335 of FIG. 5A may be a first dielectric pattern 335a including a data storage layer, and the second dielectric pattern 363 of FIG. 5A may be a second dielectric pattern 363a including a blocking dielectric layer. For example, the first dielectric pattern 335a may include a tunnel dielectric layer 335a3, a data storage layer 335a2, and a barrier dielectric layer 335a1.

The data storage layer 335a2 may be interposed between the tunnel dielectric layer 335a3 and the barrier dielectric layer 335a1. The tunnel dielectric layer 335a2 may be adjacent to or in contact with the active pattern 340, and the barrier dielectric layer 335a1 may be adjacent to the conductive patterns 6a and the protection dielectric patterns 334.

Figure 5C:
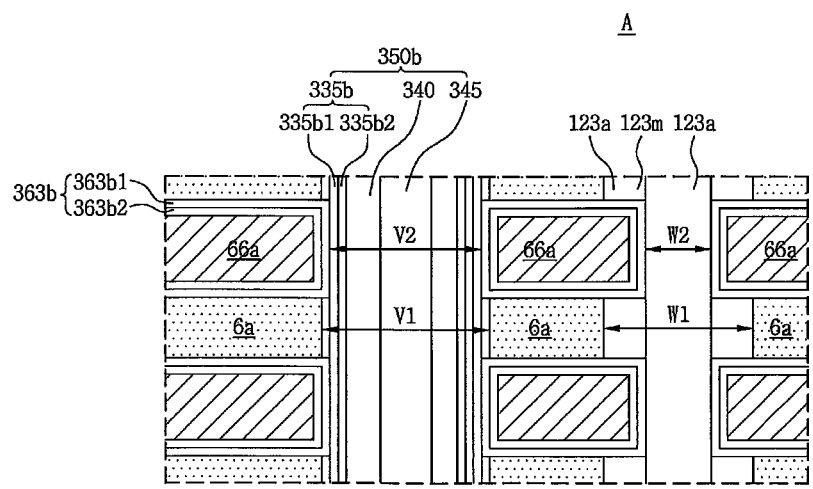

Next, another modified example of the first and second dielectric patterns 335 and 363 will be described with reference to FIG. 5C. Referring to FIG. 5C, the first and second dielectric patterns 335 and 363 of FIG. 5A may be first and second dielectric patterns 335b and 363b including a plurality of dielectric layers. For example, the first dielectric patterns 335 may be first dielectric patterns 335b including a first dielectric layer 335b1 and a second dielectric layer 335b2, and vertical structures 350b including the first dielectric patterns may be provided. Also, the second dielectric patterns 363 may be second dielectric patterns 363b including a third dielectric layer 363b1 and a fourth dielectric layer 363b2. Accordingly, since the modified first and second dielectric patterns 335b and 363b are substantially similar to those described with reference to FIG. 3c, a detailed description thereof will be omitted.

Next, another modified example of the semiconductor device according to the first embodiment of the inventive concept will be described with reference to FIG. 6. Here, modified portions of the semiconductor device according to the first embodiment will be chiefly described.

Figure 6:
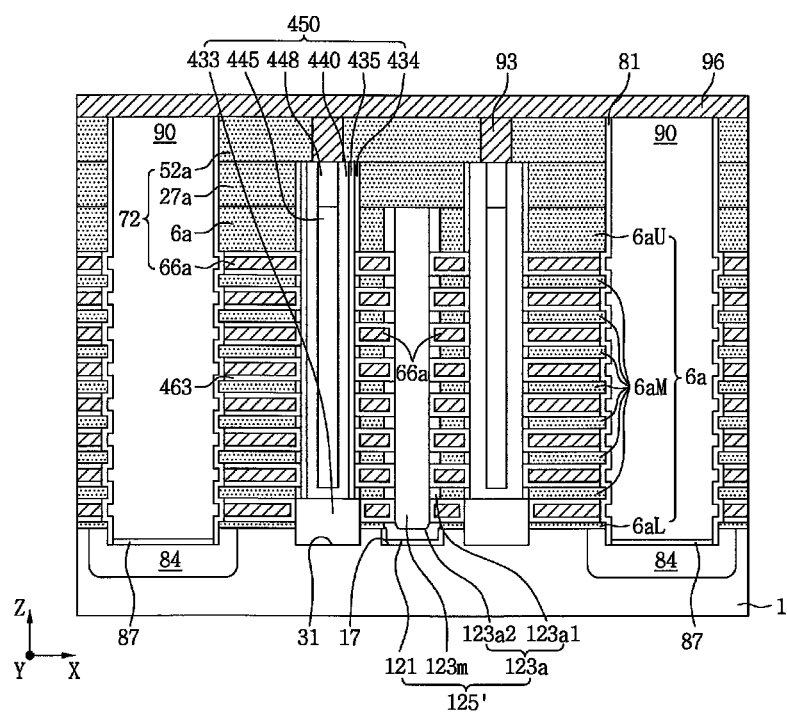
FIG. 6 is a cross-sectional view of another modified example of the semiconductor device according to the first embodiment of the inventive concept.

Referring to FIG. 6, as described with reference to FIG. 2A, stack structures 72 including a plurality of interlayer insulating patterns 6a, a plurality of conductive patterns 66a, and first and second capping patterns 27a and 52a may be disposed on a substrate 1. Each of the stack structures 72 may be interposed between a pair of adjacent isolation patterns 90. The support patterns 125' described with reference to FIG. 5A may be provided.

Vertical structures 450 may be disposed in the stack structures 72. The vertical structures 450 may be disposed to penetrate the first capping patterns 27a, the conductive patterns 66a, and the interlayer insulating patterns 6a in the stack structures 72. Each of the vertical structures 450 may include a plurality of active patterns 433 and 440. The plurality of active patterns 433 and 440 may include a lower active pattern 433 and an upper active pattern 440 disposed on the lower active pattern 433. For example, each of the vertical structures 450 may include a gap filling pattern 445, a pad pattern 448 disposed on the gap filling pattern 445, the upper active pattern 440 covering bottom and side surfaces of the gap filling pattern 445 and extending onto side surfaces of the pad pattern 448, a lower active pattern 433 disposed under the upper active pattern 440, and a first dielectric pattern 435 disposed on outer side surfaces of the upper active pattern 440. Furthermore, as described with reference to FIG. 5A, each of the vertical structures 445 may further include protection dielectric patterns 434 interposed between the first dielectric pattern 435 and the interlayer insulating patterns 6a, and interposed between the first dielectric pattern 434 and the first capping pattern 27a.

Meanwhile, the inventive concept is not limited thereto, and the lower active pattern 435 described with reference to FIG. 6 may provide the lower active pattern 433, which is described with reference to FIG. 6, between the active patterns 40, 140, and 240 described with reference to FIGS. 2A, 3A, and 4A and the substrate 1.

Next, a semiconductor device according to a second embodiment of the inventive concept will be described with reference to FIG. 7A. Here, the same portions as in the above-described embodiments are omitted, and modified portions of the semiconductor device according to the first embodiment will be chiefly described.

Figure 7A:
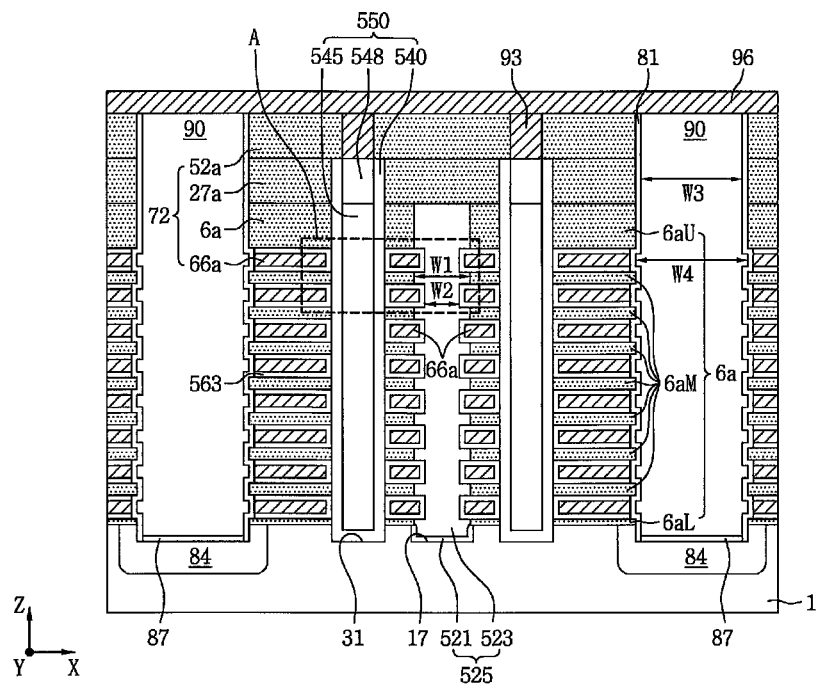
FIG. 7A is a cross-sectional view of a semiconductor device according to a second embodiment of the inventive concept.

Referring to FIG. 7A, as described with reference to FIG. 2A, stack structures 72 including a plurality of interlayer insulating patterns 6a, a plurality of conductive patterns 66a, and first and second capping patterns 27a and 52a may be disposed on a substrate 1. Also, each of the stack structures 72 may be interposed between a pair of adjacent isolation patterns 90.

Vertical structures 550 may be disposed in the stack structures 72. The vertical structures 550 may be disposed to penetrate the first capping patterns 27a, the conductive patterns 66a, and the interlayer insulating patterns 6a in the stack structures 72. Each of the vertical structures 550 may include an active pattern 540. For example, each of the vertical structures 550 may include a gap filling pattern 545, a pad pattern 348 disposed on the gap filling pattern 545, and the active pattern 540 covering bottom and side surfaces of the gap filling pattern 545 and extending onto side surfaces of the pad pattern 548.

As described in the previous embodiments, support patterns 525 may be disposed to penetrate the interlayer insulating patterns 6a and the conductive patterns 66a of the stack structures 72. Each of the support patterns 525 may include a main support pattern 523 and an oxide 521 interposed between the main support pattern 523 and the substrate 1.

Dielectric patterns 563 may be interposed between the vertical structures 550 and the conductive patterns 66a, extend between the interlayer insulating patterns 6a and the conductive patterns 66a, and extend between the conductive patterns 66a and the support pattern 525.

Figure 7B:
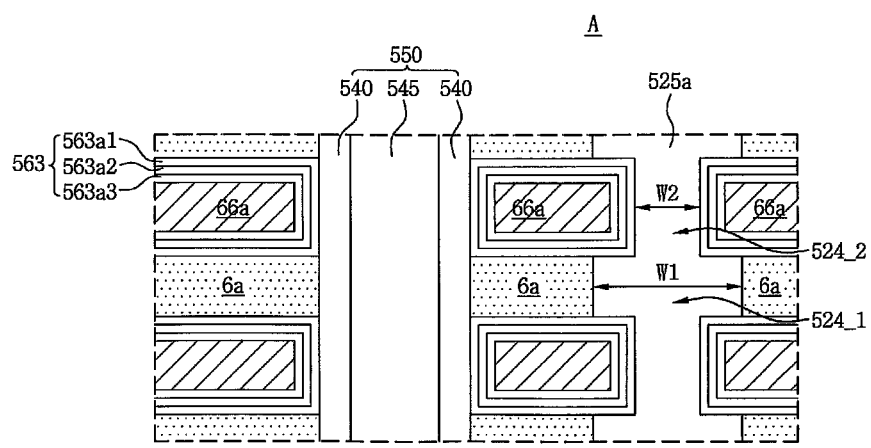
FIGS. 7B through 7D are respectively partial enlarged views of modified examples of portion "A" of FIG. 7A.
Figure 7C:
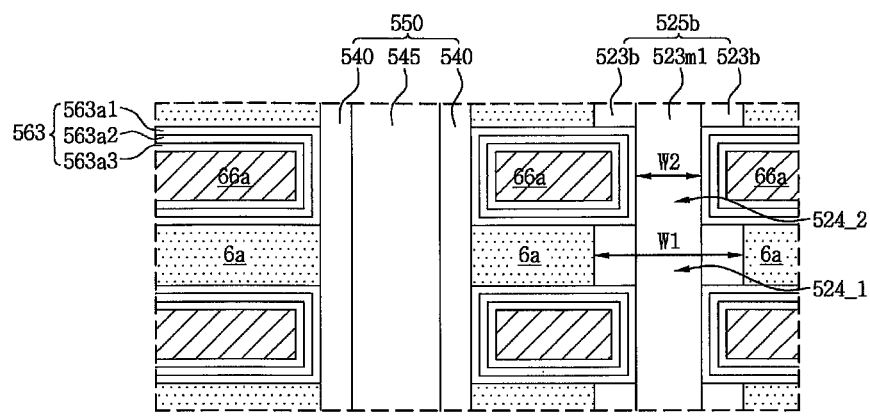
Figure 7D:
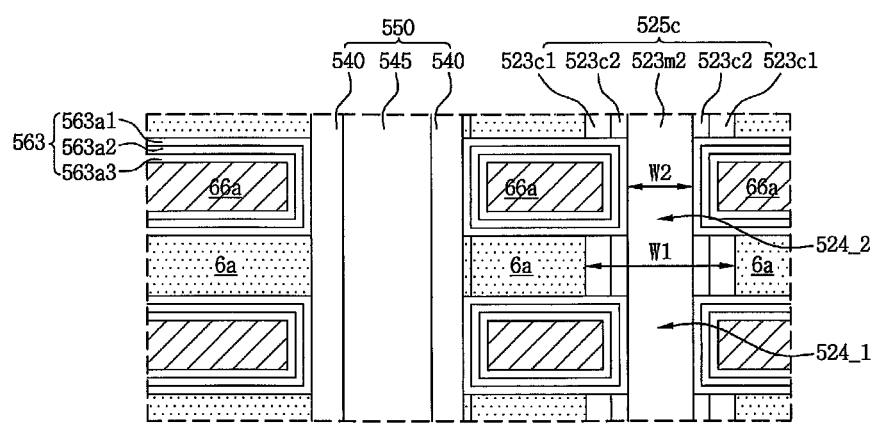

The variously modifiable support patterns 524 will now be described with reference to FIGS. 7B through 7D.

To begin with, referring to FIG. 7B, the support patterns 524 may be the same support patterns 524a as described with reference to FIG. 2A. That is, each of the support patterns 525a may include a first portion 524_1 and a second portion 524_2. The first portion 524_1 may be disposed at substantially the same level as the interlayer insulating patterns 6 and have a relatively great width W1, and the second portion 524_2 may be disposed at substantially the same level as the conductive patterns 66a and have a relatively small width W2. The support patterns 525a may be formed of a material layer (e.g., a silicon nitride layer) having an etch selectivity with respect to the active patterns 540.

The dielectric patterns 563 may include a tunnel dielectric layer 536a1, a data storage layer 563a2, and a blocking layer 563a3. The data storage layer 536a2 may be interposed between the tunnel dielectric layer 536a1 and the blocking layer 563a3, and the tunnel dielectric layer 563a1 may be interposed between the data storage layer 563a1 and the vertical structure 550 and extend between the data storage layer 563a1 and the interlayer insulating patterns 6a, and the blocking layer 563a3 may be interposed between the data storage layer 563a1 and the conductive patterns 550.

Next, referring to FIG. 7C, as described with reference to FIG. 3A, each of the support patterns 525 may be modified into a support pattern 525b including a main support pattern 523m1 and subsidiary support patterns 523b.

Each of the support patterns 525 may include a first portion 524_1 having a first width W1, and a second portion 524_2 having a second width W2 less than the first width W1. The subsidiary support patterns 523b may be disposed in first portions 524_1 of the support patterns 525b and interposed between the main support patterns 523m1 and the interlayer insulating patterns 6a.

The subsidiary support patterns 523b may be formed of a material layer (e.g., a silicon nitride layer) having an etch selectivity with respect to the active patterns 540, while the main support patterns 523m1 may be formed of a material layer (e.g., a poly-Si layer) having an etch selectivity with respect to the subsidiary support patterns 523b.

Next, referring to FIG. 7D, as described with reference to FIG. 4A, each of the support patterns 525 may be modified into a support pattern 525c including a main support pattern 523m2, and first and second subsidiary support patterns 523c1 and 523c2. The support patterns 525c may penetrate the interlayer insulating patterns 6a and the conductive patterns 66a.

Each of the support patterns 525c may include a first portion 524_1 having a first width W1, and a second portion 524_2 having a second width W2 less than the first width W1. The main support patterns 523m2 may penetrate the interlayer insulating patterns 6a and the conductive patterns 66a. Also, the first and second subsidiary support patterns 523c1 and 523c2 may be interposed between the interlayer insulating patterns 6a and the main support patterns 523m2, and interposed between the main support patterns 523m2 and the substrate 1. The second subsidiary support patterns 523c2 may be interposed between the first subsidiary support patterns 523c1 and the main support patterns 523m2.

The first subsidiary support patterns 523c1 may be formed of a material layer (e.g., a silicon nitride layer) having an etch selectivity with respect to the active patterns 540, and the second subsidiary support patterns 523c2 may be formed of a material layer (e.g., a silicon oxide layer) having an etch selectivity with respect to the active patterns 540 and the first subsidiary support patterns 523c1. The main support patterns 523m2 may be formed of a material layer (e.g., a poly-Si layer or a silicon nitride layer) having an etch selectivity with respect to the second subsidiary support patterns 523c2.

The vertical structures 550 described with reference to FIG. 7A may be provided to have vertical side surfaces. However, the inventive concept is not limited thereto. For example, vertical structures having non-vertical side surfaces, namely, rough side surfaces, may be provided. Hereinafter, the vertical structures having the rough side surfaces will be described with reference to FIG. 7E.

Figure 7E:
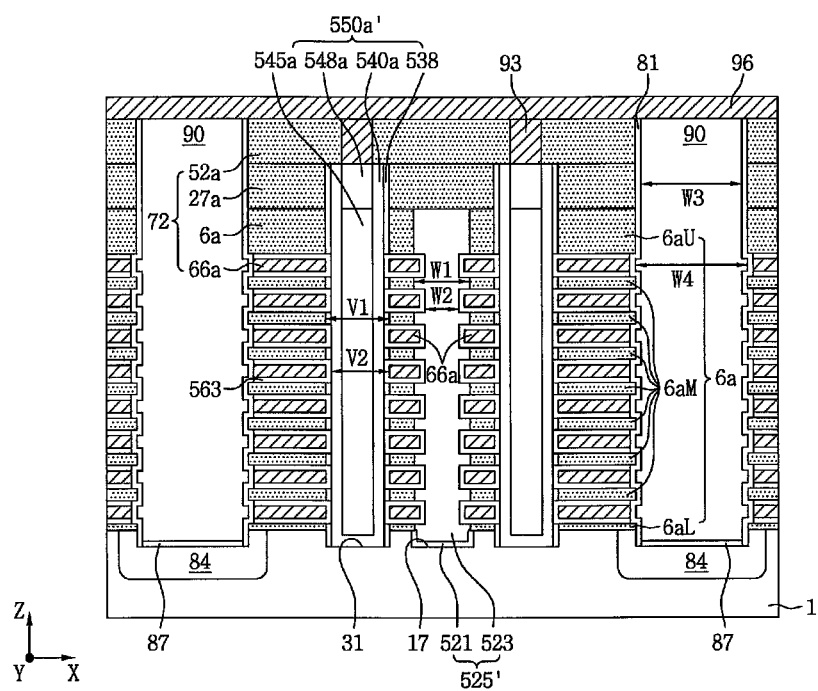
FIG. 7E is a cross-sectional view of a modified example of the semiconductor device according to the second embodiment of the inventive concept.

Referring to FIG. 7E, modified vertical structures 550a' may be disposed in the stack structures 72 of FIG. 7A. Each of the vertical structures 550a' may include a gap filling pattern 545a, a pad pattern 548a, an active pattern 540a, and a protection dielectric pattern 538. The pad pattern 548a may be disposed on the gap filling pattern 545a, and the active pattern 540a may surround side surfaces of the gap filling pattern 545a and the pad pattern 548a and cover a bottom surface of the gap filling pattern 545a. The protection dielectric pattern 538 may be interposed between the active pattern 540a and the interlayer insulating patterns 6a, and interposed between the active pattern 540a and the first capping patterns 27a. The protection dielectric pattern 538 may be formed of a material having an etch selectivity with respect to the support patterns 525' and the active patterns 540a. For instance, when the active patterns 540a and the support patterns 525' are formed of silicon, the protection dielectric pattern 538 may be formed of an insulating material, such as silicon nitride or silicon oxide.

The vertical structures 550a' may respectively include first portions having a first width V1, and second portions having a second width V2 less than the first width V1. In the vertical structures 550a, the protection dielectric patterns 538 may be disposed in the first portions having the relatively great width V1. In the vertical structures 550a', the first portions may be disposed at substantially the same level as the insulating patterns 6a, and the second portions may be disposed at substantially the same level as the conductive patterns 66a.

Figure 8:
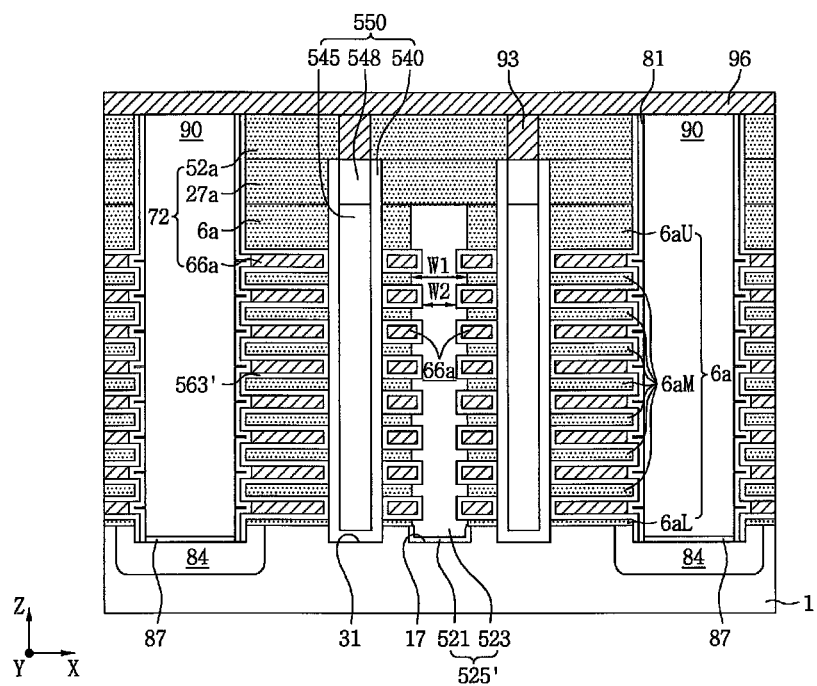
FIG. 8 is a cross-sectional view of another modified example of the semiconductor device according to the second embodiment of the inventive concept.

In other embodiments, as shown in FIG. 8, the dielectric patterns 563 may be modified into dielectric patterns 563' that may be interposed between the conductive patterns 66a and the vertical structures 550, and interposed between the conductive patterns 66a and the interlayer insulating patterns 6a and extend between the interlayer insulating patterns 6a and the isolation patterns 90.

Meanwhile, in the embodiments described with reference to FIGS. 2A through 6, second dielectric patterns 63, 163, 263, 363, and 463 interposed between the interlayer insulating patterns 6a and the conductive patterns 66a may extend between the interlayer insulating patterns 6a and the isolation patterns 90, as shown in FIG. 8.

Next, another modified example of the semiconductor device according to the second embodiment of the inventive concept will be described with reference to FIG. 9A.

Figure 9A:
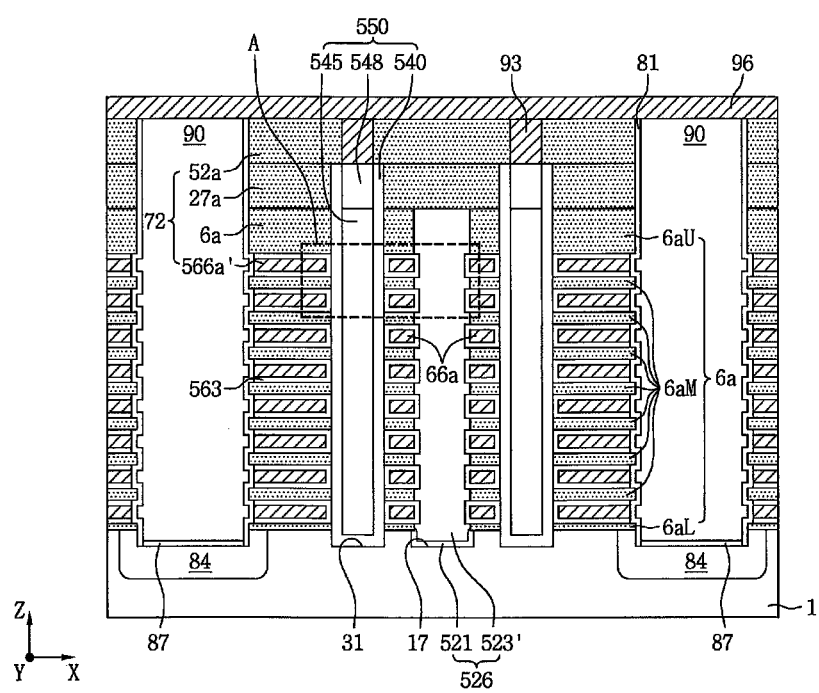
FIG. 9A is a cross-sectional view of another modified example of the semiconductor device according to the second embodiment of the inventive concept.
Figure 9B:
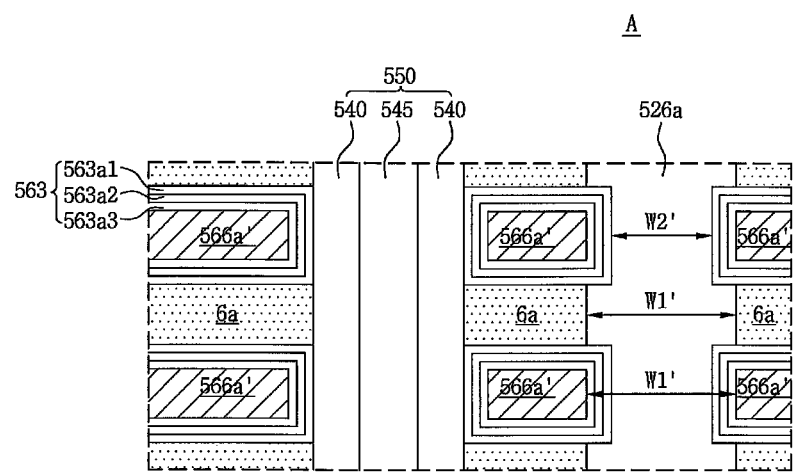
FIGS. 9B and 9C are respectively partial enlarged views of modified examples of portion "A" of FIG. 9A.

Referring to FIGS. 9A and 9B, as described with reference to FIG. 2A, stack structures 72 including a plurality of interlayer insulating patterns 6a, a plurality of conductive patterns 566a, and first and second capping patterns 27a and 52a may be disposed on a substrate 1. Also, each of the stack structures 72 may be interposed between a pair of adjacent isolation patterns 90. Vertical structures 550 may be disposed in the stack structures 72. As described with reference to FIG. 7A, each of the vertical structures 550 may include a gap filling pattern 545, a pad pattern 548 disposed on the gap filling pattern 545, and the active pattern 540 covering bottom and side surfaces of the gap filling pattern 545 and extending onto side surfaces of the pad pattern 548.

As described in the previous embodiments, support patterns 526 may be disposed to penetrate the interlayer insulating patterns 6a and the conductive patterns 66a in the stack structures 72.

Dielectric patterns 563 may be interposed between the vertical structures 550 and the conductive patterns 566a, extend between the interlayer insulating patterns 6a and the conductive patterns 566a', and extend between the conductive patterns 566a and the support patterns 526.

In some embodiments, as shown in FIG. 9B, support patterns 526a may have a first width W1' between the interlayer insulating patterns 60a and have a second width W2' between the conductive patterns 566a'. The second width W2' may be less than the first width W1'. In this case, the conductive patterns 566a' may have side surfaces vertically aligned with side surfaces of the interlayer insulating patterns 6a.

Figure 9C:
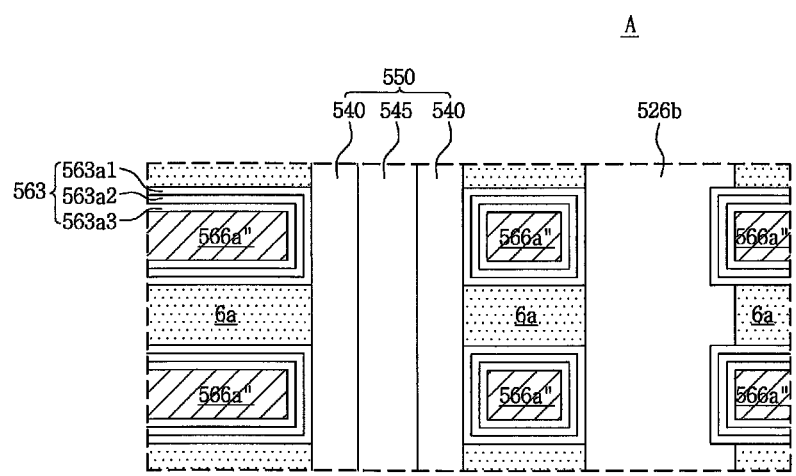

In other embodiments, as shown in FIG. 9C, support patterns 526b having substantially the same width may be provided. Accordingly, the interlayer insulating pattern 6a may have a greater width than the conductive patterns 566a" between the vertical structure 550 and the support pattern 526b disposed adjacent to each other.

Next, a semiconductor device according to a third embodiment of the inventive concept will be described with reference to FIG. 10.

Figure 10:
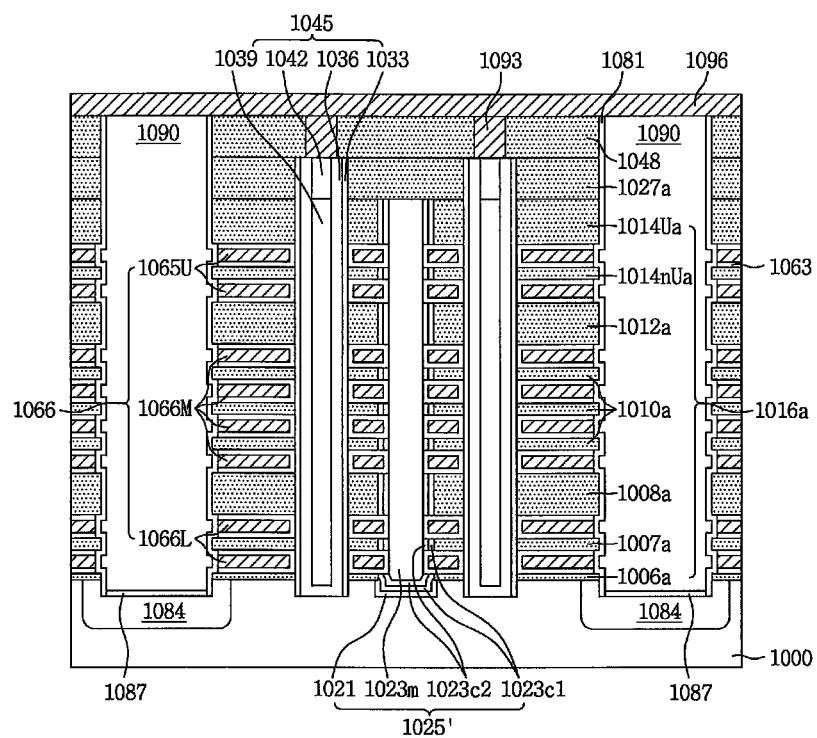
FIG. 10 is a cross-sectional view of a semiconductor device according to a third embodiment of the inventive concept.

Referring to FIG. 10, a substrate 1000 may be provided. The substrate 1000 may be a semiconductor substrate. Stack structures including a plurality of interlayer insulating patterns 1016a, a plurality of conductive patterns 1066, and the first and second capping patterns 1027a and 1048 may be disposed on the substrate 1000. Isolation patterns 1090 may be disposed on the substrate 100 and disposed apart from and substantially parallel to one another. From a plan view, the isolation patterns 1090 may have linear shapes substantially parallel to one another. As described with reference to FIG. 2A, the isolation patterns 1090 and the stack structures may be alternately and repetitively arranged. Insulating spacers 1081 may be disposed between the isolation patterns 1090 and the stack structures.

As in FIG. 2A, impurity regions 1084 may be disposed in the substrate 1000 under the isolation patterns 1090. The impurity regions 1084 may be used as common source regions of a non-volatile memory device, such as a flash memory. Metal-semiconductor compounds 1087 may be disposed between the substrate 100 having the impurity regions 1084 and the isolation patterns 1090.

The conductive patterns 1066 may be spaced apart from one another by the interlayer insulating patterns 1016a and vertically stacked. The conductive patterns 1066 may include at least one lower conductive pattern 1066L, a plurality of middle conductive patterns 1066M, and at least one upper conductive pattern 1066U. The middle conductive patterns 1066M may be disposed at a higher level than the lower conductive patterns 1066L, and the upper conductive patterns 1066U may be disposed at a higher level than the middle conductive patterns 1066M.

In embodiments, the conductive patterns 1066 may be used as gate electrodes and/or gate interconnections of a semiconductor memory device. For instance, the middle conductive patterns 1066M may be used as cell gate electrodes of a non-volatile memory device. The at least one lower conductive pattern 1066L interposed between a lowermost cell gate electrode 1066M of the cell gate electrodes and the substrate 1000 may be used as a ground selection gate electrode. The at least one upper conductive pattern 1066U disposed on the cell gate electrodes 1066M may be used as a string selection gate electrode.

The interlayer insulating patterns 1016a may include a lowermost insulating pattern 1006a, a lower interlayer pattern 1007a, a lower insulating pattern 1008a, middle interlayer patterns 1010a, an upper insulating pattern 1012a, an upper interlayer pattern 1014nUa, and an uppermost insulating pattern 1014Ua.

The lowermost insulating pattern 1006a may be interposed between the lower conductive patterns 1066L and the substrate 1000, and the lower interlayer pattern 1007a may be interposed between the lower conductive patterns 1066L. The lower insulating pattern 1008a may be interposed between the at least one lower conductive pattern 1066L and the middle conductive patterns 1066M, and the middle interlayer patterns 1010a may be interposed between the middle conductive patterns 1066M. The upper insulating pattern 1012a may be interposed between the middle conductive patterns 1066M and the at least one upper conductive pattern 1065U, and the upper interlayer pattern 1014nUa may be interposed between the upper conductive patterns 1065U. The uppermost insulating pattern 1014Ua may be disposed on the at least one upper conductive pattern 1066U. The first capping pattern 1027a may be disposed on the uppermost insulating pattern 1014Ua, and the second capping pattern 1048 may be disposed on the first capping pattern 1027a.

Support patterns 1025' may be disposed to penetrate the interlayer insulating patterns 1016a and the conductive patterns 1066.

Each of the support patterns 1025' may be a single layer or a composite layer. For example, as described with reference to FIG. 4A, each of the support patterns 1025' may include a main support pattern 1023m, and first and second subsidiary support patterns 1023c1 and 1023c2 disposed on side surfaces of the main support pattern 1023m. However, the embodiments of the inventive concept are not limited thereto. For example, the support patterns 1025' may be modified into the support patterns 25' described with reference to FIG. 2A, or the support patterns 125' described with reference to FIG. 3A.

Vertical structures 1045 may be disposed to penetrate the interlayer insulating patterns 1016a, the conductive patterns 1066, and the first capping pattern 1027a. The vertical structures 1045 may have the same shape as the vertical structures 50 described with reference to FIG. 2A. For example, each of the vertical structures 1045 may include a gap filling pattern 1039, a pad pattern 1042 disposed on the gap filling pattern 1039, an active pattern 1036 surrounding bottom and side surfaces of the gap filling pattern 1039 and extending onto side surfaces of the pad pattern 1042, and a first dielectric pattern 1033 disposed on side surfaces of the active pattern 1036.

Second dielectric patterns 1063 may be interposed between the conductive patterns 1066 and the vertical structures 1045, extend between the conductive patterns 1066 and the interlayer insulating patterns 1016a, and extend between the conductive patterns 1066 and the support patterns 1025'.

The first dielectric patterns 1033 and the second dielectric patterns 1063 may be variously modified into the first dielectric patterns 50a, 50b, and 50c, and the second dielectric patterns 63a, 63b, and 63c described with reference to FIGS. 2B through 2D.

A conductive plug 1093 may be disposed to penetrate the second capping pattern 1048. A conductive line 1096 may be disposed on the conductive plug 1093.

Next, a modified example of the semiconductor device according to the third embodiment of the inventive concept will be described with reference to FIG. 11.

Figure 11:
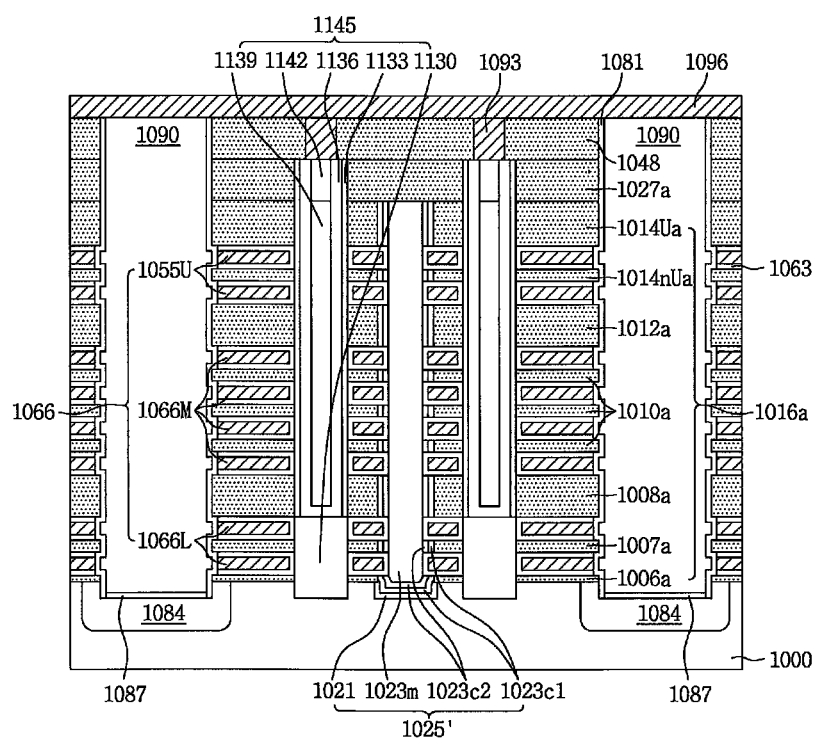
FIG. 11 is a cross-sectional view of a modified example of the semiconductor device according to the third embodiment of the inventive concept.

Referring to FIG. 11, the vertical structures 1045 described with reference to FIG. 10 may be modified as shown in FIG. 11. Each of the modified vertical structures 1145 may include at least two active patterns 1130 and 1136. For example, each of the modified vertical structures 1145 may include a first active pattern 1130, a gap filling pattern 1139 disposed on the first active pattern 1130, a pad pattern 1142 disposed on the gap filling pattern 1139, a second active pattern 1136 interposed between the first active pattern 1130 and the gap filling pattern 1139 and configured to extend onto side surfaces of the gap filling pattern 1139 and the pad pattern 1142, and a first dielectric pattern 1133 disposed on side surfaces of the second active pattern 1136. The first active pattern 1130 may horizontally overlap the lower conductive patterns 1066L.

Next, another modified example of the semiconductor device according to the first embodiment of the inventive concept will be described with reference to FIG. 12.

Figure 12:
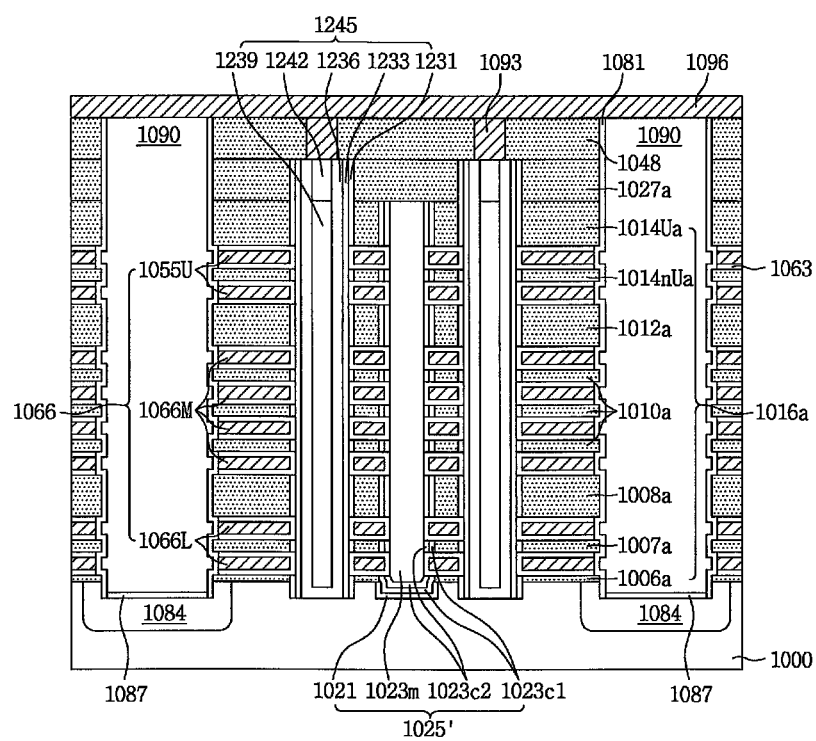
FIG. 12 is a cross-sectional view of another modified example of the semiconductor device according to the third embodiment of the inventive concept.

Referring to FIG. 12, the vertical structures 1045 described with reference to FIG. 10 may be modified as shown in FIG. 12. The modified vertical structures 1245 may respectively include protection dielectric patterns 1231 disposed in portions disposed adjacent to the interlayer insulating patterns 1016a and the first capping pattern 1027a. For example, each of the modified vertical structures 1245 may include a gap filling pattern 1239, a pad pattern 1242 disposed on the gap filling pattern 1239, an active region 1236 surrounding bottom and side surfaces of the gap filling pattern 1239 and extending onto side surfaces of the pad pattern 1242, a first dielectric pattern 1233 disposed on side surfaces of the active pattern 1236, and protection dielectric patterns 1231 interposed between the first dielectric pattern 1233 and the interlayer insulating patterns 1016a and extending between the first dielectric pattern 1233 and the first capping pattern 1027a.

Next, another modified example of the semiconductor device according to the third embodiment of the inventive concept will be described with reference to FIG. 13.

Figure 13:
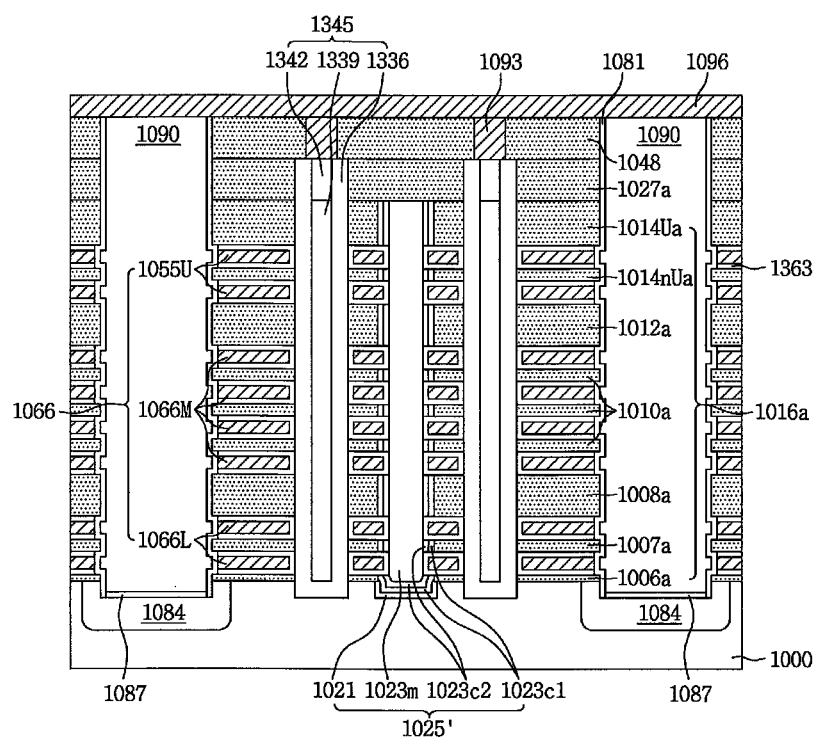
FIG. 13 is a cross-sectional view of another modified example of the semiconductor device according to the third embodiment of the inventive concept.

Referring to FIG. 13, the vertical structures 1045 described with reference to FIG. 10 may be modified into the same shape as the vertical structures 550 described with reference to FIG. 7A. That is, each of the modified vertical structures 1345 may include a gap filling pattern 1339, a pad pattern 1342 disposed on the gap filling pattern 1339, and a an active pattern 1336 covering bottom and side surfaces of the gap filling pattern 1339 and extending onto side surfaces of the pad pattern 1342.

Dielectric patterns 1363 may be interposed between the conductive patterns 1066 and the vertical structures 1345, extend between the conductive patterns 1066 and the interlayer insulating patterns 1016*a*, and extend between the conductive patterns 1066 and the support patterns 1025'. As described with reference to FIG. 7B, each of the dielectric patterns 1363 may include a tunnel dielectric layer, a data storage layer and a blocking layer.

Next, a semiconductor device according to a fourth embodiment of the inventive concept will be described with reference to FIG. 14A. Here, modified portions of the semiconductor device according to the previous embodiments will be chiefly described.

Figure 14A:
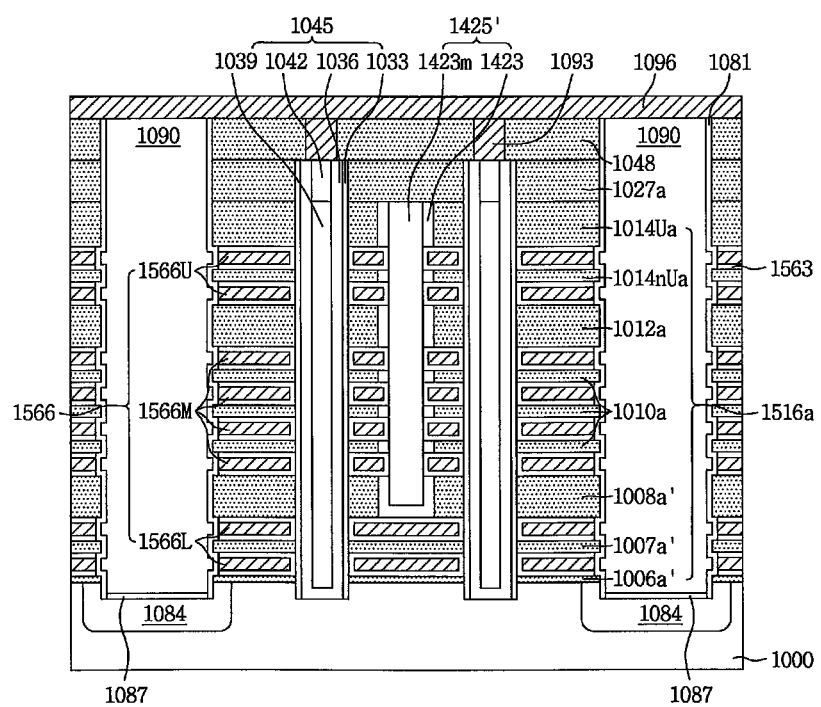
FIG. 14A is a cross-sectional view of a semiconductor device according to a fourth embodiment of the inventive concept.

Referring to FIG. 14A, as described with reference to FIG. 10, stack structures including a plurality of interlayer insulating patterns 1016*a*, a plurality of conductive patterns 1066, and first and second capping patterns 1027*a* and 1048 may be disposed on a substrate 1000, and a plurality of isolation patterns 1090 may be disposed on the substrate 1000.

As in FIG. 10, each of the conductive patterns 1066 may include at least one lower conductive pattern 1066L, a plurality of middle conductive patterns 1066M, and at least one upper conductive pattern 1066U. The interlayer insulating patterns 1016*a* may include a lowermost insulating pattern 1006*a*, a lower interlayer pattern 1007*a*, a lower insulating pattern 1008*a*, a middle interlayer patterns 1010*a*, an upper insulating pattern 1012*a*, an upper interlayer pattern 1014*n*Ua, and an uppermost insulating pattern 1014Ua. The lowermost insulating pattern 1006*a* may be interposed between the at least one lower conductive pattern 1066L and the substrate 1000, and the lower interlayer pattern 1007*a* may be interposed between the at least one lower conductive pattern 1066L. The lower insulating pattern 1008*a* may be interposed between the at least one lower conductive pattern 1066L and the middle conductive patterns 1066M, and the middle interlayer patterns 1010*a* may be interposed between the middle conductive patterns 1066M. The upper insulating pattern 1012*a* may be interposed between the middle conductive patterns 1066M and the upper conductive patterns 1065U, and the upper interlayer pattern 1014*n*Ua may be interposed between the upper conductive patterns 1065U. The uppermost insulating pattern 1014Ua may be disposed on the upper conductive patterns 1066U. The first capping pattern 1027*a* may be disposed on the uppermost insulating pattern 1014Ua, and the second capping pattern 1048 may be disposed on the first capping pattern 1027*a*.

Support patterns 1425' may be disposed to penetrate the uppermost interlayer insulating pattern 1014Ua, the upper interlayer pattern 1014*n*Ua, the upper insulating pattern 1012*a*, the middle interlayer patterns 1010*a*, and the lower insulating pattern 1008*a* of the interlayer insulating patterns 1016*a*, and penetrate the middle conductive patterns 1066M and the upper conductive patterns 1066U of the conductive patterns 1066. The support patterns 1425' may be disposed at a higher level than the lower conductive patterns 1566L.

Each of the support patterns 1425' may be a single layer or a composite layer. For example, each of the support patterns 1425' may include a main support pattern 1423*m* and subsidiary support patterns 1423. The main support pattern 1423*m* may penetrate the uppermost interlayer insulating pattern 1014Ua, the upper interlayer pattern 1014*n*Ua, the upper insulating pattern 1012*a*, the middle interlayer patterns 1010*a*, the lower insulating pattern 1008*a*, the middle conductive patterns 1066M, and the upper conductive patterns 1066U. The subsidiary support patterns 1423 may be interposed between the main support pattern 1423*m* and the uppermost interlayer insulating pattern 1014Ua, between the main support pattern 1423*m* and the upper interlayer pattern 1014*n*Ua, between the main support pattern 1423*m* and the upper insulating pattern 1012*a*, between the main support pattern 1423*m* and the middle interlayer patterns 1010*a*, and between the main support pattern 1423*m* and the lower insulating pattern 1008*a*. The subsidiary support patterns 1423 may be formed of a material having an etch selectivity with respect to the main support pattern 1423*m*. For example, the main support pattern 1423*m* may be formed of silicon oxide, and the subsidiary support patterns 1423 may be formed of silicon.

As in FIG. 10, vertical structures 1045 may be disposed to penetrate the interlayer insulating patterns 1016*a*, the conductive patterns 1066, and the first capping pattern 1027*a*. Second dielectric patterns 1063 may be interposed between the conductive patterns 1066 and the vertical structures 1045, extend between the conductive patterns 1066 and the interlayer insulating patterns 1016*a*, and extend between the conductive patterns 1066 and the support patterns 1024. The first dielectric patterns 1033 and the second dielectric patterns 1063 may be variously modified into the first dielectric patterns 50*a*, 50*b*, and 50*c*, and the second dielectric patterns 63*a*, 63*b*, and 63*c* described with reference to FIGS. 2B through 2D.

Next, a modified example of the semiconductor device according to the fourth embodiment of the inventive concept will be described with reference to FIG. 14B.

Figure 14B:
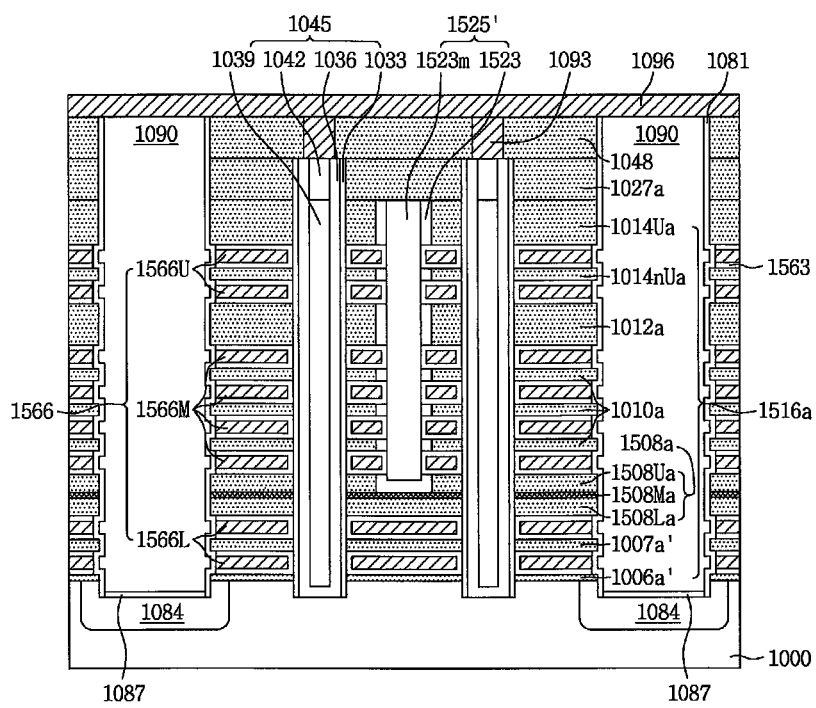
FIG. 14B is a cross-sectional view of a modified example of the semiconductor device according to the fourth embodiment of the inventive concept.

Referring to FIG. 14B, stack structures including a plurality of interlayer insulating patterns 1516*a*, a plurality of conductive patterns 1566, and first and second capping patterns 1027*a* and 1048 may be disposed on a substrate 1000. As described with reference to FIG. 10, a plurality of isolation patterns 1090 may be disposed on the substrate 1000. The conductive patterns 1566 may be spaced apart from one another by the interlayer insulating patterns 1516*a* and vertically stacked.

The conductive patterns 1566 may include at least one lower conductive pattern 1566L, a plurality of middle conductive patterns 1566M, and at least one upper conductive pattern 1566U. The middle conductive patterns 1566M may be disposed at a higher level than the lower conductive patterns 1566L, and the upper conductive patterns 1566U may be disposed at a higher level than the middle conductive patterns 1566M.

As described with reference to FIG. 10, the interlayer insulating patterns 1516*a* may include a lowermost insulating pattern 1006*a*', a lower interlayer pattern 1007*a*', a lower insulating pattern 1508*a*, a middle interlayer patterns 1010*a*, an upper insulating pattern 1012*a*, an upper interlayer pattern 1014*n*Ua, and an uppermost insulating pattern 1014Ua.

The lowermost insulating pattern 1006*a*' may be interposed between the lower conductive patterns 1566L and the substrate 1000, and the lower interlayer pattern 1007*a*' may be interposed between the lower conductive patterns 1566L. The lower insulating pattern 1508*a* may be interposed between the lower conductive patterns 1566L and the middle conductive patterns 1566M, and the middle interlayer patterns 1010*a* may be interposed between the middle conductive patterns 1566M. The upper insulating pattern 1012*a* may be interposed between the middle conductive patterns 1566M and the upper conductive patterns 1566U, and the upper interlayer pattern 1014*n*Ua may be interposed between the upper conductive patterns 1566U. Also, the uppermost insulating pattern 1014Ua may be disposed on the upper conductive patterns 1566U. The first capping pattern 1027a may be disposed on the uppermost insulating pattern 1014Ua, and the second capping pattern 1048 may be disposed on the first capping pattern 1027a.

The lower insulating pattern 1508a may be thicker than the lower interlayer pattern 1007a and the middle interlayer patterns 1010a. Also, the upper insulating pattern 1012a may be thicker than the lower interlayer pattern 1007a and the middle interlayer patterns 1010a.

The lower insulating pattern 1508a may be a single layer or a stack layer. For example, the lower insulating pattern 1508a may include a first lower insulating pattern 1508La, a second lower insulating pattern 1508Ma, and a third lower insulating pattern 1508Ua stacked sequentially.

The second lower insulating pattern 1508Ma may be formed of a material having an etch selectivity with respect to the first and third lower insulating patterns 1508La and 1508Ua. For example, when the first and third lower insulating patterns 1508La and 1508Ua are formed of silicon oxide, the second lower insulating pattern 1508Ma may be formed of a high-k dielectric layer (e.g., a hafnium oxide layer, an aluminum oxide layer, or a nitride layer).

Support patterns 1525' may be disposed to penetrate the upper conductive patterns 1566U and the middle conductive patterns 1566M of the conductive patterns 1566 and penetrate the uppermost insulating pattern 1014Ua, the upper interlayer pattern 1014nUa, the upper insulating pattern 1012a, and the middle interlayer patterns 1010a of the interlayer insulating patterns 1516a. Also, the support patterns 1525' may extend into the lower insulating pattern 1508a. For example, the support patterns 1525' may penetrate the middle conductive patterns 1566M and extend to a middle portion between top and bottom surfaces of the lower insulating pattern 1508a.

When the lower insulating pattern 1508a includes the first lower insulating pattern 1508La, the second lower insulating pattern 1508Ma, and the third lower insulating pattern 1508Ua, the support patterns 1525' may penetrate the middle conductive patterns 1566M and also penetrate the third lower insulating pattern 1508Ua of the lower insulating pattern 1508a. During the formation of the support patterns 1525', the second lower insulating pattern 1508Ma may serve as an etch stop layer.

Each of the support patterns 1525' may be formed of a single layer or a composite layer. For example, when the support patterns 1525' include a composite layer, each of the support patterns 1525' may include a main support pattern 1523m, and a subsidiary support pattern 1523 disposed on a portion of a side surface and a bottom surface of the main support pattern 1523m. The subsidiary support patterns 1523 may be formed of a material layer (e.g., a conductive material layer, such as a poly-Si layer) having an etch selectivity with respect to the first dielectric patterns 1033. The main support patterns 1523m may be formed of a material layer (e.g., a silicon oxide layer or a silicon nitride layer) having an etch selectivity with respect to the subsidiary support patterns 1523.

Vertical structures 1045 may be disposed to penetrate the interlayer insulating patterns 1516a, the conductive patterns 1566, and the first capping pattern 1027a. Since the vertical structures 1045 are the same as described with reference to FIG. 10, a detailed description thereof will be omitted.

Second dielectric patterns 1563 may be interposed between the conductive patterns 1566 and the vertical structures 1045, extend between the conductive patterns 1566 and the interlayer insulating patterns 1516a, and extend between the conductive patterns 1566 and the support patterns 1525'.

Top surfaces of the support patterns 1525' may be disposed at a lower level than top surfaces of the vertical structures 1045. Also, bottom surfaces of the support patterns 1525' may be disposed at a higher level than bottom surfaces of the vertical structures 1045.

Figure 15:
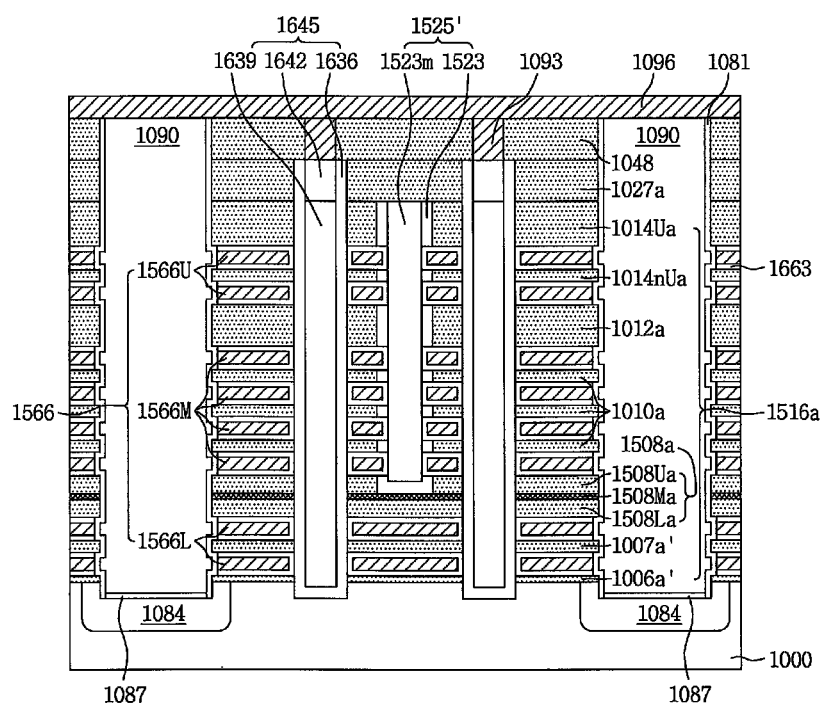
FIG. 15 is a cross-sectional view of another modified example of the semiconductor device according to the fourth embodiment of the inventive concept.

The vertical structures 1045 of FIG. 14B may be variously modified. For example, the vertical structures 1045 may be modified into the same shape as the vertical structures 1145 described with reference to FIG. 11, the vertical structures 1245 described with reference to FIG. 12, or the vertical structures 1345 described with reference to FIG. 13. For instance, as shown in FIG. 15, the vertical structures 1045 may be modified into vertical structures 1645 including a gap filling pattern 1639, a pad pattern 1642 disposed on the gap filling pattern 1639, an active pattern 1636 covering bottom and side surfaces of the gap filling pattern 1639 and extending onto side surfaces of the pad pattern 1642, and the modified vertical structures 1645 may have the same shape as the vertical structures 1345 of FIG. 13.

Meanwhile, dielectric patterns 1663 may be interposed between the conductive patterns 1566 and the vertical structures 1045, extend between the conductive patterns 1566 and the interlayer insulating patterns 1516a, and extend between the upper and middle conductive patterns 1566U and 1566M and the support patterns 1525'. As described with reference to FIGS. 7A through 7D, the dielectric patterns 1663 may include a tunnel dielectric layer, a data storage layer, and a blocking dielectric layer.

Figure 16:
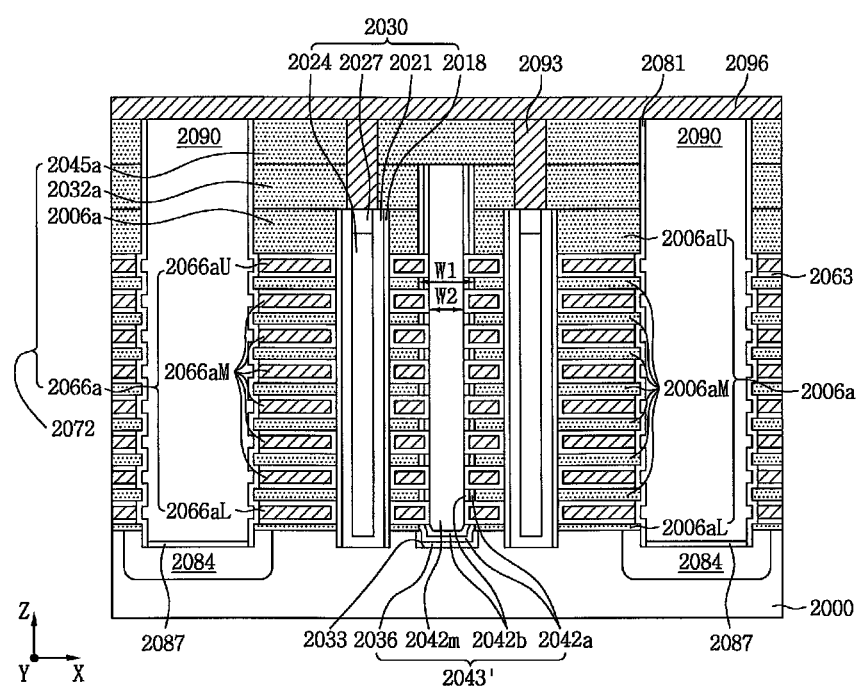
FIG. 16 is a cross-sectional view of a semiconductor device according to a fifth embodiment of the inventive concept.

Next, a semiconductor device according to a fifth embodiment of the inventive concept will be described with reference to FIG. 16. FIG. 16 is a cross-sectional taken along line I-I' of FIG. 1.

Referring to FIG. 16, a substrate 2000 described with reference to FIG. 2A may be provided. Stack structures 2072 may be disposed on the substrate 2000. As described with reference to FIG. 2A, each of the stack structures 2072 may include interlayer insulating patterns 2006a, conductive patterns 2066a, a first capping pattern 2032a, and a second capping pattern 2045a. The conductive patterns 2066a may be spaced apart from one another by the interlayer insulating patterns 2006a and vertically stacked.

The conductive patterns 2066a may include a lowermost conductive pattern 2066aL, a plurality of middle conductive patterns 2066aM disposed on the lowermost conductive pattern 2066aL, and an uppermost conductive pattern 2066aU disposed on the middle conductive patterns 2066aM.

The interlayer insulating patterns 2006a may include a lowermost interlayer insulating pattern 2006aL, middle interlayer insulating patterns 2006aM disposed on the lowermost interlayer insulating pattern 2006aL, and an uppermost interlayer insulating pattern 2006aU disposed on the middle interlayer insulating patterns 2006aM.

As described with reference to FIG. 2A, a plurality of isolation patterns 2090 may be disposed on the substrate 2000. From a plan view, the stack structures 2072 and the isolation patterns 2090 may be alternately and repetitively arranged. Insulating spacers 2081 may be interposed between the isolation patterns 2090 and the stack structures 2072.

Impurity regions 2084 may be disposed in the substrate 2000 under the isolation patterns 2090 and used as common source regions of a flash memory device. Metal-semiconductor compounds 2087 may be disposed between the substrate 2000 having the impurity regions 2084 and the isolation patterns 2090.

A plurality of vertical structures 2030 may be disposed in the stack structures 2072. The vertical structures 2030 may penetrate the interlayer insulating patterns 2006a and conductive patterns 2066a in the stack structures 2072. The vertical structures 2030 may have a smaller width than the isolation patterns 2090. Also, the vertical structures 2030 may have top surfaces disposed at a lower level than top surfaces of the isolation patterns 2090.

Each of the vertical structures 2030 may have an active pattern 2021 and a first dielectric pattern 2018. For example, each of the vertical structures 2030 may include a gap filling pattern 2024, a pad pattern 2027 disposed on the gap filling pattern 2024, the active pattern 2021 covering side and bottom surfaces of the gap filling pattern 2024 and extending onto side surfaces of the pad pattern 2027, and the first dielectric pattern 2018 disposed on side surfaces of the active pattern 2021. The first dielectric pattern 2018 may be interposed between the active pattern 2021 and the conductive patterns 2066a and extend between the active pattern 2021 and the interlayer insulating patterns 2006a.

Support patterns 2043' may be disposed to penetrate the interlayer insulating patterns 2006a, the conductive patterns 2066a, and the first capping pattern 2032a in the stack structures 2072.

Each of the support patterns 2043' may include a single layer or a composite layer. For example, when the support patterns 2043' include the composite layer, each of the support patterns 2043' may include a main support pattern 2042m and subsidiary support patterns 2042a and 2042b. Furthermore, each of the support patterns 2043' may further include an oxide 2036 interposed between the subsidiary support patterns 2042a and 2042b and the substrate 2000.

The main support pattern 2042m may penetrate the interlayer insulating patterns 2006a, the conductive patterns 2066a, and the first capping pattern 2032a. The subsidiary support patterns 2042a and 2042b may include first subsidiary support patterns 2042a and second subsidiary support patterns 2042b. The first subsidiary support patterns 2042a may be interposed between the main support patterns 2042m and the second subsidiary support patterns 2042b.

The subsidiary support patterns 2042a and 2042b may include patterns interposed between the main support pattern 2042m and the interlayer insulating patterns 2006a, patterns interposed between the main support pattern 2042m and the first capping pattern 2032a, and patterns interposed between the main support pattern 2042m and the substrate 2000. That is, as described with reference to FIG. 4A, the subsidiary support patterns 2042a and 2042b may include side subsidiary support patterns and bottom support patterns.

The support patterns 2043' may have top surfaces disposed at a higher level than the vertical structures 2030. The support patterns 2043' may have top surfaces disposed at a lower level than top surfaces of the isolation patterns 2090. The support patterns 2043' may have portions with different widths. For example, the support patterns 2043' may have a first width W1 in the first portions interposed between the interlayer insulating patterns 2006a, and have a second width W2 in second portions interposed between the conductive patterns 2066a.

Second dielectric patterns 2063 may be interposed between the vertical structures 2030 and the conductive patterns 2066a, extend between the interlayer insulating patterns 2006a and the conductive patterns 2066a, and extend between the support patterns 2043' and the conductive patterns 2066a.

The first dielectric patterns 2018 and the second dielectric patterns 2063 may be variously modified into the first dielectric patterns 50a, 50b, and 50c, and the second dielectric patterns 63a, 63b, and 63c described with reference to FIGS. 2B through 2D.

Conductive plugs 2093 may be disposed to penetrate the first and second capping patterns 2032a and 2045a. A conductive line 2096 may be disposed on the conductive plugs 2093.

The vertical structures 2030 of FIG. 16 may be variously modified. The modifiable vertical structures will now be respectively described with reference to FIGS. 17 through 19.

Figure 17:
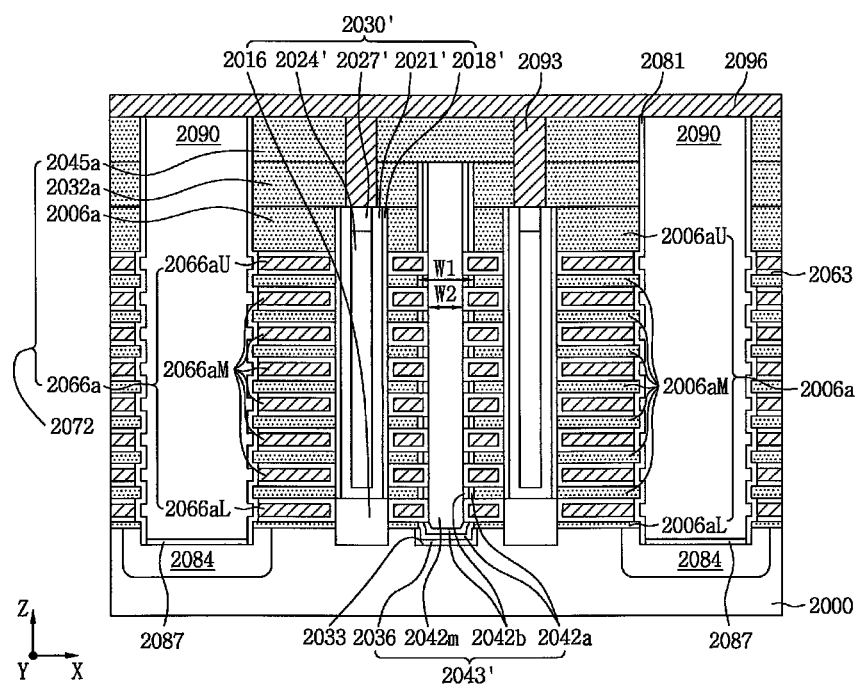
FIG. 17 is a cross-sectional view of a modified example of the semiconductor device according to the fifth embodiment of the inventive concept.

Referring to FIG. 17, the vertical structures 2030 of FIG. 16 may be modified into vertical structures 2030' including a plurality of active patterns 2016 and 2021'. The modified vertical structures 2030' may include a first active pattern 2016 and a second active pattern 2021' disposed on the first active pattern 2016. For instance, the modified vertical structures 2030' may include the first active pattern 2016, a gap filling pattern 2024' disposed on the first active pattern 2016, a pad pattern 2027' disposed on the gap filling pattern 2024', a second active pattern 2021' interposed between the first active pattern 2016 and the gap filling pattern 2024' and extending onto side surfaces of the gap filling pattern 2024' and the pad pattern 2027', and a first dielectric pattern 2018' interposed between the second active pattern 2021' and the conductive patterns 2066a and extending between the second active pattern 2021' and the interlayer insulating patterns 2006a.

Figure 18:
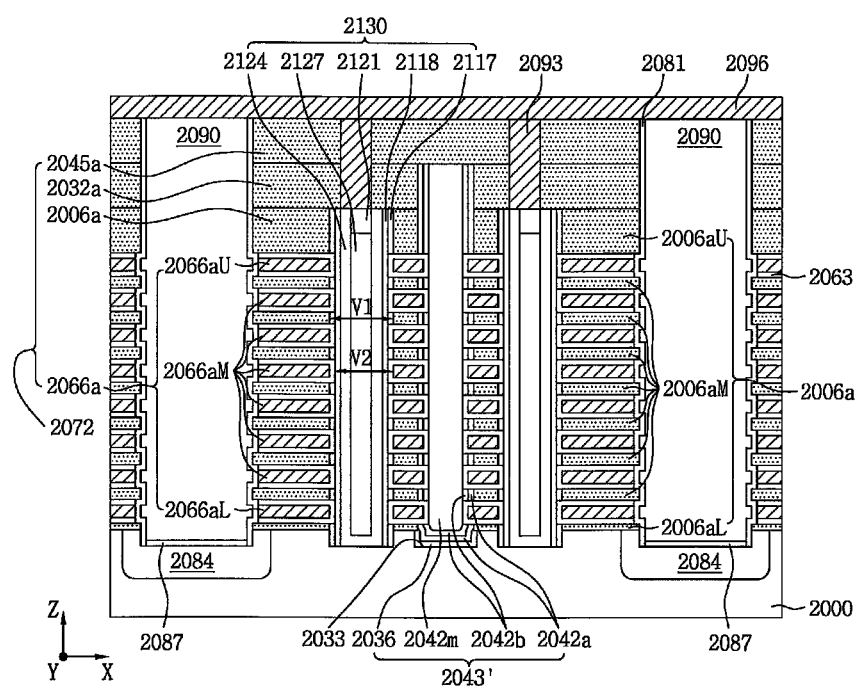
FIG. 18 is a cross-sectional view of another modified example of the semiconductor device according to the fifth embodiment of the inventive concept.

Referring to FIG. 18, the vertical structures 2030 of FIG. 16 may be modified into vertical structures 2130 including first and second portions with different widths. The modified vertical structures 2130 may include first portions having a first width V1, and second portions having a second width V2 less than the first width V1. For example, the modified vertical structures 2130 may have the first width V1 in the first portions disposed at substantially the same level as the interlayer insulating patterns 2006a, and the second width V2 in the second portions disposed at substantially the same level as the conductive patterns 2066a. The second width V2 may be less than the first width V1.

Each of the modified vertical structures 2130 may include a gap filling pattern 2127, a pad pattern 2121 disposed on the gap filling pattern 2127, the active pattern 2124 covering side and bottom surfaces of the gap filling pattern 2127 and extending onto side surfaces of the pad pattern 2121, the first dielectric pattern 2118 disposed on side surfaces of the active pattern 2124, and a protection dielectric pattern 2117 interposed between the first dielectric pattern 2118 and the interlayer insulating patterns 2006a.

Figure 19:
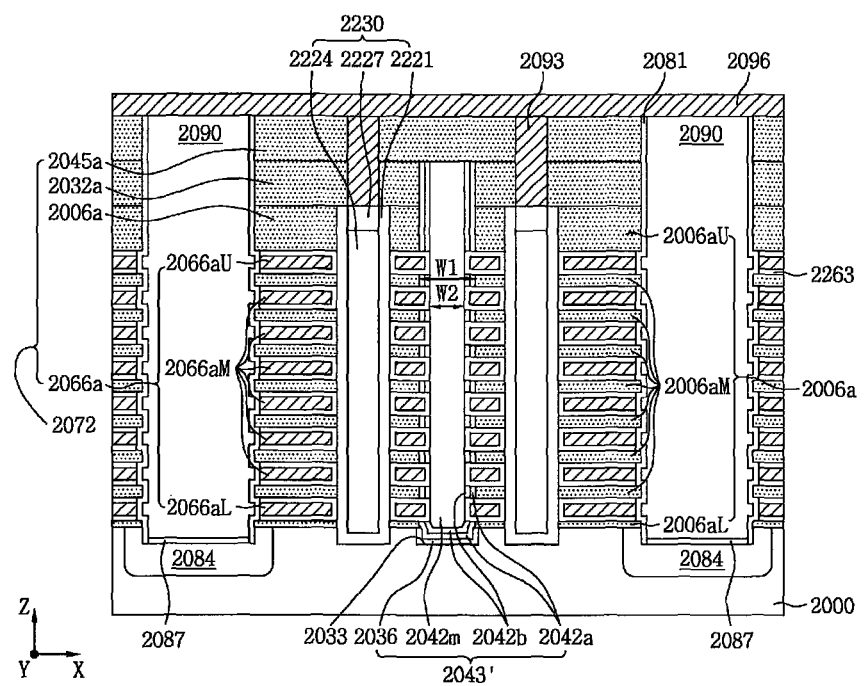
FIG. 19 is a cross-sectional view of another modified example of the semiconductor device according to the fifth embodiment of the inventive concept.

Referring to FIG. 19, modified vertical structures 2230 of the vertical structures 2030 of FIG. 16 may be provided. Each of the vertical structures 2230 may include a gap filling pattern 2224, a pad pattern 2227 disposed on the gap filling pattern 2224, and the active pattern 2221 covering side and bottom surfaces of the gap filling pattern 2224 and extending onto side surfaces of the pad pattern 2227. Also, dielectric patterns 2263 may be interposed between the vertical structures 2230 and the conductive patterns 2066a, extend between the interlayer insulating patterns 2006a and the conductive patterns 2066a, and extend between the support patterns 2043' and the conductive patterns 2066a. As described with reference to FIG. 7B, the dielectric patterns 2263 may include a tunnel dielectric layer, a data storage layer, and a blocking layer.

Next, a semiconductor device according to a sixth embodiment of the inventive concept will be described with reference to FIG. 20.

Figure 20:
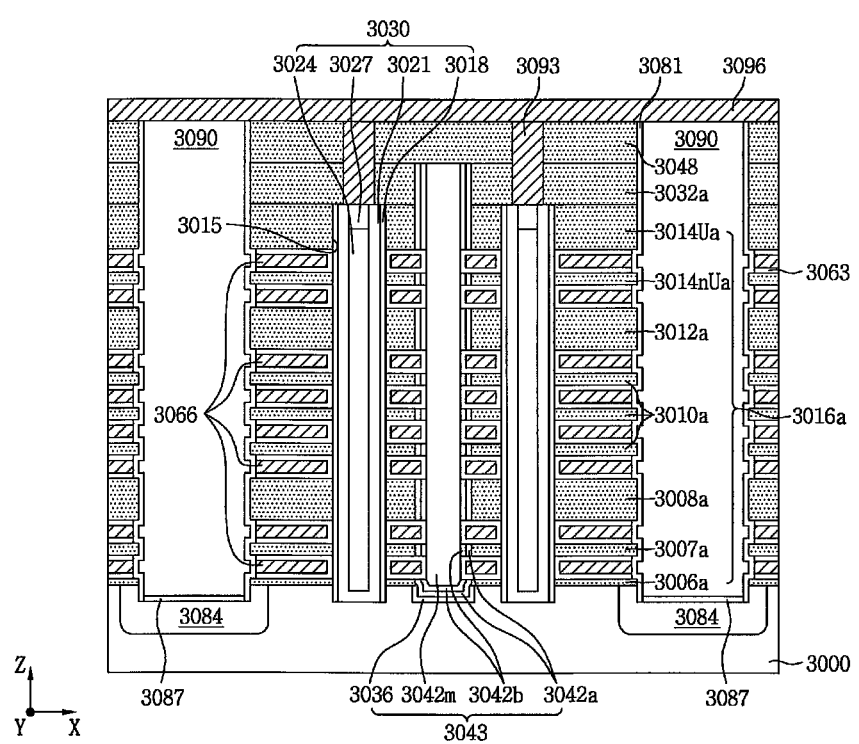
FIG. 20 is a cross-sectional view of a semiconductor device according to a sixth embodiment of the inventive concept.

Referring to FIG. 20, as described with reference to FIG. 10, stack structures including a plurality of interlayer insulating patterns 3016a, a plurality of conductive patterns 3066, and first and second capping patterns 3032a and 3048 may be disposed on a substrate 3000. The conductive patterns 3066 may be spaced apart from one another by the interlayer insulating patterns 3016a and vertically stacked. Also, as described with reference to FIG. 10, a plurality of isolation patterns 3090 may be disposed on the substrate 3000.

As shown in FIG. 2A, impurity regions 3084 may be disposed in the substrate 3000 under the isolation patterns 3090. The impurity regions 3084 may be used as common source regions of a non-volatile memory device, such as a flash memory device. Metal-semiconductor compounds 3087 may be disposed between the substrate 3000 having the impurity regions 3084 and the isolation patterns 3090.

As described with reference to FIG. 10, the conductive patterns 3066 may include at least one lower conductive pattern, a plurality of middle conductive patterns, and at least one upper conductive pattern. The interlayer insulating patterns 3016a may include a lowermost insulating pattern, a lower interlayer pattern, a lower insulating pattern, middle interlayer patterns, an upper insulating pattern, an upper interlayer pattern, and an uppermost insulating pattern.

Vertical structures 3030 may be disposed to penetrate the interlayer insulating patterns 3016a and the conductive patterns 3066. Similarly to that shown in FIG. 16, each of the vertical structures 3030 may include a gap filling pattern 3024, a pad pattern 3027 disposed on the gap filling pattern 3024, the active pattern 3021 covering side and bottom surfaces of the gap filling pattern 3024 and extending onto side surfaces of the pad pattern 3027, and the first dielectric pattern 3018 disposed on side surfaces of the active pattern 3021. Support patterns 3043 may be disposed to penetrate the interlayer insulating patterns 3016a, the conductive patterns 3066, and the first capping pattern 3032a in the stack structures. An insulating oxide 3036 may be disposed between the support patterns 3042 and the substrate 3000.

Each of the support patterns 3043 may include a single layer or a composite layer. For example, when each of the support patterns 3043 includes the composite layer, each of the support patterns 3043 may include a main support pattern 3043m, subsidiary support patterns 3042a and 3042b, and an oxide 3036, as described with reference to FIG. 16.

The main support pattern 3042m may penetrate the interlayer insulating patterns 3016a, the conductive patterns 3066a, and the first capping pattern 3032a. The subsidiary support patterns 3042a and 3042b may include patterns interposed between the main support pattern 3042m and the interlayer insulating patterns 3016a, patterns interposed between the main support pattern 3042m and the first capping pattern 3032a, and patterns interposed between the main support pattern 3042m and the substrate 3000. Also, the subsidiary support patterns 3042a and 3042b may include first subsidiary support patterns 3042a and second subsidiary support patterns 3042b. The first subsidiary support patterns 3042a may be interposed between the main support patterns 3042m and the second subsidiary support patterns 3042b.

Second dielectric patterns 3063 may be interposed between the vertical structures 3030 and the conductive patterns 3066, extend between the interlayer insulating patterns 3016a and the conductive patterns 3066a, and extend between the support patterns 3042 and the conductive patterns 3066.

The first and second dielectric patterns 3018 and 3063 may be variously modified into the first dielectric patterns 50a, 50b, and 50c, and the second dielectric patterns 63a, 63b, and 63c described with reference to FIGS. 2B through 2D.

Conductive plugs 3093 may be disposed to penetrate the first and second capping patterns 3032a and 3048. A conductive line 3096 may be disposed on the conductive plugs 3093.

Meanwhile, the vertical structures 3030 of FIG. 20 may be variously modified as described with reference to FIGS. 17 through 19. Some examples of the modified vertical structures will be respectively described with reference to FIGS. 21 and 22.

Figure 21:
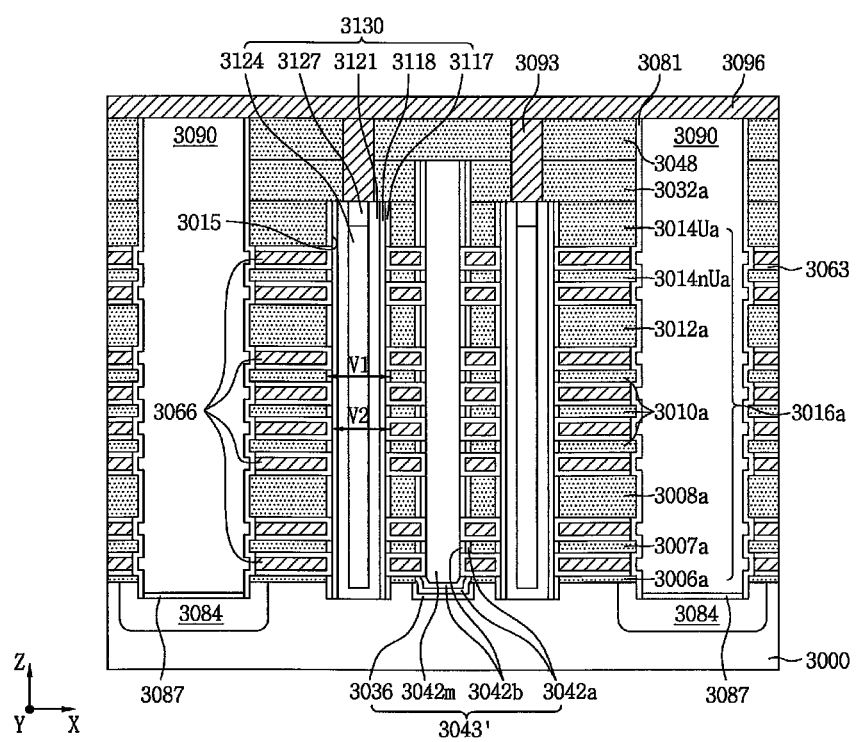
FIG. 21 is a cross-sectional view of a modified example of the semiconductor device according to the sixth embodiment of the inventive concept.

Referring to FIG. 21, the vertical structures 3030 of FIG. 20 may be modified into vertical structures 3130 including first portions and second portions with different widths. As described with reference to FIG. 18, the modified vertical structures 3130 may include first portions having a first width V1, and second portions having a second width V2 less than the first width V1.

Each of the modified vertical structures 3130 may include a gap filling pattern 3124, a pad pattern 3127 disposed on the gap filling pattern 3124, an active pattern 3121 covering side and bottom surfaces of the gap filling pattern 3124 and extending onto side surfaces of the pad pattern 3127, a first dielectric pattern 3118 disposed on side surfaces of the active pattern 3121, a protection dielectric pattern 3117 interposed between the first dielectric pattern 3118 and the interlayer insulating patterns 3016a.

Figure 22:
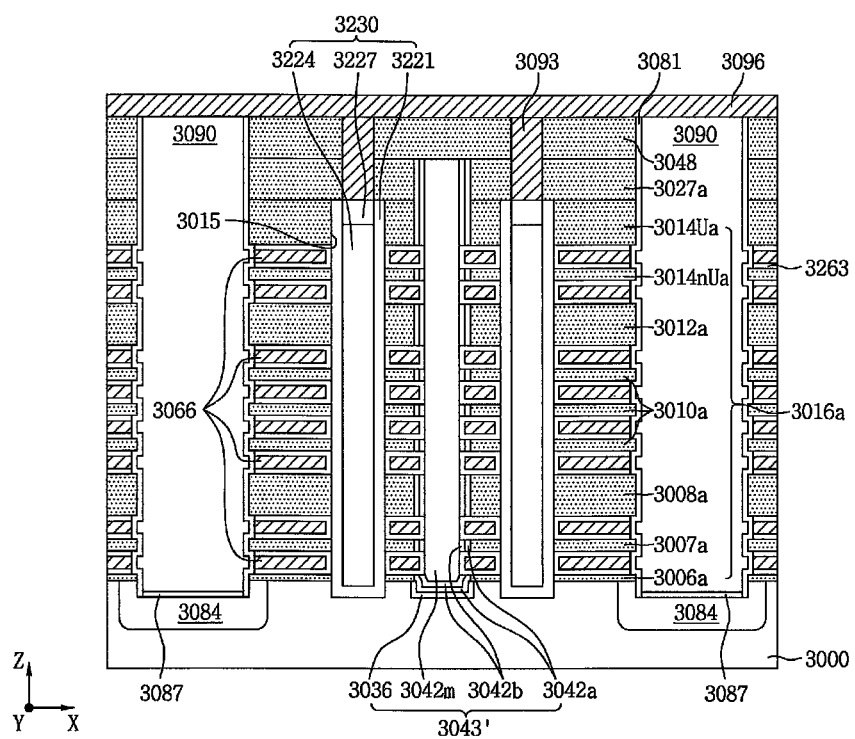
FIG. 22 is a cross-sectional view of another modified example of the semiconductor device according to the sixth embodiment of the inventive concept.

Referring to FIG. 22, modified vertical structures 3230 of the vertical structures 3030 of FIG. 20 may be provided. Each of the vertical structures 3230 may include a gap filling pattern 3224, a pad pattern 3227 disposed on the gap filling pattern 3224, an active pattern 3221 covering side and bottom surfaces of the gap filling pattern 3224 and extending onto side surfaces of pad pattern 3227. Also, dielectric patterns 3263 may be interposed between the vertical structures 3230 and the conductive patterns 3066, extend between the interlayer insulating patterns 3016a and the conductive patterns 3066, and extend between the support patterns 3043' and the conductive patterns 3066. As described with reference to FIG. 7B, the dielectric patterns 3263 may include a tunnel dielectric layer, a data storage layer, and a blocking layer.

Meanwhile, although the vertical structures 3030 described with reference to FIG. 20 may be modified into the vertical structures 3130 and 3230 described with reference to FIGS. 21 and 22, the inventive concept is not limited thereto. For instance, as described with reference to FIG. 17, the vertical structures 3030 described with reference to FIG. 20 may be modified into vertical structures including a plurality of active patterns.

Next, a semiconductor device according to a seventh embodiment of the inventive concept will be described with reference to FIG. 23.

Figure 23:
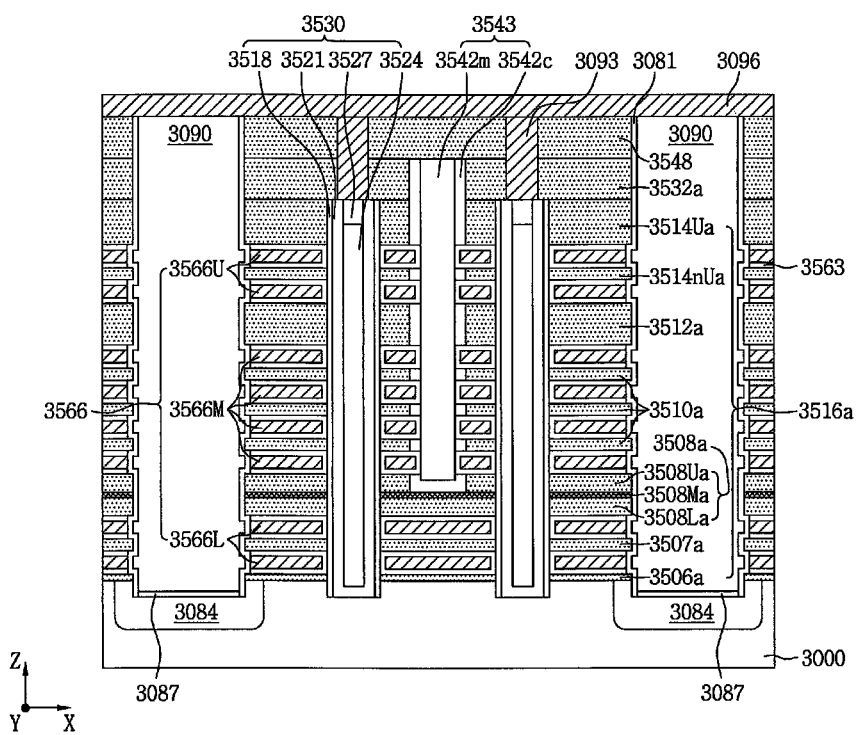
FIG. 23 is a cross-sectional view of a semiconductor device according to a seventh embodiment of the inventive concept.

Referring to FIG. 23, stack structures including a plurality of interlayer insulating patterns 3516a, a plurality of conductive patterns 3566, and first and second capping patterns 3532a and 3548 may be disposed on a substrate 3000. Also, as described with reference to FIG. 10, a plurality of isolation patterns 3584 may be disposed on the substrate 3000. As described with reference to FIG. 10, the conductive patterns 3566 may be spaced apart from one another by the interlayer insulating patterns 3516a and vertically stacked.

The conductive patterns 3566 may include at least one lower conductive pattern 3566L, a plurality of middle conductive patterns 3566M, and at least one upper conductive pattern 3566U. The middle conductive patterns 3566M may be disposed at a higher level than the lower conductive patterns 3566L, and the upper conductive patterns 3566U may be disposed at a higher level than the middle conductive patterns 3566M.

As described with reference to FIG. 10, the interlayer insulating patterns 3516a may include a lowermost insulating pattern 3506a, a lower interlayer pattern 3507a, a lower insulating pattern 3508a, middle interlayer patterns 3510a, an upper insulating pattern 3512a, an upper interlayer pattern 3514nUa, and an uppermost insulating pattern 3514Ua.

The lower insulating pattern 3508a may be thicker than the lower interlayer pattern 3507a and the middle interlayer patterns 3510a. Also, the upper insulating pattern 3512a may be thicker than the lower interlayer pattern 3507a and the middle interlayer patterns 3510a.

The lower insulating pattern 3508a may be a single layer or a stack layer. For instance, similarly to that shown in FIG. 14B, the lower insulating pattern 3508a may include a first lower insulating pattern 3508La, a second lower insulating pattern 3508Ma, and a third lower insulating pattern 3508Ua stacked sequentially.

Support patterns 3543 may be disposed to penetrate the first capping pattern 3532a, penetrate the upper conductive patterns 3566U and the middle conductive patterns 3566M of the conductive patterns 3566, and penetrate the uppermost insulating pattern 3514Ua, the upper interlayer pattern 3514nUa, the upper insulating pattern 3512a, and the middle interlayer patterns 3510a of the interlayer insulating patterns 3516a. Also, the support patterns 3543 may extend into the lower insulating pattern 3508a. For example, the support patterns 3543 may penetrate the middle conductive patterns 3566M and extend to a middle portion between top and bottom surfaces of the lower insulating pattern 3508a. For instance, when the lower insulating pattern 3508a includes the first lower insulating pattern 3508La, the second lower insulating pattern 3508Ma, and the third lower insulating pattern 3508Ua stacked sequentially, the support patterns 3543 may penetrate the middle conductive patterns 3566M, and penetrate the third lower insulating pattern 3508Ua of the lower insulating pattern 3508a. Accordingly, the support patterns 3543 may be disposed at a higher level than the lower conductive patterns 3566L.

Each of the support patterns 3543 may include a single layer or a composite layer. For example, when the support patterns 3543 include the composite layer, each of the support patterns 3543 may include a main support pattern 3542m and a subsidiary support pattern 3542c disposed on a portion of a lateral surface and a bottom surface of the main support pattern 3542m.

Vertical structures 3530 may be disposed to penetrate the interlayer insulating patterns 3516a and the conductive patterns 3566. As described with reference to FIG. 20, each of the vertical structures 3530 may include a gap filling pattern 3524, a pad pattern 3527 disposed on the gap filling pattern 3524, an active pattern 3521 covering side and bottom surfaces of the gap filling pattern 3524 and extending onto side surfaces of the pad pattern 3527, and the first dielectric pattern 3518 disposed on side surfaces of the active pattern 3521.

Second dielectric patterns 3563 may be interposed between the conductive patterns 3566 and the vertical structures 3530, extend between the conductive patterns 3566 and the interlayer insulating patterns 3516a, and extend between the conductive patterns 3566 and the support patterns 3543.

Top surfaces of the support patterns 3543 may be disposed at a higher level than top surfaces of the vertical structures 3530. Also, bottom surfaces of the support patterns 3543 may be disposed at a higher level than bottom surfaces of the vertical structures 3530. The support patterns 3543 may be disposed at a higher level than the lower conductive patterns 3566L.

In addition, the support patterns 3543 and the vertical structures 3530 may be disposed at a lower level than top surfaces of the isolation patterns 3584.

Meanwhile, as described with reference to FIGS. 21 and 22, the vertical structures 3530 described with reference to FIG. 23 may be variously modified. Some examples of the modified vertical structures will be respectively described with reference to FIGS. 24 and 25.

Figure 24:
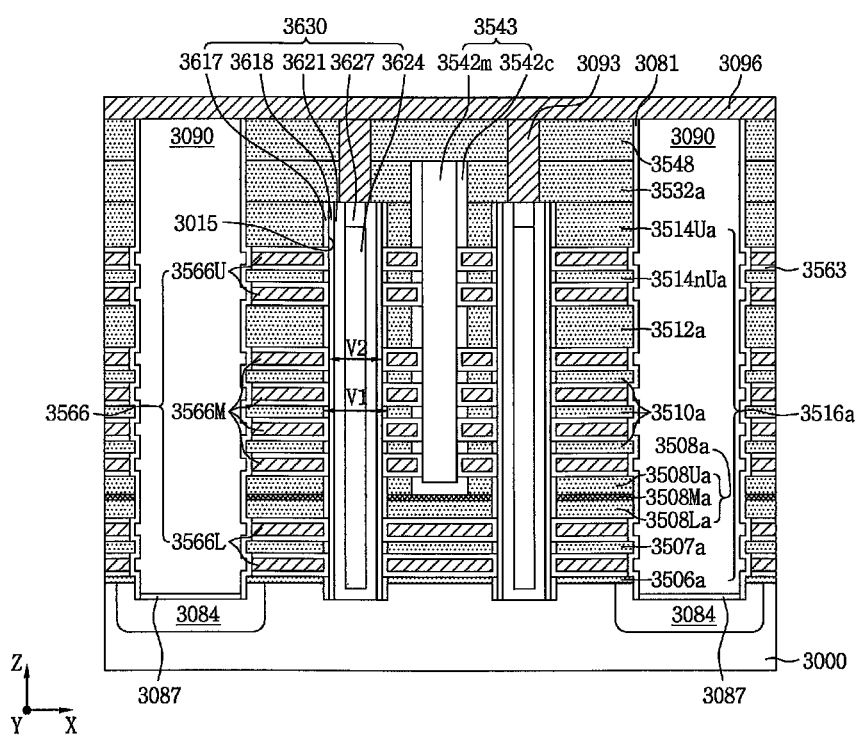
FIG. 24 is a cross-sectional view of a modified example of the semiconductor device according to the seventh embodiment of the inventive concept.

Referring to FIG. 24, the vertical structures 3530 of FIG. 23 may be modified into vertical structures 3630 including first and second portions having different widths. As described with reference to FIG. 21, the modified vertical structures 3630 may include first portions having a first width V1, and second portions having a second width V2 less than the first width V1.

As described with reference to FIG. 21, each of the modified vertical structures 3630 may include a gap filling pattern 3624, a pad pattern 3627 disposed on the gap filling pattern 3624, an active pattern 3621 covering side and bottom surfaces of the gap filling pattern 3624 and extending onto side surfaces of the pad pattern 3627, a first dielectric pattern 3618 disposed on side surfaces of the active pattern 3621, and a protection dielectric pattern 3617 interposed between the first dielectric pattern 3618 and the interlayer insulating patterns 3516a.

Figure 25:
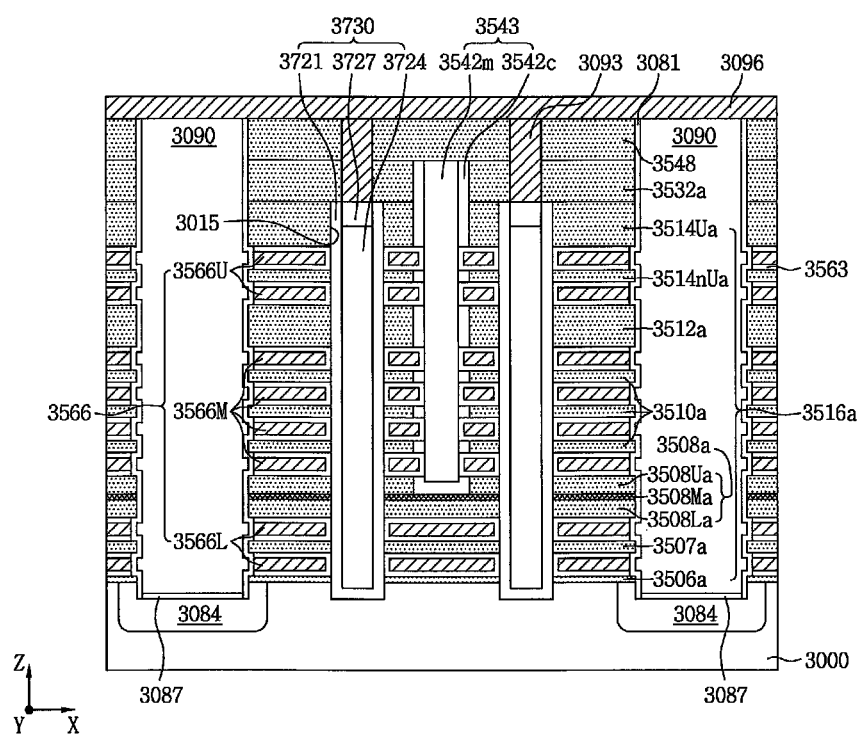
FIG. 25 is a cross-sectional view of another modified example of the semiconductor device according to the seventh embodiment of the inventive concept.

Referring to FIG. 25, modified vertical structures 3730 of the vertical structures 3530 of FIG. 23 may be provided. Each of the vertical structures 3730 may include a gap filling pattern 3724, a pad pattern 3727 disposed on the gap filling pattern 3724, and an active pattern 3721 covering side and bottom surfaces of the gap filling pattern 3724 and extending onto side surfaces of the pad pattern 3727. Also, dielectric patterns 3563 may be interposed between the vertical structures 3730 and the conductive patterns 3566, extend between the interlayer insulating patterns 3516a and the conductive patterns 3566, and extend between the support patterns 3543 and the conductive patterns 3566. As described with reference to FIG. 7B, the dielectric patterns 3563 may include a tunnel dielectric layer, a data storage layer, and a blocking layer.

Although the vertical structures 3530 described with reference to FIG. 23 may be modified into the vertical structures 3630 and 3730 described with reference to FIGS. 24 and 25, the inventive concept is not limited thereto. For example, as described with reference to FIG. 17, the vertical structures 3530 described with reference to FIG. 23 may be modified into vertical structures including a plurality of active patterns.

Next, a semiconductor device according to an eighth embodiment of the inventive concept will be described with reference to FIG. 26. Here, modified portions of the semiconductor device according to the previous embodiments will be chiefly described.

Figure 26:
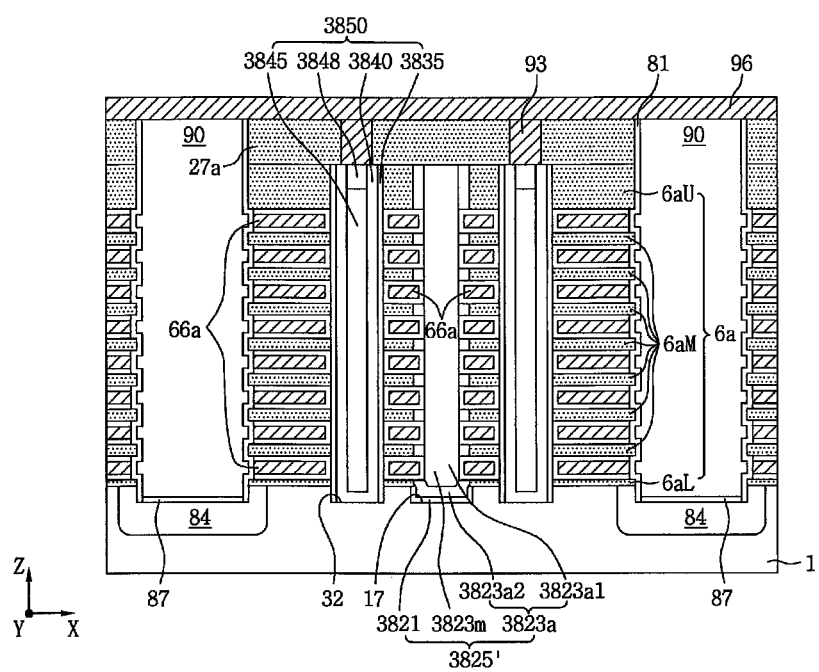
FIG. 26 is a cross-sectional view of a semiconductor device according to an eighth embodiment of the inventive concept.

Referring to FIG. 26, as described with reference to FIG. 3A, stack structures including a plurality of interlayer insulating patterns 6a and a plurality of conductive patterns 66a alternately and repetitively stacked on a substrate 1 may be provided. A plurality of isolation patterns 90 may be disposed on the substrate 1. Each of the stack structures may be disposed on a surface of the substrate 1 between a pair of adjacent isolation patterns 90.

Vertical structures 3850 may be disposed to penetrate the plurality of interlayer insulating patterns 6a and the plurality of conductive patterns 66a. The vertical structures 3850 may have the same shape as in FIG. 2A. For example, each of the vertical structures 3850 may include a gap filling pattern 3845, a pad pattern 3848 disposed on the gap filling pattern 3845, an active pattern 3840 covering bottom and side surfaces of the gap filling pattern 3845 and extending onto side surfaces of the pad pattern 3848, and a first dielectric pattern 3835 disposed on outer lateral surfaces of the active pattern 3840.

Support patterns 3825' may be disposed to penetrate the plurality of interlayer insulating patterns 6a and the plurality of conductive patterns 66a and spaced apart from the vertical structures 3850. The support patterns 3825' may have top surfaces disposed at substantially the same level as the vertical structures 3850. The support patterns 3825' and the vertical structures 3850 may be disposed at a lower level than top surfaces of the isolation patterns 90.

The support patterns 3825' may be formed of a single layer or a composite layer. For instance, each of the support patterns 3825' may have the same shape as in FIG. 3A. For example, each of the support patterns 3825' may include a main support pattern 3823m, subsidiary support patterns 3823a, and an oxide 3821.

The main support pattern 3823m may penetrate the plurality of interlayer insulating patterns 6a and the plurality of conductive patterns 66a. The subsidiary support patterns 3823a may include side subsidiary support patterns 3823a1 interposed between the interlayer insulating patterns 6a and the main support patterns 38233m, and bottom subsidiary support patterns 3823a2 interposed between the main support patterns 3823m and the substrate 1. The oxide 3821 may be interposed between the bottom subsidiary support patterns 3823a2 and the substrate 1.

Next, a semiconductor device according to a ninth embodiment of the inventive concept will be described with reference to FIG. 27. Here, modified portions of the semiconductor device according to the previous embodiments will be chiefly described.

Figure 27:
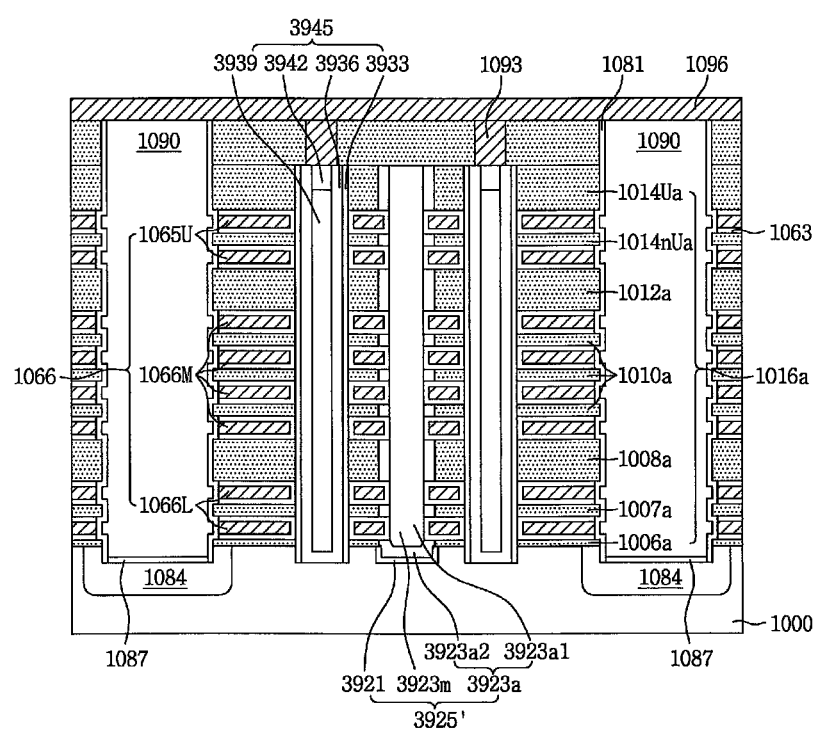
FIG. 27 is a cross-sectional view of a semiconductor device according to a ninth embodiment of the inventive concept.

Referring to FIG. 27, as shown in FIG. 10, isolation patterns 1090 may be provided on a substrate 1000, and a plurality of interlayer insulating patterns 1016a and a plurality of conductive patterns 1066 may be alternately and repetitively stacked on a surface of the substrate 1000 between adjacent isolation patterns 1090.

Support patterns 3925' may be disposed to penetrate the interlayer insulating patterns 1016a and the conductive patterns 1066. Each of the support patterns 3925' may be a single layer or a composite layer. For instance, as described with reference to FIG. 4A, each of the support patterns 3925' may include a main support pattern 1023m, and first and second subsidiary support patterns 1023c1 and 1023c2 disposed on lateral surfaces of the main support pattern 1023m. However, embodiments of the inventive concept are not limited thereto. For instance, the support patterns 3925' may be modified into support patterns 25' having the same shape as described with reference to FIG. 2A, or modified into support patterns 125' having the same shape as described with reference to FIG. 3A.

Vertical structures 3945 may be disposed to penetrate the interlayer insulating patterns 1016a and the conductive patterns 1066. The vertical structures 3945 may have the same shape as the vertical structures 1045 described with reference to FIG. 10. For instance, each of the vertical structures 3945 may include a gap filling pattern 3939, a pad pattern 3942 disposed on the gap filling pattern 3939, an active pattern 3936 surrounding bottom and side surfaces of the gap filling pattern 3939 and extending onto side surfaces of the pad pattern 3942, and a first dielectric pattern 3933 disposed on side surfaces of the active pattern 3936. However, embodiments of the inventive concept are not limited thereto. For example, the vertical structures 3945 may include a plurality of active patterns as shown in FIG. 11, include protection dielectric patterns as shown in FIG. 12, or have the same shape as in FIG. 13.

The vertical structures 3945 and the support patterns 3925' may be disposed to have top surfaces disposed at substantially the same level. The vertical structures 3945 and the support patterns 3925' may be disposed at a lower level than top surfaces of the isolation patterns 1090.

Next, a semiconductor device according to a tenth embodiment of the inventive concept will be described with reference to FIG. 28. Here, modified portions of the semiconductor device according to the previous embodiments will be chiefly described.

Figure 28:
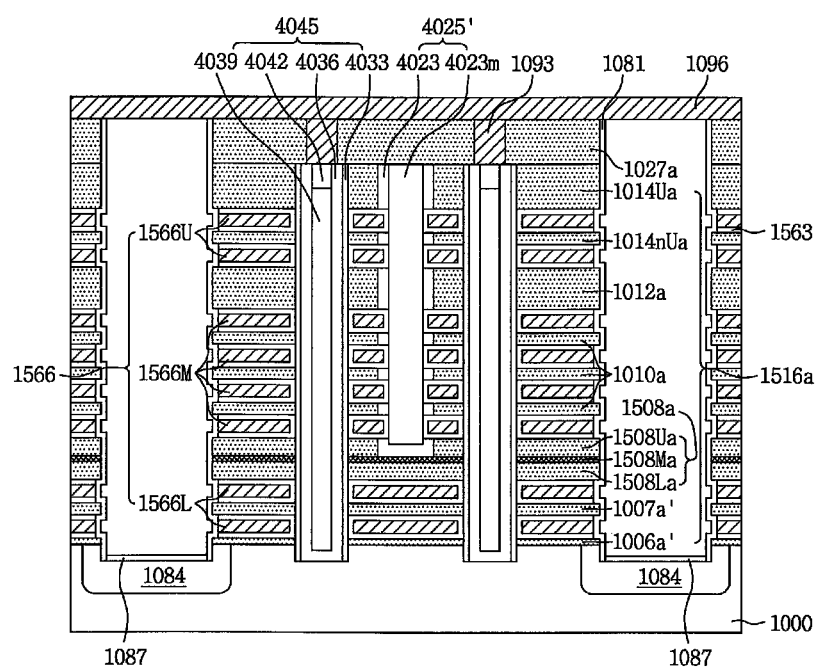
FIG. 28 is a cross-sectional view of a semiconductor device according to a tenth embodiment of the inventive concept.

Referring to FIG. 28, as described with reference to FIG. 14B, isolation patterns 1090 may be disposed on a substrate 1000, and a plurality of interlayer insulating patterns 1516a and a plurality of conductive patterns 1566 may be alternately and repetitively stacked on a surface of the substrate 1000 between the isolation patterns 1090.

As described with reference to FIG. 14B, the conductive patterns 1566 may include at least one lower conductive pattern 1566L, a plurality of middle conductive patterns 1566M, and at least one upper conductive pattern 1566U. The middle conductive patterns 1566M may be disposed at a higher level than the lower conductive patterns 1566L, and the upper conductive patterns 1566U may be disposed at a higher level than the middle conductive patterns 1566M.

As described with reference to FIG. 14B, the interlayer insulating patterns 1516a may include a lowermost insulating pattern 1006a', a lower interlayer pattern 1007a', a lower insulating pattern 1508a, middle interlayer patterns 1010a, an upper insulating pattern 1012a, an upper interlayer pattern 1014nUa, and an uppermost insulating pattern 1014Ua. The lower insulating pattern 1508a may include a first lower insulating pattern 1508La, a second lower insulating pattern 1508Ma, and a third lower insulating pattern 1508Ua stacked sequentially. The second lower insulating pattern 1508Ma may be formed of a material layer having an etch selectivity with respect to the first and third lower insulating patterns 1508La and 1508Ua.

Support patterns 4025' may be disposed to penetrate the upper conductive patterns 1566U and the middle conductive patterns 1566M of the conductive patterns 1566, and penetrate the uppermost insulating pattern 1014Ua, the upper interlayer pattern 1014nUa, the upper insulating pattern 1012a, and the middle interlayer patterns 1010a of the interlayer insulating patterns 1516a. Also, the support patterns 4025' may extend into the lower insulating patterns 1508a as shown in FIG. 14B. For instance, the support patterns 4025' may penetrate the middle conductive patterns 1566M and extend to a middle portion between top and bottom surfaces of the lower insulating pattern 1508a.

Each of the support patterns 4025' may be formed of a single layer or a composite layer. For example, when the support patterns 4025' include the composite layer, each of the support patterns 4025' may include a main support pattern 4023m and a subsidiary support pattern 4023 disposed on a portion of a side surface and a bottom surface of the main support pattern 4023m as shown in FIG. 14B.

Vertical structures 4045 may be disposed to penetrate the interlayer insulating patterns 1516a and the conductive patterns 1566. The vertical structures 4045 may have the same shape as the vertical structures 1045 described with reference to FIG. 10. For example, each of the vertical structures 4045 may include a gap filling pattern 4039, a pad pattern 4042 disposed on the gap filling pattern 4039, an active pattern 4036 surrounding bottom and side surfaces of the gap filling pattern 4039 and extending onto side surfaces of the pad pattern 4042, and a first dielectric pattern 4033 disposed on side surfaces of the active pattern 4036. However, embodiments of the inventive concept are not limited thereto. For example, the vertical structures 4045 may include a plurality of active patterns as shown in FIG. 11, include protection dielectric patterns as shown in FIG. 12, or have the same shape as in FIG. 13.

The vertical structures 4045 and the support patterns 4025' may be disposed to have top surfaces disposed at substantially the same level. The vertical structures 4045 and the support patterns 4025' may be disposed at a lower level than top surfaces of the isolation patterns 1090.

Hereinafter, methods of fabricating semiconductor devices according to the above-described first through tenth embodiments of the inventive concept and modified examples thereof will be described.

Figure 29:
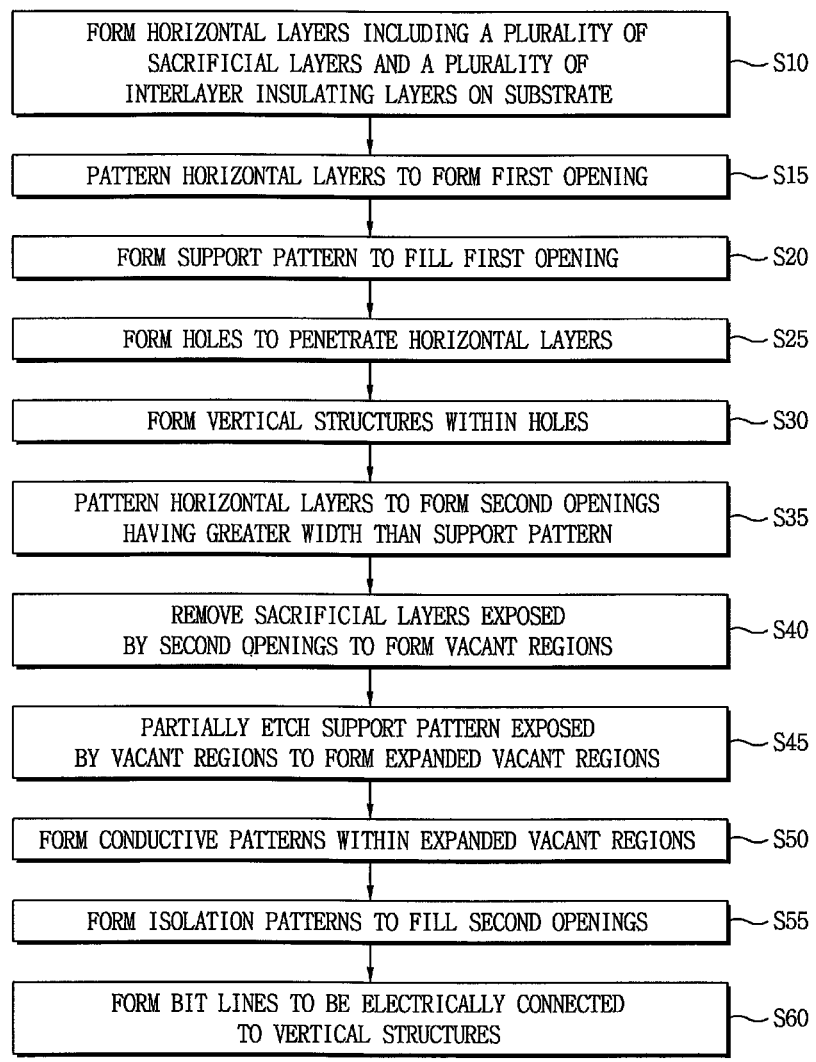
FIG. 29 is a flowchart illustrating the first through fourth embodiments and eighth through tenth embodiments of the inventive concept.

FIG. 29 is a flowchart illustrating a method of fabricating each of the semiconductor devices according to the first through fourth and eighth through tenth embodiments of the inventive concept and modified examples thereof, which are described with reference to FIGS. 2A through 15.

Referring to FIG. 29, horizontal layers including a plurality of sacrificial layers and a plurality of interlayer insulating layers may be formed on a substrate (operation S10). The substrate may be a semiconductor substrate. The horizontal layers may be patterned to form a first opening (operation S15). A support pattern may be formed to fill the first opening (operation S20). Holes may be formed to penetrate the horizontal layers (operation S25). Vertical structures may be formed within the holes (operation S30). The horizontal layers may be patterned to form second openings having a greater width than the support pattern (operation S35). The sacrificial layers exposed by the second openings may be removed to form vacant regions (operation S40). The support pattern exposed by the vacant regions may be partially etched to form expanded vacant regions (operation S45). Conductive patterns may be formed in the expanded vacant regions (operation S50). Isolation patterns may be respectively formed to fill the second openings (operation S55). Bit lines electrically connected to the vertical structures may be formed (operation S60).

Hereinafter, a method of fabricating each of the semiconductor devices according to the first through fourth embodiments of the inventive concept and modified examples thereof, which are described with reference to FIGS. 2A through 15, will be described with reference to FIGS. 29 and 30 through 37E.

To begin with, methods of fabricating semiconductor devices according to the first embodiment of the inventive concept and modified examples thereof, which are described with reference to FIGS. 2A through 2E, will be described with reference to FIGS. 29 and 30A through 30R.

Figure 30A:
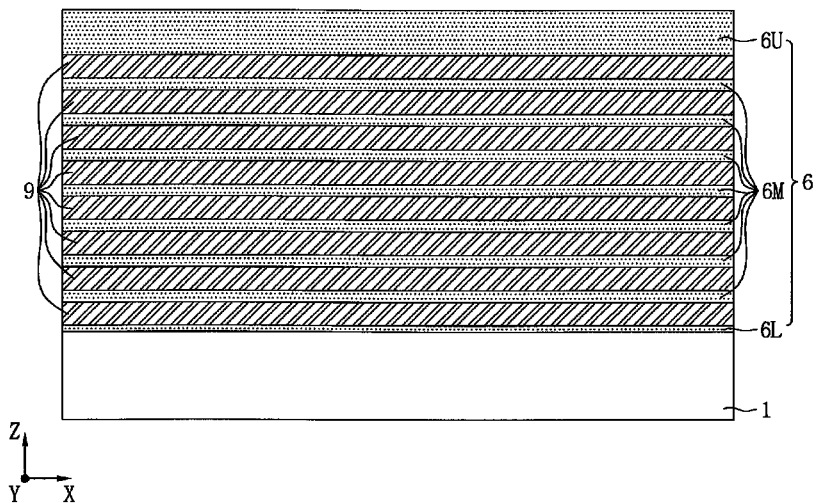
FIGS. 30A through 30R are cross-sectional views illustrating a method of fabricating a semiconductor device according to a first embodiment of the inventive concept

Referring to FIGS. 29 and 30A, a substrate 1 may be prepared. The substrate 1 may be a semiconductor substrate. For example, the substrate 1 may be a semiconductor wafer formed of a semiconductor material, such as silicon. The substrate 1 may include a memory cell region (or cell array region) including memory cells, and a peripheral circuit region including peripheral circuits configured to operate the memory cells. The substrate 1 may include a well region of a first conductivity type. The first conductivity type may be a P type.

Horizontal layers 6 and 9 may be formed on the substrate 1 (operation S10). The horizontal layers 6 and 9 may include interlayer insulating layers 6 and sacrificial layers 9 alternately and repetitively stacked in a vertical direction. The sacrificial layers 9 may be vertically spaced apart from one another by the interlayer insulating layers 6.

The interlayer insulating layers 6 may include a lowermost interlayer insulating layer 6L, an uppermost interlayer insulating layer 6U, and a plurality of middle interlayer insulating layers 6M interposed between the lowermost interlayer insulating layer 6L and the uppermost interlayer insulating layer 6U. The uppermost interlayer insulating layer 6U may be formed to a greater thickness than each of the middle interlayer insulating layers 6M. Also, the lowermost interlayer insulating layer 6L may be formed to a smaller thickness than each of the middle interlayer insulating layers 6M. A lowermost layer of the horizontal layers 6 and 9 may be the lowermost interlayer insulating layer 6L, while an uppermost layer thereof may be the uppermost interlayer insulating layer 6U.

The sacrificial layers 9 may be formed of a material having an etch selectivity with respect to the interlayer insulating layers 6. For example, the interlayer insulating layers 6 may be formed of an insulating oxide (e.g., silicon oxide obtained using a chemical vapor deposition (CVD) process), and the sacrificial layers 9 may be formed of an insulating oxide or silicon. For instance, when the interlayer insulating layers 6 are formed of silicon oxide, the sacrificial layers 9 may be formed of an insulating nitride, such as silicon nitride, amorphous silicon (a-Si), or poly-Si.

Figure 30B:
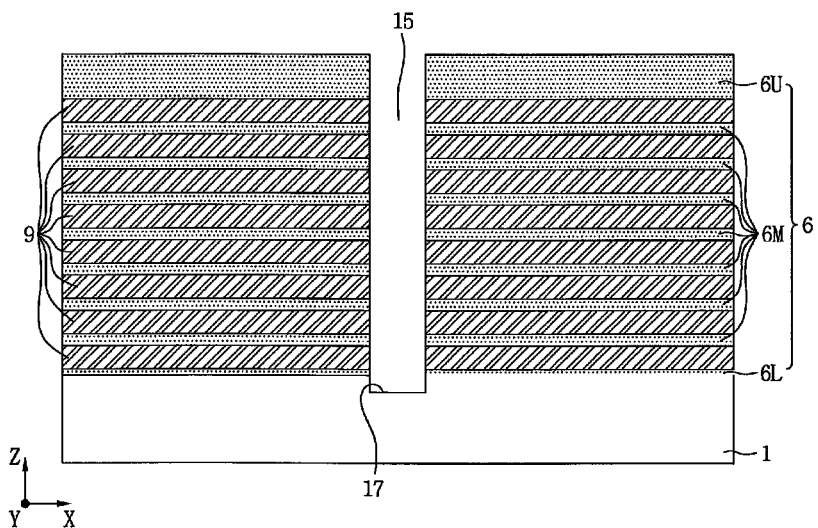

Referring to FIGS. 29 and 30B, the horizontal layers 6 and 9 may be patterned to form first openings 15 (operation S15). The first openings 15 may penetrate the horizontal layers 6 and 9. From a plan view, each of the first openings 15 may have a linear shape. The first openings 15 may be substantially parallel to one another.

The openings 15 may penetrate the horizontal layers 6 and 9 to expose portions of the substrate 1. Furthermore, the openings 15 may penetrate the horizontal layers 6 and 9 and extend into the substrate 1. Accordingly, recessed portions 17 may be formed by the openings 15 in the substrate 1.

Figure 30C:
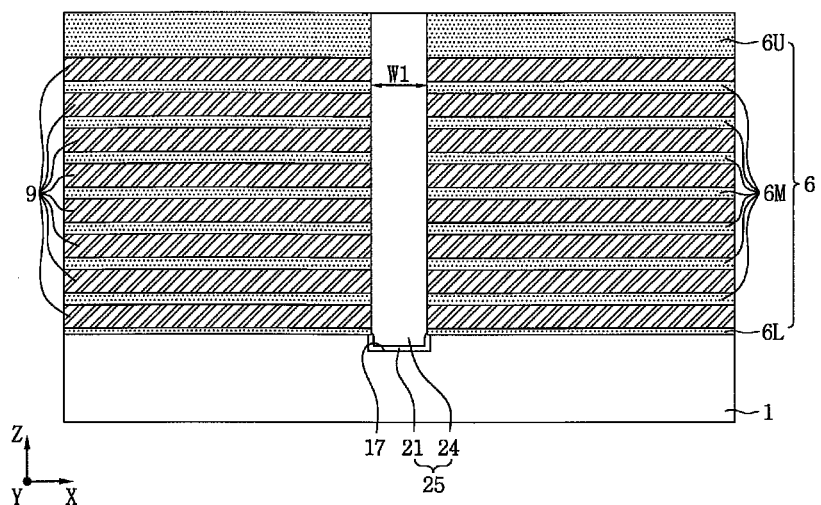

Referring to FIGS. 29 and 30C, support patterns 25 may be formed to fill the first openings 15 (operation S20). The formation of the support patterns 25 may include forming a material layer to fill the first openings 15, and planarizing the material layer until the uppermost layer 6U of the horizontal layers 6 and 9 is exposed. Accordingly, from a plan view, the support patterns 25 may have straight linear shapes substantially parallel to one another. Each of the support patterns 25 may have a linear shape having a first width W1.

The support patterns 25 may include a material having an etch selectivity with respect to the sacrificial layers 9. For example, when the sacrificial layers 9 are formed of an insulating nitride (e.g., silicon nitride), the support patterns 25 may be formed of a-Si or poly-Si. Alternatively, when the sacrificial layers 9 are formed of a-Si or poly-Si, the support patterns 25 may be formed of an insulating nitride (e.g., silicon nitride).

In some embodiments, when the support patterns 25 include a conductive material, the support patterns 25 may include a main support pattern 24 and an insulating oxide 21 interposed between the main support pattern 24 and the substrate 1. For example, the main support pattern 24 may be formed of a conductive material (e.g., a-Si or poly-Si), and the insulating oxide 21 may be formed of an oxide capable of electrically insulating the main support pattern 24 from the substrate 1. The formation of the support patterns 25 may include forming the insulating oxide 21 on the substrate 1 exposed by the first openings 15, and forming the main support patterns 24 to fill the first openings 15. The insulating oxide 21 may be formed of an oxide (e.g., silicon oxide) obtained by oxidizing the substrate 1.

Figure 30D:
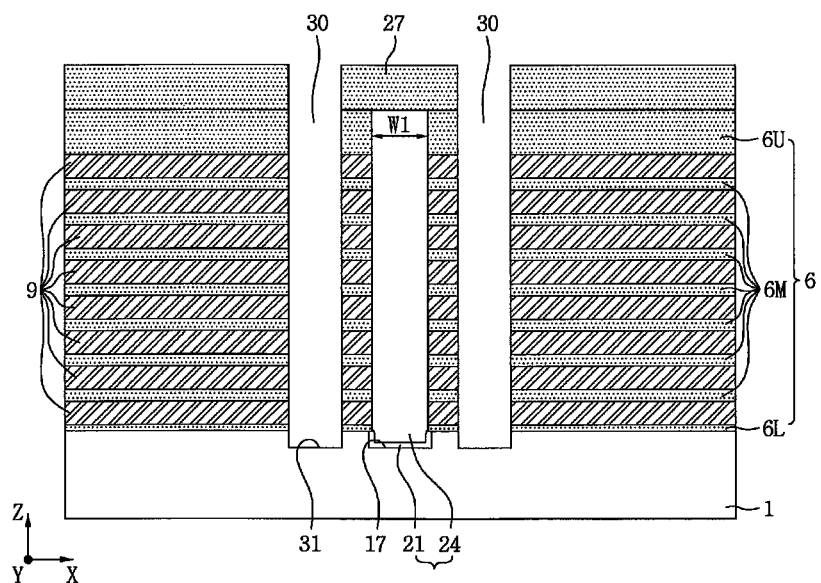

Referring to FIGS. 29 and 30D, a first capping layer 27 may be formed to cover the support patterns 25. The first capping layer 27 may be formed of an insulating material layer having an etch selectivity with respect to the sacrificial layers 9. For instance, when the sacrificial layers 9 are formed of silicon nitride, the first capping layer 27 may be formed of silicon oxide.

The first capping layer 27 and the horizontal layers 6 and 9 may be patterned, thereby forming holes 30 to penetrate the first capping layer 27 and the horizontal layers 6 and 9, and expose portions of the substrate 1 (operation S25). The holes 30 may be spaced apart from one another. The holes 30 may be spaced apart from the support patterns 24.

In some embodiments, each of the holes 30 may include a portion extending into the substrate 1, that is, a recessed portion 31 of the substrate 1. For example, the formation of the holes 30 may include etching the interlayer insulating layers 6 and the sacrificial layers 9 using photolithography and etching processes to form portions penetrating the horizontal layers 6 and 9, and etching a portion of the substrate 1 to form a recessed portion 31 in the substrate 1.

Figure 30E:
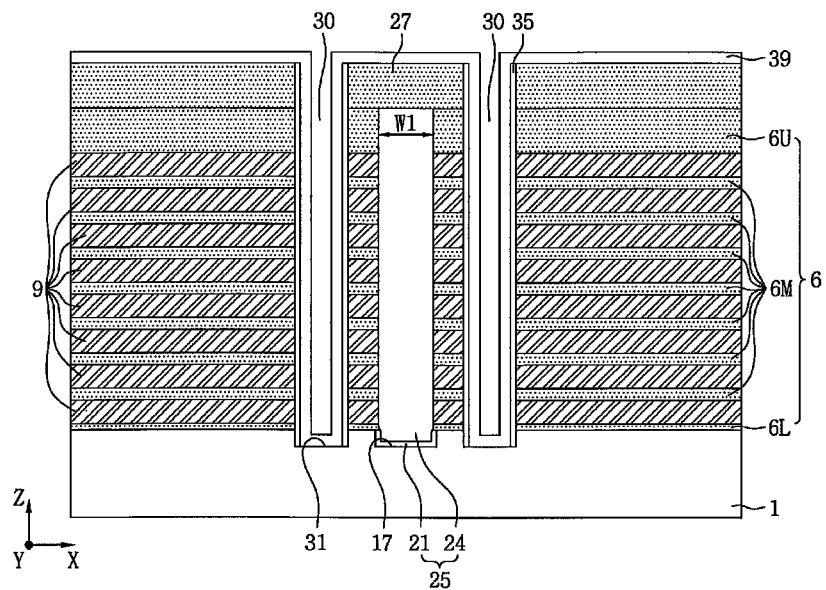

Referring to FIG. 30E, first dielectric patterns 35 may be formed on sidewalls of the hole 30. The formation of the first dielectric patterns 35 may include forming at least one dielectric layer on the substrate 1 having the holes 30, and etching the dielectric layer to leave the dielectric layer on the sidewalls of the holes 30 and expose bottoms of the holes 30. Each of the first dielectric patterns 35 may be any one of the first dielectric patterns 35a, 35b, and 35c described with reference to FIGS. 2B through 2D.

An active layer 39 may be formed on the substrate 1 having the first dielectric patterns 35. The active layer 39 may be conformally formed on the substrate 1 having the first dielectric patterns 35. The active layer 39 may cover the first dielectric patterns 35 and be in contact with the substrate 1 disposed in the bottoms of the holes 30.

The active layer 39 may be formed using a CVD process or an atomic layer deposition (ALD) process. The active layer 39 may include a crystalline semiconductor layer. For instance, the formation of the active layer 39 may include conformally forming an a-Si layer on the substrate 1 having the first dielectric patterns 35, and forming a crystalline silicon layer using an annealing process for crystallizing the a-Si layer. For example, the crystalline silicon layer may be a poly-Si layer.

Figure 30F:
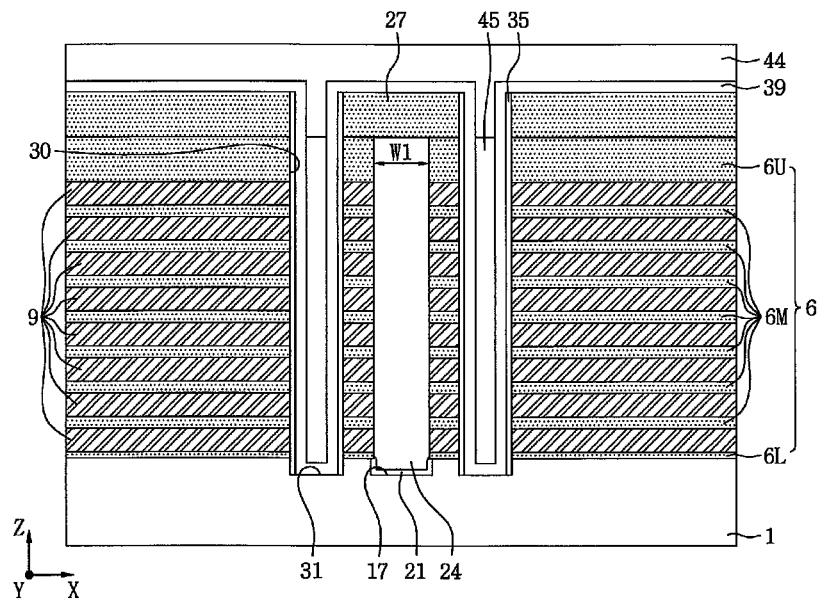

Referring to FIG. 30F, a gap filling layer 44 may be formed on the substrate 1 having the active layer 39 to fill the holes 30. The gap filling layer 44 may be formed of an insulating material layer. For example, the gap filling layer 44 may be formed of an insulating material, such as silicon oxide. The gap filling layer 44 may fill the holes 30 along with the first dielectric patterns 35 and the active layer 39. For example, the active layer 39 may be formed on inner walls of the holes 30, and the gap filling layer 44 may fill the remaining portions of the holes 30, which are not filled with the active layer 39.

Figure 30G:
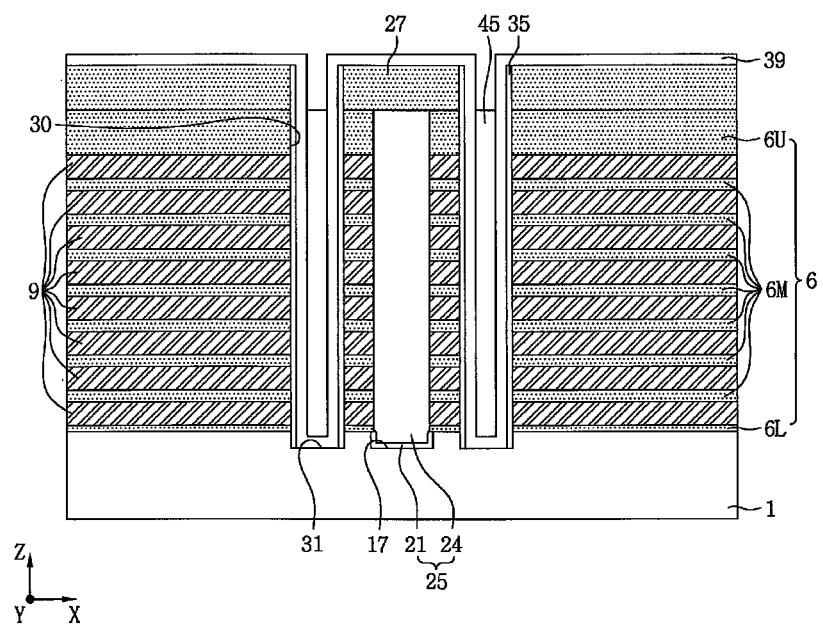

Referring to FIG. 30G, the gap filling layer 44 may be partially etched to form gap filling patterns 45 partially filling the holes 30. Accordingly, portions of the active layer 39 may be exposed.

Figure 30H:
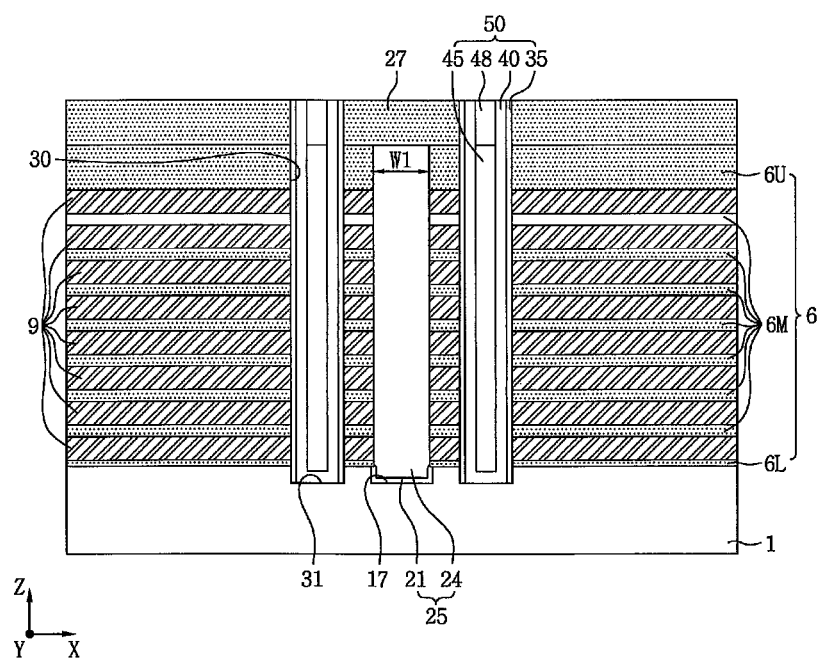

Referring to FIGS. 29 and 30H, a pad layer may be formed on the substrate 1 having the gap filling patterns 45, and the pad layer and the active layer may be planarized until the first capping layer 27 is exposed. Accordingly, the planarized active layer remaining within the holes 30 may be defined as active patterns 40, while the planarized pad layer may be defined as pad patterns 48. The pad patterns 48 may be formed of poly-Si.

The active patterns 40 may be formed on inner walls of the holes 30, and the gap filling patterns 45 and the pad patterns 48 may be sequentially stacked on the active patterns 40. The gap filling patterns 45 may be surrounded with the active patterns 40 and the pad patterns 48.

The first dielectric patterns 35, the active patterns 39a, the gap filling patterns 45a, and the pad patterns 48 may constitute vertical structures 50. Accordingly, the vertical structures 50 may be formed within the holes 30 and penetrate the horizontal layers 6 and 9 and the first capping layer 27.

Thereafter, an ion implantation process may be performed so that impurities can be implanted into upper regions of the pad pattern 48 and the active pattern 40. Accordingly, as shown in FIG. 2E, the upper regions of the pad pattern 48 and the active pattern 40 may be formed to have the same conductivity type. For example, upper regions (refer to 40U of FIG. 2E) of the pad pattern 48 and the active pattern 40 may have an N conductivity type. Accordingly, as described with reference to FIG. 2E, the active pattern 40 may include a first portion 40L and a second portion 40U disposed on the first portion 40L.

Figure 30I:
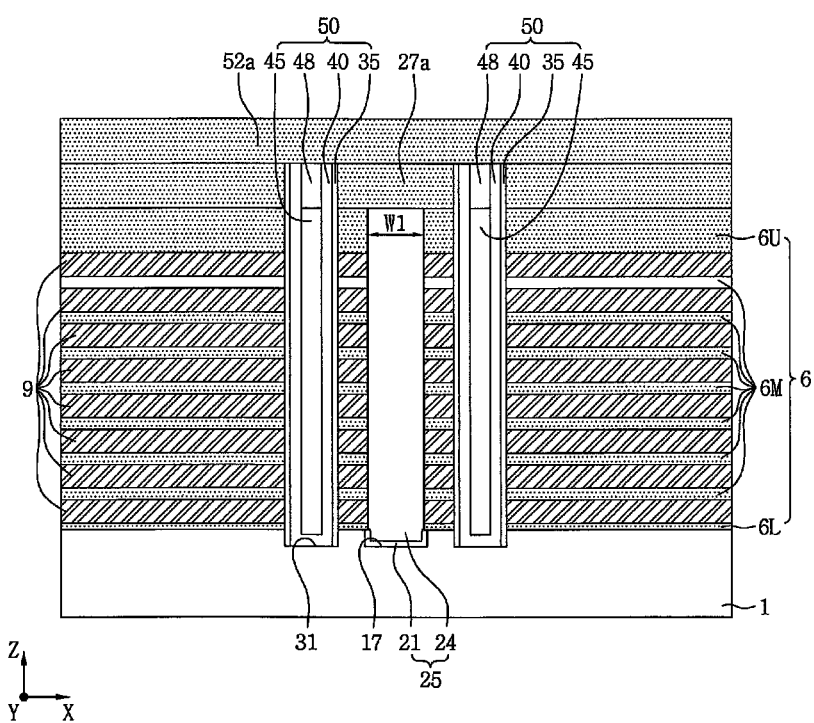

Referring to FIG. 30I, a second capping layer 52a may be formed on the substrate 1 having the vertical structures 50. The second capping layer 52a may be formed to cover the active patterns 40, the pad patterns 48, and the first capping layer 27a. The second capping layer 52a may be formed of an insulating material layer (e.g., a silicon oxide layer) having an etch selectivity with respect to the sacrificial layers 9.

Figure 30J:
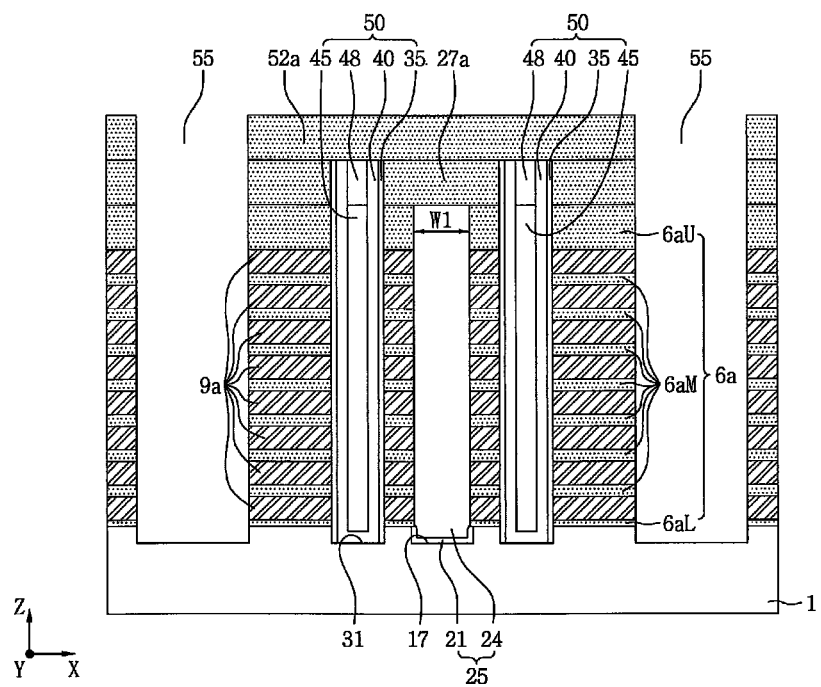

Referring to FIGS. 29 and 30J, the second capping layer 52a, the first capping layer 27a, and the horizontal layers 6 and 9 may be patterned, thereby forming second openings 55 (operation S35). From a plan view, each of the second openings 55 may have a linear shape. The second openings 55 may have linear shapes substantially parallel to one another. The openings 55 may be formed to a greater width than the support patterns 25.

In some embodiments, portions of the surface of the substrate 1 may be recessed by the openings 55.

Each of the support patterns 25 may be disposed between a pair of adjacent second openings 55. Similarly, each of the second openings 55 may be disposed between a pair of adjacent support patterns 25 of the plurality of support patterns 25.

Due to the second openings 55, the second capping layer 52 may be defined as a second capping pattern 52a, and the first capping layer 27 may be defined as a first capping pattern 27a. Also, due to the second openings 55, the interlayer insulating layers 6 may be defined as interlayer insulating patterns 6a, the sacrificial layers 9 may be defined as sacrificial patterns 9a, and the first and second capping layers 27 and 52 may be defined as first and second capping patterns 27a and 52a. The interlayer insulating patterns 6a may include an uppermost interlayer insulating pattern 6aU, a lowermost interlayer insulating pattern 6aL, and a plurality of middle interlayer insulating patterns 6aM. The plurality of middle interlayer insulating patterns 6aM may be disposed between the uppermost interlayer insulating pattern 6aU and the lowermost interlayer insulating pattern 6aL.

Each of the sacrificial patterns 9a may have a first side surface and a second side surface disposed opposite each other. The first side surfaces of the sacrificial patterns 9a may be exposed by the second openings 55, while the second side surfaces thereof may be adjacent to or in contact with the support patterns 25. Accordingly, one side surfaces of the sacrificial patterns 9a may be exposed by the second openings 55, while other side surfaces thereof may be in contact with the support patterns 25.

Each of the interlayer insulating patterns 6a may have a first side surface and a second side surface disposed opposite each other. First side surfaces of the interlayer insulating patterns 6a may be exposed by the second openings 55, and second side surfaces of the interlayer insulating patterns 6a may be in contact with the support patterns 25. Accordingly, one side surfaces of the interlayer insulating patterns 6a may be in contact with the support patterns 25, while other side surfaces thereof may be exposed by the second openings 55.

Figure 30K:
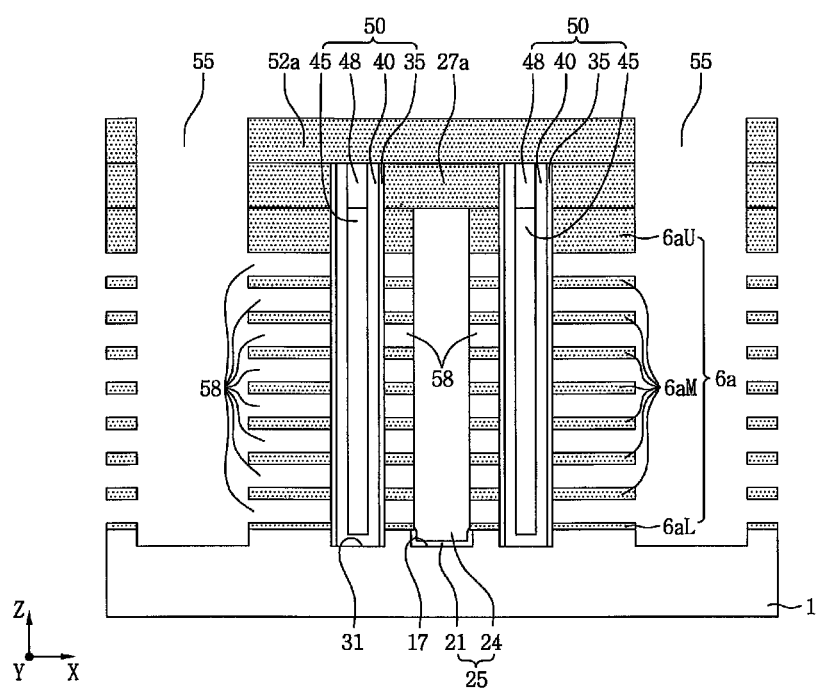

Referring to FIGS. 29 and 30K, the sacrificial patterns 9a exposed by the second openings 55 may be selectively removed to form vacant regions 58 (operation S40). As a result, portions of lateral surfaces of the vertical structures 50 may be exposed by the vacant regions 58, and portions of side surfaces of the support patterns 25 may be exposed.

Figure 30L:
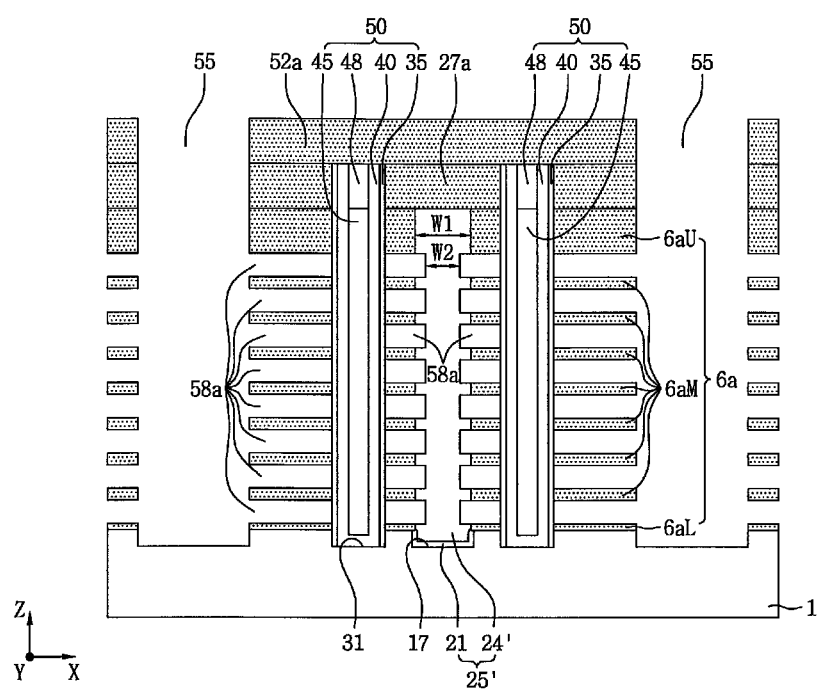

Referring to FIGS. 29 and 30L, the support patterns 25 exposed by the vacant regions 58 may be partially etched using etching equipment, thereby forming expanded vacant regions 58a (operation S45). Accordingly, the expanded vacant regions 58 may extend into the support patterns 25. Also, the support patterns 25 may be defined as support patterns 25' having non-vertical side surfaces due to the expanded vacant regions 58.

Each of the support patterns 25' may have a non-vertical side surface, that is, a rough side surface. Each of the support patterns 25' may have a first width W1 in first portions disposed at substantially the same level as the interlayer insulating patterns 6a, and a second width W2 in second disposed at substantially the same level as the vacant regions 58a. The second width W2 may be less than the first width W1. That is, as described with reference to FIGS. 2A and 2B, each of the support patterns 25' may have a first portion having a first width W1, and a second portion having a second width W2 less than the first width W1.

The vacant regions 58 or the expanded vacant regions 58a may be formed between the interlayer insulating patterns 6a. One side surfaces of the interlayer insulating patterns 6a may be in contact with the support patterns 25'. Accordingly, the support patterns 25', which may be in contact with the one side surfaces of the interlayer insulating patterns 6a, may prevent deformation of the interlayer insulating patterns 6a or occurrence of failures (e.g., cracks) in the interlayer insulating patterns 6a.

Figure 30M:
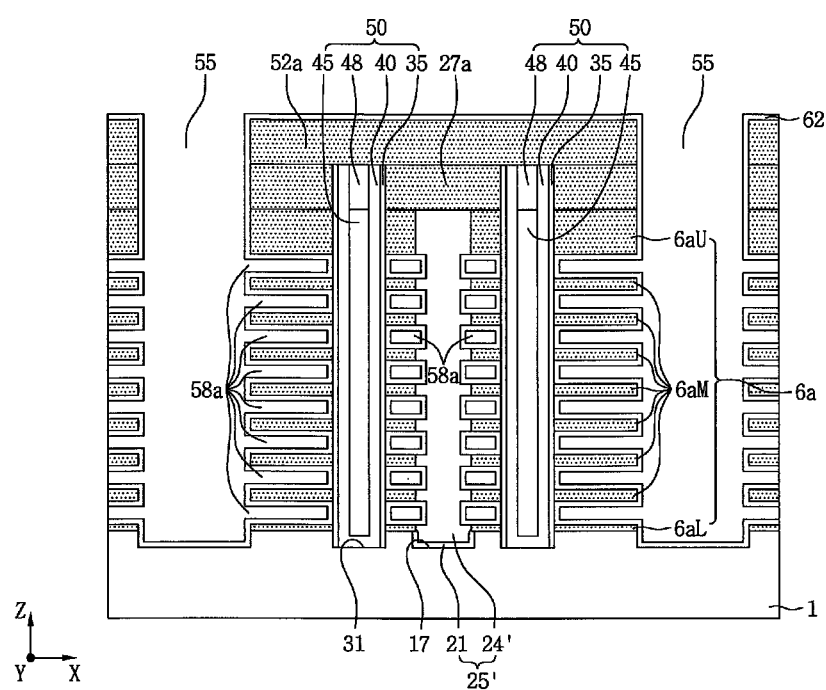

Referring to FIG. 30M, a dielectric material 62 may be conformally formed on the substrate 1 having the expanded vacant regions 58a and the support patterns 25'. The dielectric material 62 may be formed of the same material layer as any one of the second dielectric patterns 63a, 63b, and 63c described with reference to FIGS. 2B through 2D.

Figure 30N:
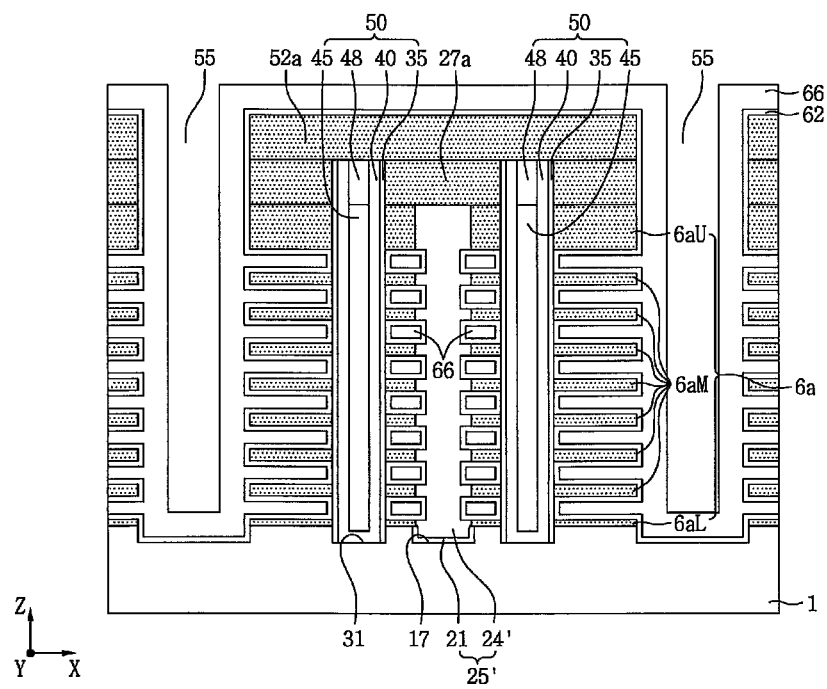
Figure 300:
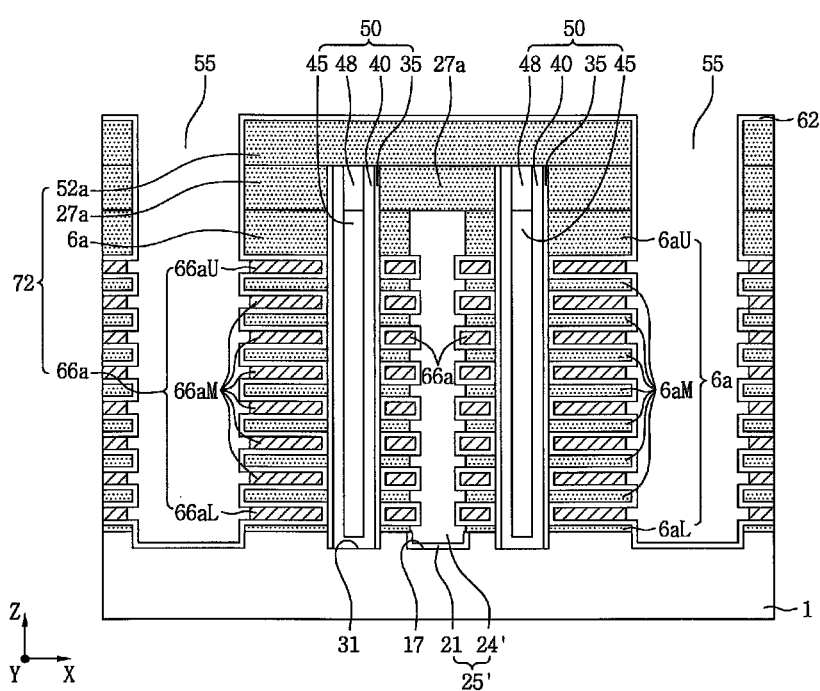

Referring to FIG. 30N, a conductive layer 66 may be formed on the dielectric material 62 to fill the expanded vacant regions 58a illustrated in FIG. 30M. The conductive layer 66 may be formed to fill the vacant regions 58a and cover inner walls of the second opening 55. Also, the conductive layer 66 may be formed as an open type not to completely fill the second openings 55.

The conductive layer 66 may be formed of at least one of a doped semiconductor (e.g., doped silicon), a metal (e.g., tungsten, copper, or aluminum), a conductive metal nitride (e.g., titanium nitride, tantalum nitride, or tungsten nitride), a conductive metal-semiconductor compound (e.g., a metal silicide), or a transition metal (e.g., titanium or tantalum). For instance, the conductive layer 66 may include a titanium nitride layer and a tungsten layer stacked sequentially.

Referring to FIGS. 29 and 30O, the conductive layer 66 may be partially etched, thereby forming conductive patterns 66a remaining in the vacant regions 58a (operation S50). The partial etching of the conductive layer 66 may be performed using an isotropic etching process. In some embodiments, the conductive patterns 66a may have sidewalls that are not vertically aligned with sidewalls of the interlayer insulating patterns 6a.

As shown in FIG. 30J, the process of etching the horizontal layers 6 and 9 to form the second openings 55, the process of removing the sacrificial patterns 9a using an etching process to form the vacant regions (refer to 58 in FIG. 30K) and the expanded vacant regions (refer to 58a in FIG. 30L), and the process of partially etching the sacrificial patterns 25 may be performed using an etching apparatus. Also, the dielectric material 62 (refer to 62 in FIG. 30M) may be formed using a deposition apparatus, such as an ALD apparatus. Furthermore, the conductive layer (refer to FIG. 30N) may be formed using a deposition apparatus, such as a CVD apparatus. In addition, the process of etching the conductive layer (refer to 66 in FIG. 30N) to form the conductive patterns 66a may be performed using an etching apparatus.

After forming the vacant regions (refer to 58 in FIG. 30K) and the expanded vacant regions (refer to 58a in FIG. 30L) using the etching apparatus, a substrate (i.e., semiconductor wafer) having the vacant regions (refer to 58 in FIG. 30K) and the expanded vacant regions (refer to 58a in FIG. 30L) may be transferred to the ALD apparatus configured to form the dielectric material (refer to 62 in FIG. 30M).

In addition, after forming the dielectric material (refer to 62 in FIG. 30M), the substrate (i.e., semiconductor wafer) having the dielectric material may be transferred from the ALD apparatus to the CVD apparatus configured to form the conductive layer (refer to FIG. 30N).

Furthermore, the substrate (i.e., semiconductor wafer) having the conductive layer (refer to 66 in FIG. 30N) may be transferred to the etching apparatus configured to etch the conductive layer (refer to 66 in FIG. 30N).

The support patterns 25 may prevent the interlayer insulating patterns 6a, particularly, the middle interlayer insulating patterns 6aM, from having failures (e.g., cracks) or being damaged during the above-described semiconductor processes and a process of transferring the semiconductor wafer to enable the semiconductor processes. Also, the vertical structures 50 may prevent failures (e.g., cracks) from occurring in the vertical structures 50 due to the middle interlayer insulating patterns 6aM that may be prevented from being deformed by the support patterns 25. That is, the support patterns 25 may be in contact with one side surfaces of the middle interlayer insulating patterns 6aM and prevent deformation of or damage to the middle interlayer insulating patterns 6aM. Since the middle interlayer insulating patterns 6aM are not deformed or damaged, the occurrence of defects, such as cracks, in the vertical structures 50 may be prevented.

Figure 30P:
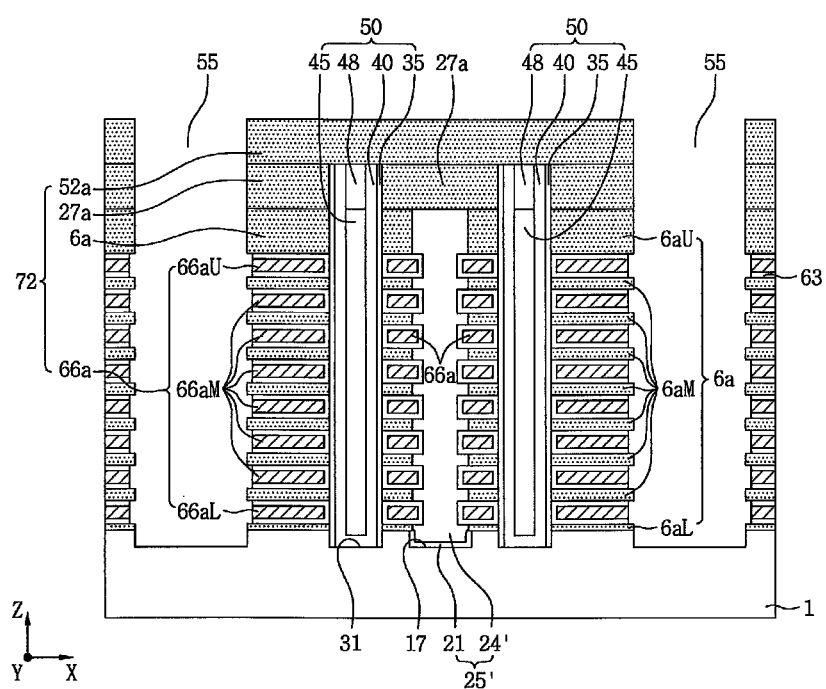

Referring to FIG. 30P, the dielectric material 62 may be partially etched to form second dielectric patterns 63. The second dielectric patterns 63 may be interposed between the conductive patterns 66a and the vertical structures 50, extend between the conductive patterns 66a and the interlayer insulating patterns 6a, and extend between the conductive patterns 66a and the support patterns 25'.

Figure 30Q:
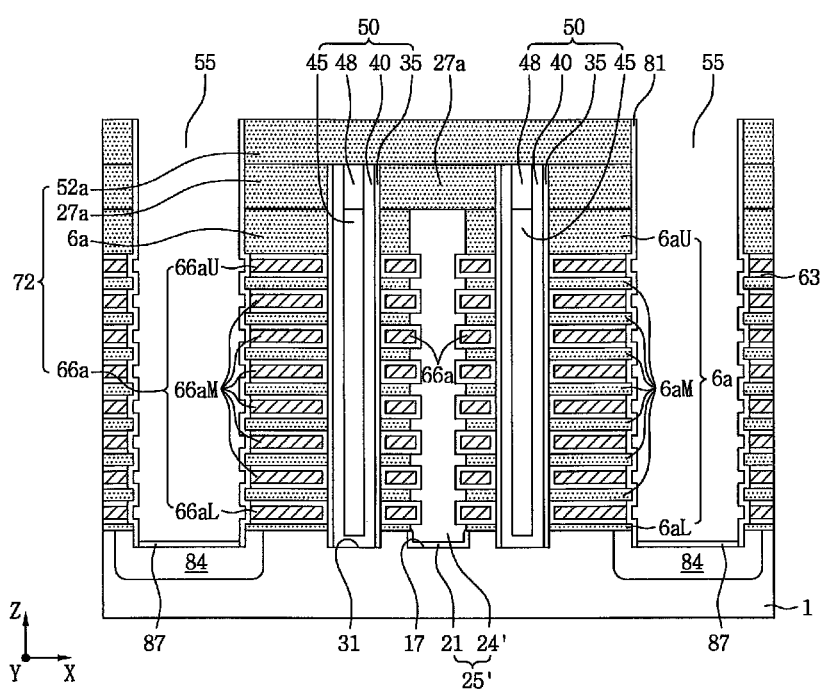

Referring to FIG. 30Q, a spacer layer may be formed on the substrate 1 having the second dielectric patterns 63. The spacer layer may be formed of an insulating material layer, such as silicon oxide or silicon nitride.

Thereafter, an ion implantation process may be performed on the substrate 1 having the spacer layer so that impurity regions 84 can be formed in the substrate 1 having the spacer layer under bottom surfaces of the second openings 25. The impurity regions 84 may have a different conductivity type from the substrate 1. For instance, the impurity regions 84 may have an N conductivity type, while the substrate 1 disposed adjacent to the impurity regions 84 may have a P conductivity type.

The impurity regions 84 may be used as common source lines in a non-volatile memory device, such as a flash memory device.

The spacer layer may be etched, thereby forming insulating spacers 81 remaining on sidewalls of the second openings 55. Accordingly, the impurity regions 84 may be exposed under the second openings 55.

Thereafter, a metal-semiconductor compound 87 may be formed on the exposed impurity regions 84 using a silicide process. The metal-semiconductor compound 87 may be a metal silicide, such as cobalt silicide, titanium silicide, or nickel silicide.

Figure 30R:
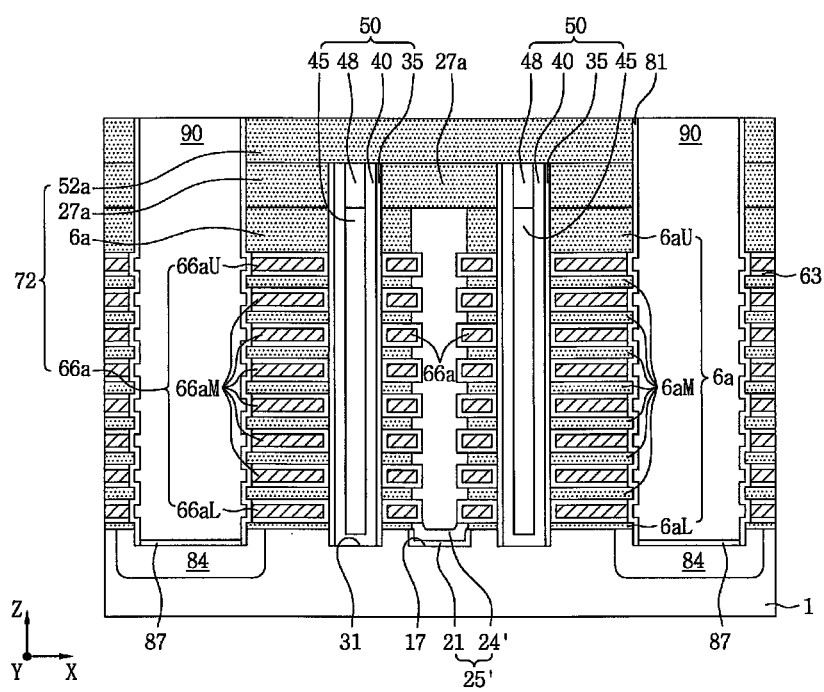

Referring to FIGS. 29 and 30R, isolation patterns 90 may be formed on the substrate 1 having the metal-semiconductor compound 87 to fill the second openings 55 (operation S55). The formation of the isolation patterns 90 may include forming an insulating material layer on the substrate 1 having the metal-semiconductor compound 87, and planarizing the insulating material layer until the second capping pattern 52a is exposed. Each of the isolation patterns 90 may have a greater width than each of the support patterns 25.

Each of the isolation patterns 90 may have a first portion having a first width, and a second portion having a second width greater than the first width. In each of the isolation patterns 90, the second portion having a relatively great width may be disposed at substantially the same level as the conductive patterns 66a, and the first portion having a relatively small width may be disposed at substantially the same level as the interlayer insulating patterns 6a, the first capping patterns 27a, and the second capping patterns 52a.

Thereafter, as shown in FIG. 2A, contact plugs 93 may be formed to penetrate the second capping patterns 52 and electrically connected to the vertical structures 50, and conductive lines 96 may be formed on the second capping patterns 52 and electrically connected to the contact plugs 93 (refer to S60 in FIG. 29). The conductive lines 96 may be formed to a smaller width than the vertical structures 50. The contact plugs 93 may be formed of a metal, such as tungsten, copper, or aluminum, and the conductive lines 96 may be formed of a metal, such as tungsten, copper, or aluminum. The conductive lines 96 may be used as bit lines for a non-volatile memory device, such as a flash memory.

Meanwhile, when the process of forming the first capping layer 27 described with reference to FIG. 30D is omitted and a semiconductor process is performed, the semiconductor device shown in FIG. 26 may be formed.

Next, a method of fabricating the semiconductor device according to the modified example of the first embodiment, which is described with reference to FIG. 3A, will be described with reference to FIGS. 31A through 31C. Hereinafter, modified portions will be chiefly described.

Figure 31A:
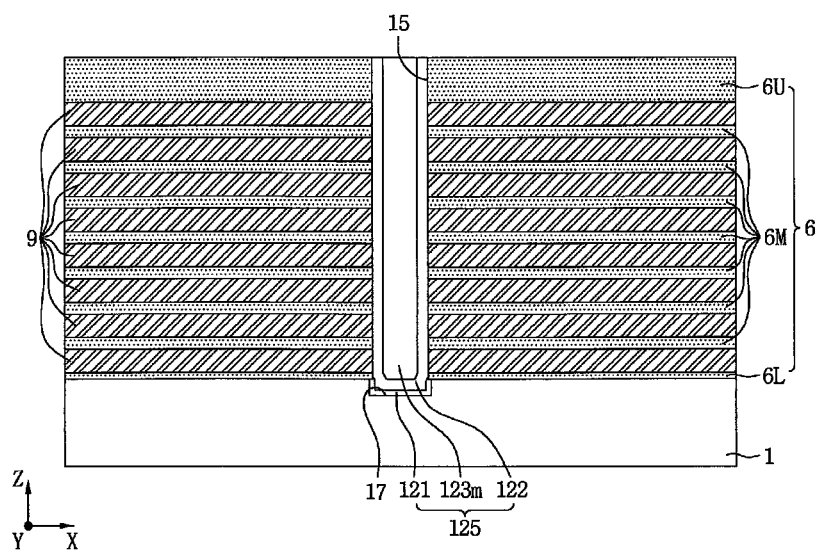
FIGS. 31A through 31C are cross-sectional views illustrating a method of fabricating a semiconductor device according to a modified example of the first embodiment of the inventive concept.
Figure 31B:
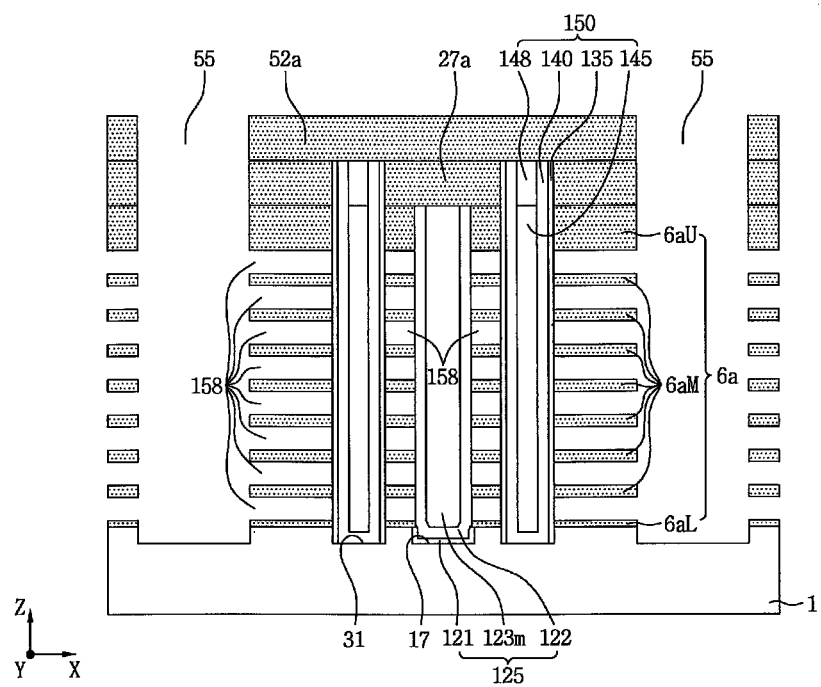

Referring to FIG. 31A, the semiconductor device as described with reference to FIGS. 30A and 30B may be provided. That is, a substrate 1 having the first openings 15 described with reference to FIG. 30B may be prepared. Thereafter, modified support patterns 125 of the support patterns 25 of FIG. 30C may be disposed within the first openings 15. For example, the formation of the support patterns 125 may include forming an insulating oxide 121 on the substrate 1 exposed by the first openings 15, conformally forming a first support layer on the substrate 1 having the insulating oxide 12, forming a second support layer on the first support layer to fill the first openings 15, and forming a first support pattern 122 and a second support pattern 123m by planarizing the first support layer and the second support layer until the uppermost interlayer insulating layer 6U is exposed.

For example, the formation of the support patterns 125 may include forming an insulating oxide 121 on the substrate 1 exposed by the first openings 15, conformally forming a first support layer on the substrate 1 having the insulating oxide 12, forming a second support layer on the first support layer to fill the first openings 15, and forming a first support pattern 122 and a second support pattern 123m by planarizing the first and second support layers until the uppermost interlayer insulating layer 6U is exposed.

The second support pattern 123m may penetrate the sacrificial layers 9 and the interlayer insulating layers 6, and the first support pattern 122 may be interposed between the second support pattern 123m and the insulating oxide 121 and extend onto side surfaces of the second support pattern 123m.

Thereafter, referring to FIG. 31B, methods described with reference to FIGS. 30D through 30K may be performed. That is, as described with reference to FIGS. 30D through 30I, a first capping layer 27 may be formed to cover the support patterns 25, and vertical structures 150 may be formed to penetrate the first capping layer 27, the interlayer insulating layers 6, and the sacrificial layers 9. A second capping layer 52 may be formed on the first capping layer 27 to cover the vertical structures 150. Thereafter, referring to FIG. 30J, the second capping layer 52, the first capping layer 27, and the horizontal layers 6 and 9 may be patterned, thereby forming second openings 55. In this case, as described with reference to FIG. 27J, first and second capping patterns 27a and 52a, interlayer insulating patterns 6a, and sacrificial patterns 9a may be formed.

Subsequently, as shown in FIG. 30K, the sacrificial patterns 9a may be selectively removed to form vacant regions 158. Portions of side surfaces of the vertical structures 150 and portions of side surfaces of the support patterns 125 may be exposed.

Figure 31C:
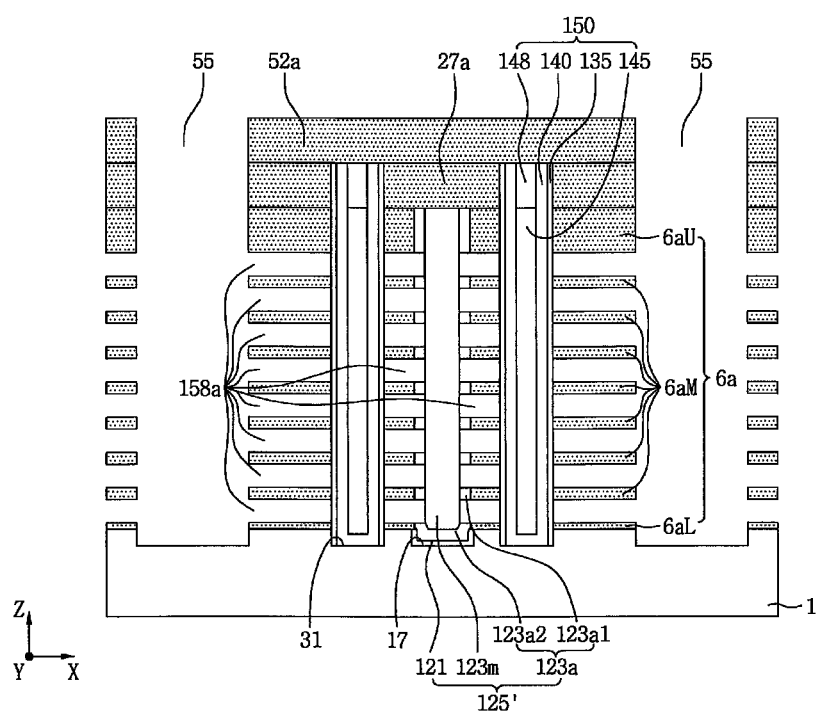

Referring to FIG. 31C, the exposed first support patterns (refer to 122 in FIG. 28B) of the support patterns 125 may be selectively etched. That is, the first support patterns (refer to 122 in FIG. 28B) may be formed of a material having an etch selectivity with respect to the first dielectric patterns 135 and the second support patterns 123m of the vertical structures 150. For instance, when the first dielectric patterns 135 of the vertical structures 150 may be formed of a dielectric material and the second support patterns 123m are formed of an insulating material, such as silicon oxide or silicon nitride, the first support patterns (refer to 122 in FIG. 28B) may be formed of a-Si or crystalline silicon. Accordingly, the support patterns 125 may be modified into support patterns 125' having non-vertical side surfaces, namely, rough side surfaces, and the vacant regions 158 may be modified into expanded vacant regions 158a. The first support pattern 122 may be etched to form subsidiary support patterns 123a, while the second support pattern 123m may remain and be defined as a main support pattern 123m. Accordingly, as described with reference to FIG. 3A, the support patterns 125' may include an insulating oxide 121, main support patterns 123m, and subsidiary support patterns 123a.

Afterwards, the same process as described with reference to FIGS. 30M through 30R may be performed. As a result, the semiconductor device described with reference to FIG. 3A may be formed.

Next, a method of fabricating the semiconductor device according to another modified example of the first embodiment, which is described with reference to FIG. 4A, will be described with reference to FIGS. 32A and 32B. Hereinafter, modified portions will be chiefly described.

Figure 32A:
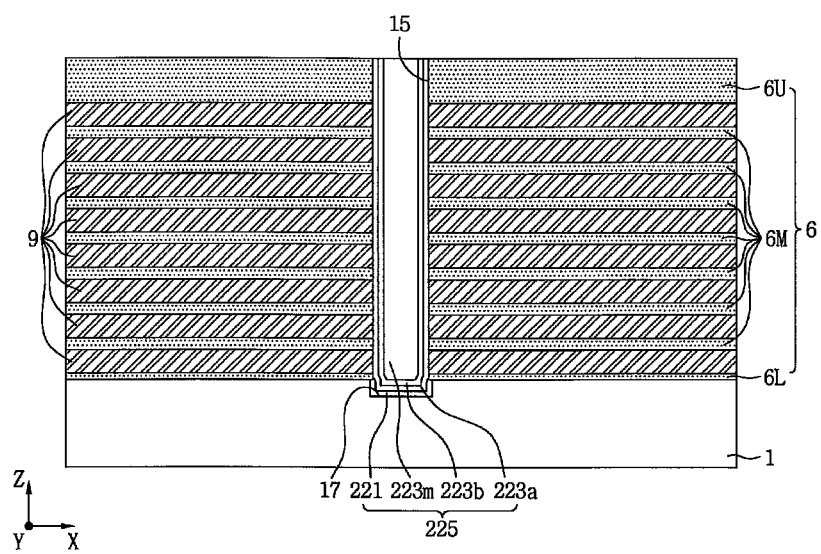
FIGS. 32A and 32B are cross-sectional views illustrating a method of fabricating a semiconductor device according to another modified example of the first embodiment of the inventive concept.

Referring to FIG. 32A, modified support patterns 225 of the support patterns 125 described with reference to FIG. 31A may be formed. For example, first openings 15 may be formed to penetrate the horizontal layers 6 and 9, and support patterns 225 may be formed to fill the first openings 15. Here, the formation of the support patterns 225 may include sequentially conformally forming first support patterns 223a and second support patterns 223b, and forming third support patterns 223m on the second support patterns 223b to fill the first openings 15. Furthermore, before forming the first support patterns 225a, the formation of the support patterns 225 may further include forming an insulating oxide 221 by oxidizing the substrate 1 exposed by the first openings 15.

Figure 32B:
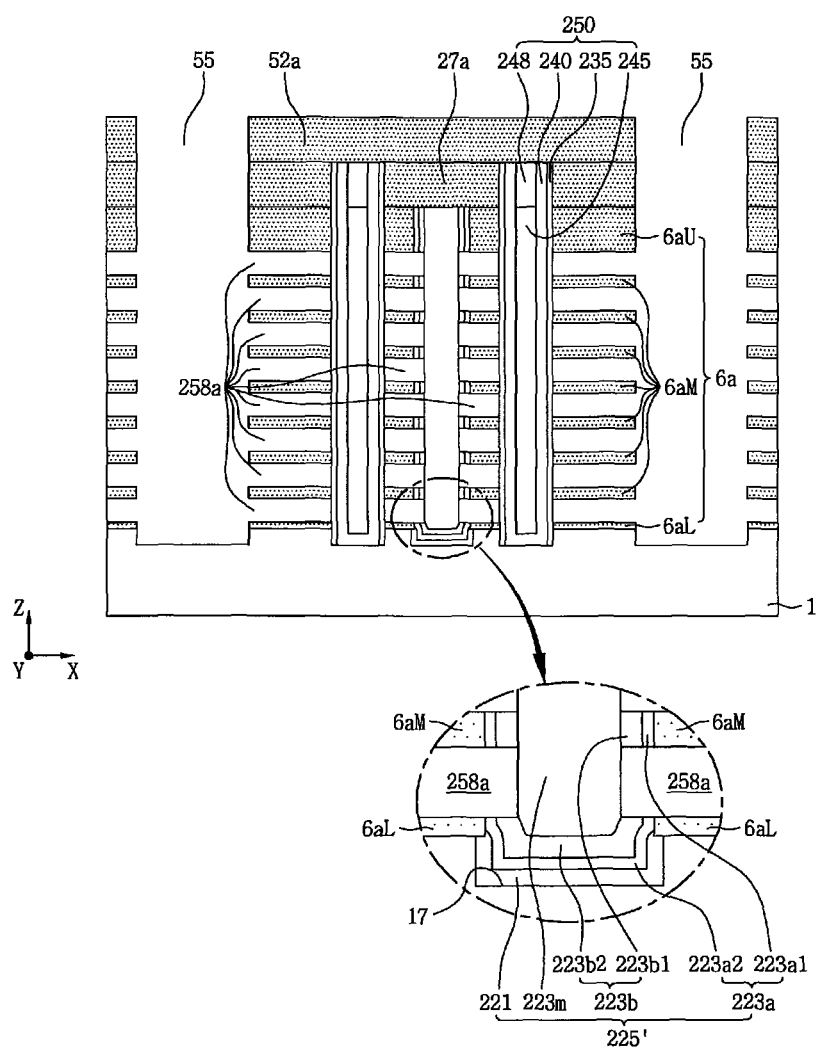

Referring to FIG. 32B, vacant regions described with reference to FIG. 31B may be formed. That is, the vacant regions may expose portions of lateral surfaces of the support patterns 225.

The first support patterns 223a and the second support patterns 223b may be formed of materials having an etch selectivity with respect to first dielectric patterns 235 and the third support patterns 223m of the vertical structures 250. The first support patterns 222a may be formed of a material having an etch selectivity with respect to the second support patterns 223b. For example, portions of the first dielectric patterns 235 of the vertical structures 250 exposed by the vacant regions may include silicon oxide. The first support patterns 223a may be formed of a-Si or crystalline silicon, the second support patterns 223b may be formed of silicon nitride, and the third support patterns 223m may be formed of silicon oxide, a-Si, or crystalline silicon. Here, the crystalline silicon may be poly-Si.

Accordingly, among the support patterns 125, the first support patterns 223a and the second support patterns 223b exposed by the vacant regions may be sequentially selectively etched. As a result, the support patterns 225 may be modified into support patterns 225' having non-vertical side surfaces, and the vacant regions may be modified into expanded vacant regions 258a.

The first support patterns 223a may be etched to form first subsidiary support patterns 223a1, and the second support patterns 223b may be etched to form second subsidiary support patterns 223b1. The third support patterns 223m may remain and be defined as main support patterns 223m. Accordingly, as described with reference to FIG. 4A, the support patterns 225' may include an insulating oxide 221, main support patterns 223m and subsidiary support patterns 223a and 223b.

Thereafter, the same process as described with reference to FIGS. 30M through 30R may be performed. As a result, a semiconductor device described with reference to FIG. 4A may be formed.

Next, a method of fabricating the semiconductor device according to another modified example of the first embodiment, which is described with reference to FIG. 5A, will be described with reference to FIGS. 33A through 33C. Hereinafter, modified portions of the previous embodiments will be chiefly described.

Figure 33A:
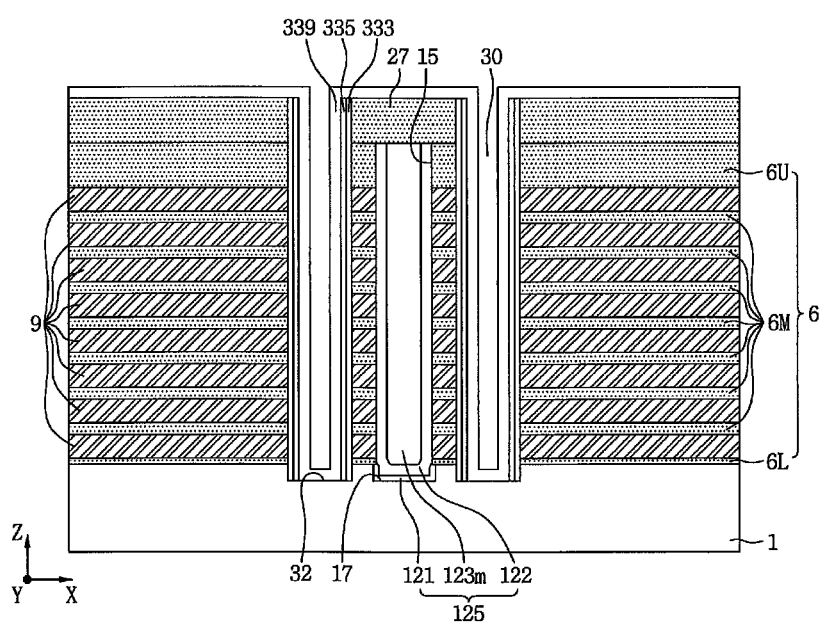
FIGS. 33A through 33C are cross-sectional views illustrating a method of fabricating a semiconductor device according to another modified example of the first embodiment of the inventive concept.

Referring to FIG. 33A, as described in the previous embodiments, horizontal layers 6 and 9 may be formed on a substrate 1, and support patterns 125 may be formed to penetrate the horizontal layers 6 and 9. For example, first openings 15 may be formed to penetrate the horizontal layers 6 and 9, and support patterns 125 may be formed to fill the first openings 15. Here, the formation of the support patterns 125 may include forming an insulating oxide 121 by oxidizing the substrate 1 exposed by the first openings 15, conformally forming first support patterns 122 on the substrate 1 having the insulating oxide 121, and forming second support patterns 123m on the first support patterns 122 to fill the first openings 15. Accordingly, support patterns 125 having substantially the same shape as in FIG. 31A may be formed.

In other embodiments, the support patterns 125 may have the same shape as the support patterns 25 of FIG. 27C, or have the same shape as the support patterns 225 of FIG. 32A.

Thereafter, a first capping layer 27 may be formed to cover the support patterns 125, and holes 30 may be formed to penetrate the first capping layer 21 and the horizontal layers 6 and 9 and expose the substrate 1.

A protection layer 333 and first dielectric pattern 335 may be sequentially formed on sidewalls of the holes 30. The protection dielectric layer 333 may be interposed between the first dielectric pattern 335 and sidewalls of the holes 30. The protection dielectric layer 333 may be formed of an insulating material, such as silicon oxide, silicon oxynitride (SiON), or silicon nitride.

Thereafter, an active layer 339 may be conformally formed on the substrate 1 having the first dielectric pattern 335. In this case, the active layer 339 may be formed as an open type not to completely fill the holes 30.

Figure 33B:
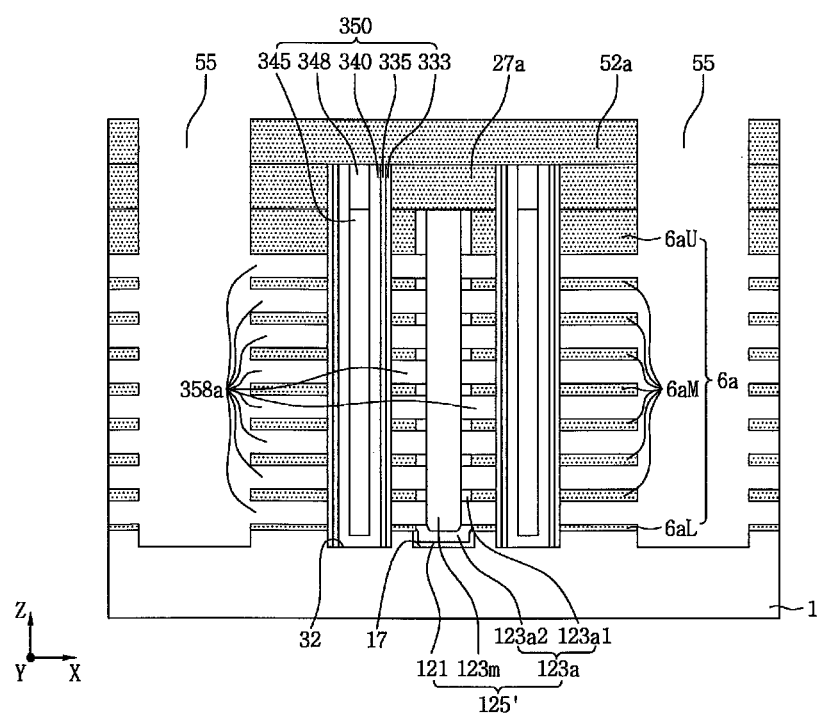

Referring to FIG. 33B, vertical structures 350 may be formed on the substrate 1 having the active layer 340 using substantially the same method as described with reference to FIGS. 30F through 30H. Thereafter, as described with reference to FIGS. 30I and 30J, a second capping layer may be formed to cover the vertical structures 350, and second openings 55 may be formed to penetrate the second capping layer, the first capping layer 27, and the horizontal layers 6 and 9. Thereafter, as described with reference to FIGS. 30K and 30I, sacrificial patterns exposed by the second openings 55 may be removed to form vacant regions, and the support patterns 125 exposed by the vacant regions may be partially etched to form expanded vacant regions 358a.

Meanwhile, the protection dielectric layer 333 may be formed of a material different etch selectivity rate from etched portions of the support patterns 125. The protection dielectric layer 333 may be formed of a material different from a material of the etched portions of the support patterns 125. For example, when the first support patterns 123a of the support patterns 125 are formed of a-Si or crystalline silicon, the protection dielectric layer 333 may be formed of an insulating material (e.g., silicon oxide, nitrogen (N)-doped silicon oxide, or silicon nitride). Accordingly, during the etching process for forming the vacant regions and the expanded vacant regions 358a, the protection dielectric layer 333 may prevent the first dielectric pattern 335 from being damaged by the etching process.

Figure 33C:
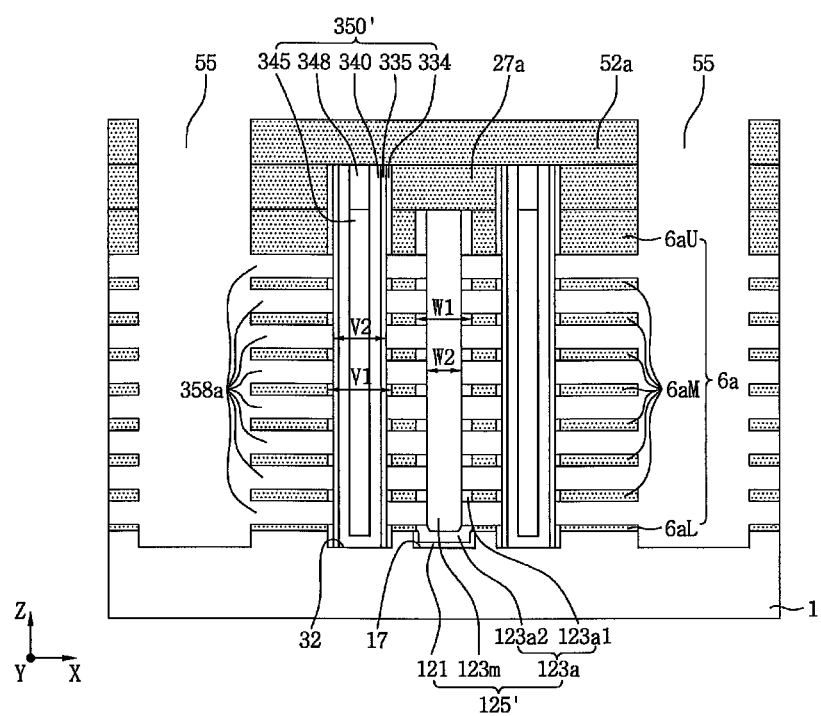

Referring to FIG. 33C, the protection layer 333 exposed by the expanded vacant regions 358a may be etched to form protection dielectric patterns 334. The protection dielectric patterns 334 may remain between the first dielectric patterns 335 and the interlayer insulating patterns 6, and remain between the first capping pattern 27a and the first dielectric patterns 335. Thereafter, substantially the same process as described with reference to FIGS. 30M through 30R may be performed to form a semiconductor device shown in FIG. 5A.

Next, a method of fabricating the semiconductor device according to another modified example of the first embodiment of the inventive concept, which is described with reference to FIG. 6, will be described with reference to FIG. 34. Hereinafter, modified portions of the previous embodiments will be chiefly described.

Figure 34:
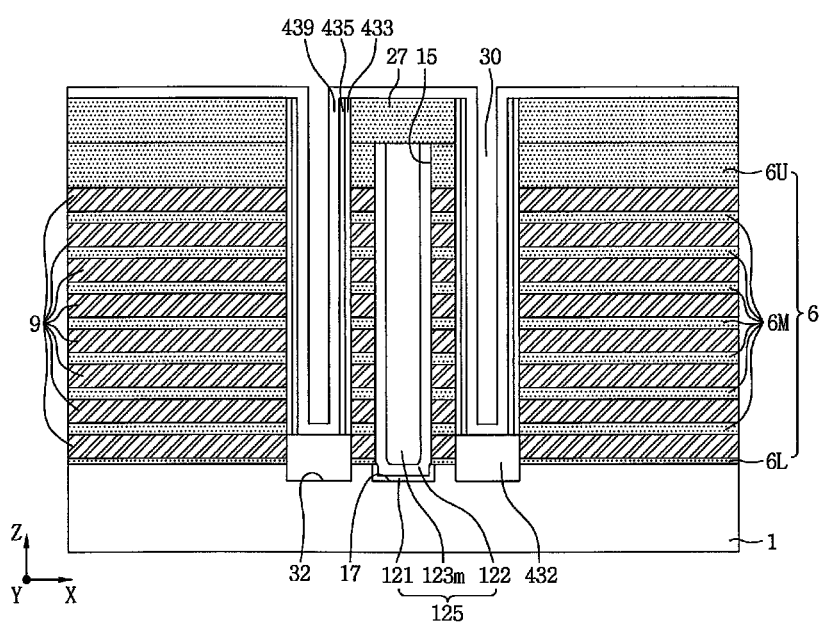
FIG. 34 is a cross-sectional view illustrating a method of fabricating a semiconductor device according to another modified example of the first embodiment of the inventive concept.

Referring to FIG. 34, a substrate 1 in which holes 30 are formed to penetrate the horizontal layers 6 and 9, may be provided as shown in FIG. 30D. Thereafter, a first active pattern 432 may be formed on the substrate 1 exposed by the holes 30. The first active pattern 432 may be formed by means of a selective epitaxial growth (SEG) process using the substrate 1 exposed by the holes 30 as a seed layer. Accordingly, the first active pattern 432 may be formed of single crystalline silicon. The first active pattern 432 may be formed as a pillar type. Accordingly, the first active pattern 432 may fill lower regions of the holes 30.

Thereafter, within the holes 30, first dielectric patterns 435 may be formed on the remaining sidewalls of the holes 30, which are not filled with the first active pattern 432. Meanwhile, before forming the first dielectric patterns 433, a protection dielectric layer 433 may be formed on the remaining sidewalls of the holes 30, which are not filled with the first active pattern 432. The subsidiary dielectric layer 433 and the first dielectric patterns 435 may be formed of substantially the same materials as the protection dielectric layer 333 and the first dielectric patterns 335 described with reference to FIG. 33.

Thereafter, an active layer 439 may be formed on the substrate 1 having the first dielectric patterns 435 as described with reference to FIG. 33A. Accordingly, a semiconductor device having a similar shape to that described with reference to FIG. 33A may be formed. Subsequently, substantially the same process as described with reference to FIGS. 33B and 33C may be performed. In this case, an outermost portion 122 of the support pattern 125 may be formed of a material having a different etch selectivity with respect to the first active pattern 432. For example, the first support pattern 122 may be formed of poly-Si, while the first active pattern 432 may be formed of single crystalline silicon.

Next, a method of fabricating the semiconductor device according to the second embodiment and modified examples thereof, which is described with reference to FIGS. 7A through 7E, will be described with reference to FIGS. 35A through 35D. Hereinafter, modified portions of the previous embodiments will be chiefly described.

Figure 35A:
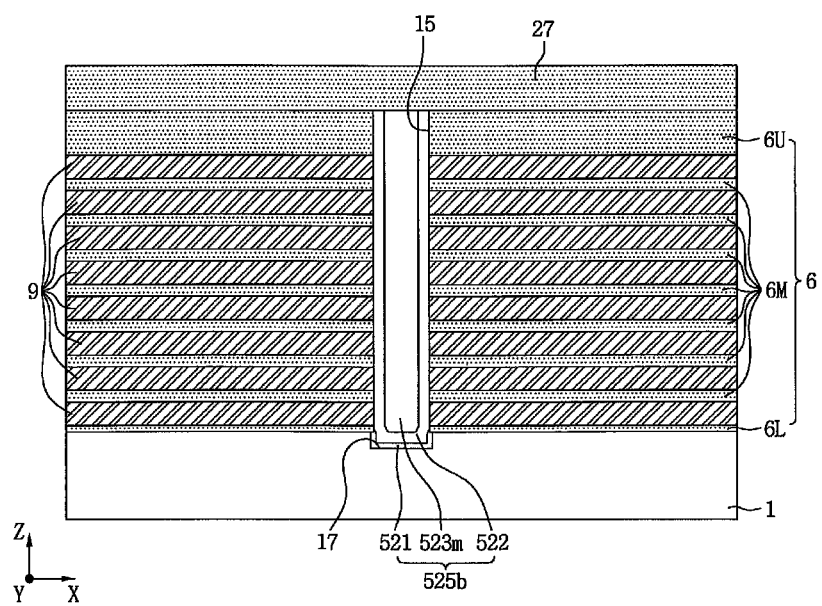
FIGS. 35A through 35D are cross-sectional views illustrating a method of fabricating a semiconductor device according to the second embodiment of the inventive concept and modified examples thereof.

Referring to FIG. 35A, as described with reference to FIG. 30A, horizontal layers 6 and 9 may be formed on a substrate 1. Support patterns 525b may be formed within the first openings 15 to penetrate the horizontal layers 6 and 9. The support patterns 525b may have the same shape as in FIG. 32A. That is, the support patterns 525b may include an oxide 521 formed by oxidizing the substrate 1 exposed by the first openings 15, first support patterns 522 formed on the oxide 521 and conformally formed on inner walls of the first openings 15, and second support patterns 523m filling the remaining portions of the first openings 15. However, the inventive concept is not limited thereto, and the support patterns 525b may have the same shape as the support patterns 25 of FIG. 30C or the same shape as the support patterns 225 of FIG. 32A. A first capping layer 27 may be formed on the substrate 1 having the support patterns 525.

Figure 35B:
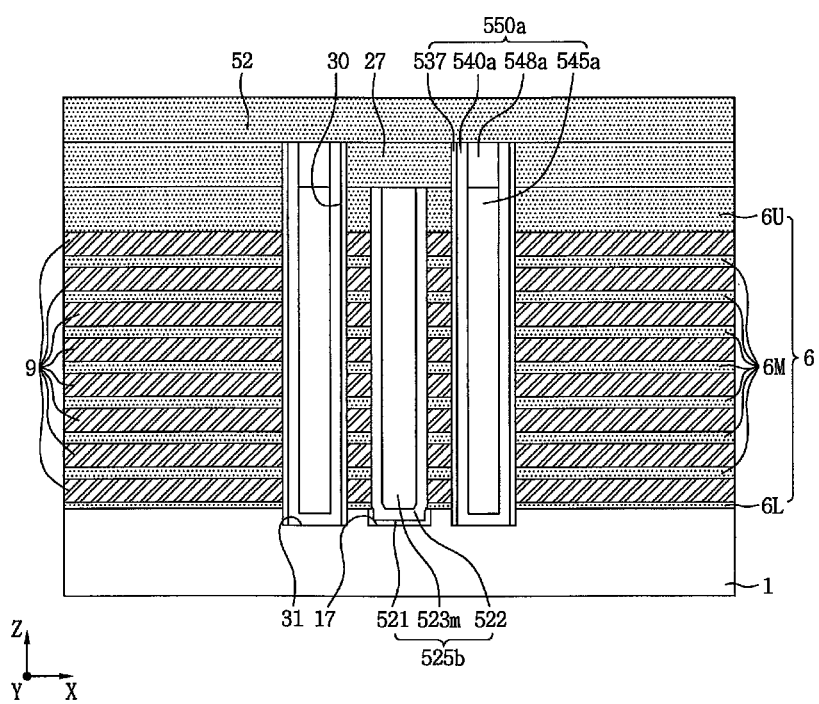

Referring to FIG. 35B, vertical structures 550a may be formed within the holes 30 penetrating the first capping layer 27 and the horizontal layers 6 and 9. Each of the vertical structures 550a may include a gap filling pattern 545a configured to penetrate the first capping layer 27 and the horizontal layers 6 and 9, a pad pattern 548a disposed on the gap filling pattern 545a, and an active pattern 540a covering bottom and side surfaces of the gap filling pattern 545a and extending onto side surfaces of the pad pattern 548a.

In a modified example, before forming the active pattern 540a, the formation of the vertical structures 550a may further include forming a protection dielectric layer 537 on sidewalls of the holes 30. Since a process of forming the vertical structures 550a is substantially the same as described with reference to FIGS. 30E through 30H, a detailed description thereof will be omitted here. Meanwhile, the protection dielectric layer 537 may be formed instead of the first dielectric patterns 35 of FIG. 30E. Thereafter, a second capping layer 52 may be formed on the substrate 1 having the vertical structures 550a.

Figure 35C:
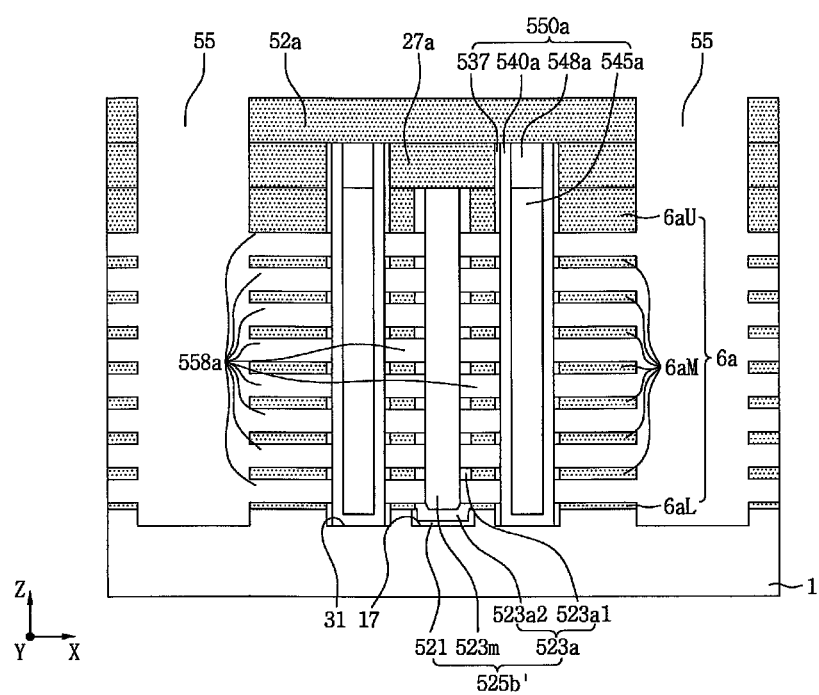

Referring to FIG. 35C, as shown in FIG. 30J, second openings 55 may be formed in the substrate 1 having the second capping layer 52a to penetrate the first and second capping patterns 27a and 52a and the horizontal layers 6 and 9. Thereafter, as described with reference to FIG. 30K, the sacrificial patterns (refer to 9a in FIG. 30J) exposed by the second openings 55 may be selectively removed to form vacant regions. Subsequently, the first and second support patterns 523a1 and 523a2 of the support patterns 525b' may be sequentially etched to expose the third support patterns 523m, thereby forming expanded vacant regions 558a. In this case, the third support patterns 523m may be defined as main support patterns 523m, and the remaining support patterns 523a may be defined as first and second subsidiary support patterns 523a1 and 523a2. In this case, the protection dielectric layer (refer to 537 in FIG. 35B) may prevent the active pattern 540a from being damaged due to an etching process for forming the expanded vacant regions 558a.

Figure 35D:
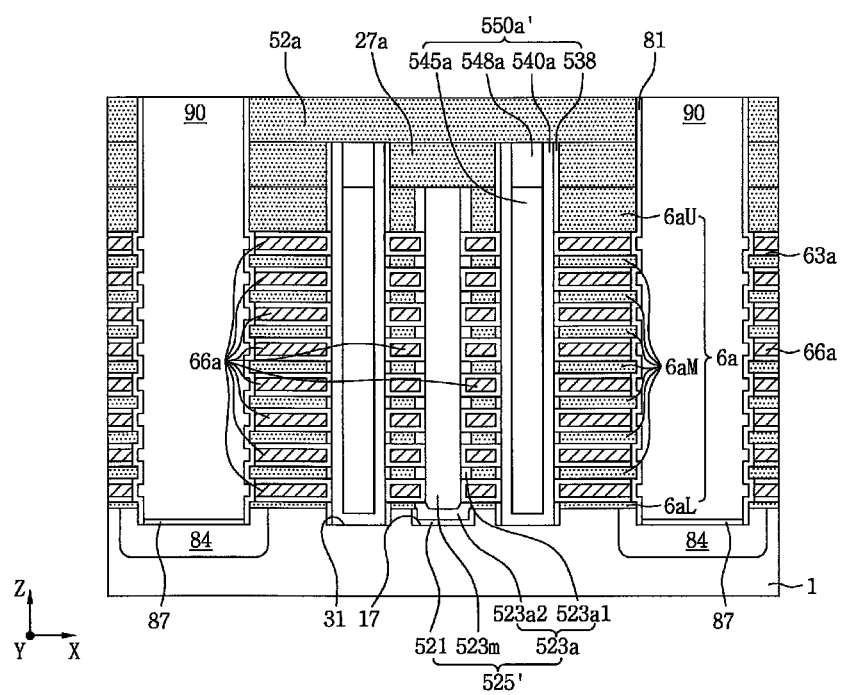

Thereafter, the protection dielectric layer 537 may be etched to expose active patterns 540a, thereby forming protection dielectric patterns 538, as illustrated in FIG. 35D. Referring to FIG. 35D, the protection dielectric patterns 538 may be interposed between the active patterns 540a and the interlayer insulating patterns 6a, and interposed between the active patterns 540a and first capping patterns 27a. Accordingly, vertical structures 550a' including the protection dielectric patterns 538 may be provided.

Further referring to FIG. 35D, dielectric patterns 63a and conductive patterns 66a may be formed to fill the expanded vacant regions (refer to 558a in FIG. 35C). The dielectric patterns 563 may be interposed between the vertical structures 550a' and the conductive patterns 66a, extend between the interlayer insulating patterns 6a and the conductive patterns 66a, and extend between the conductive patterns 66a and the support patterns 525'. The dielectric patterns 63a may be modified into the dielectric patterns described with reference to FIG. 7B. Afterwards, substantially the same process as described with reference to FIGS. 30Q and 30R may be performed so that impurity regions 84 can be formed in the substrate 1 under the second openings 55, insulating spacers 81 can be formed on sidewalls of the second openings 55, and metal-semiconductor compounds 87 can be formed on the impurity regions 84, and isolation patterns 90 can be formed to fill the second openings 55.

Figure 36A:
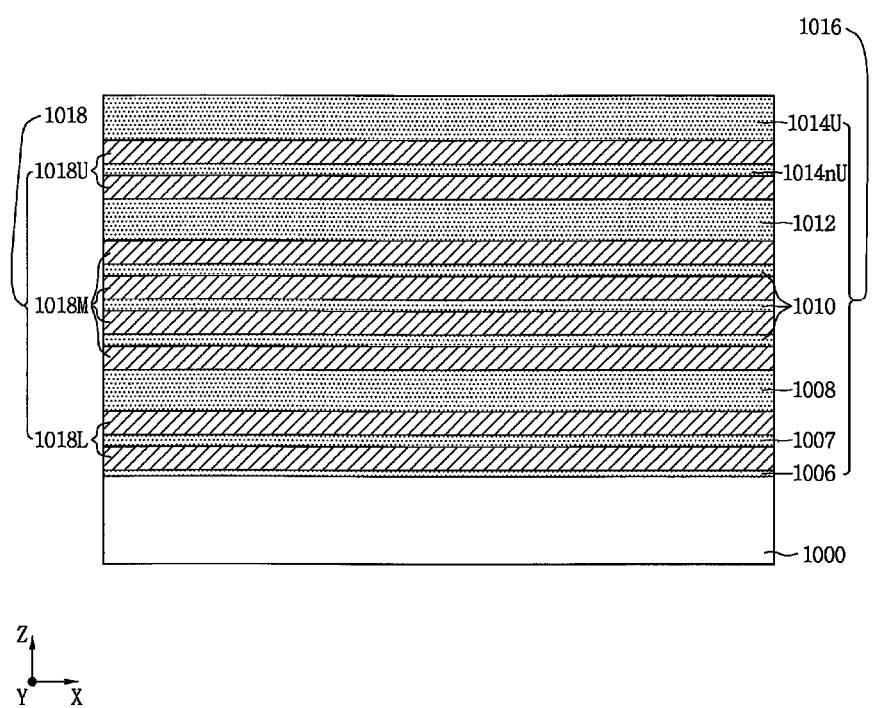
FIGS. 36A through 36H are cross-sectional views illustrating a method of fabricating a semiconductor device according to the third embodiment of the inventive concept and modified examples thereof.

Next, a method of fabricating the semiconductor device according to the third embodiment of the inventive concept, which is described with reference to FIG. 10, will be described with reference to FIGS. 36A through 36I. Referring to FIG. 36A, a substrate 1000 of FIG. 2A may be provided. Horizontal layers 1016 and 1018 may be formed on the substrate 1. The horizontal layers 1016 and 1018 may include a plurality of interlayer insulating layers 1016 and a plurality of sacrificial layers 1018 alternately and repetitively stacked on the substrate 1.

The sacrificial layers 1018 may include at least one lower sacrificial layer 1018L, a plurality of middle sacrificial layers 1018M, and at least one upper sacrificial layer 1018U. The middle sacrificial layers 1018M may be disposed at a higher level than the at least one lower sacrificial layer 1018L, and the at least one upper sacrificial layer 1018U may be disposed at a higher level than the middle sacrificial layers 1018M.

The interlayer insulating layers 1016 may include a lowermost insulating layer 1006 interposed between the at least one lower sacrificial layer 1018L and the substrate 1000, a lower interlayer layer 1007 interposed between the at least one lower sacrificial layers 1018L, a lower insulating layer 1008 interposed between the at least one lower sacrificial layers 1018L and the middle sacrificial layers 1018M, middle interlayer layers 1010 interposed between the middle sacrificial layers 1018M, an upper insulating layer 1012 interposed between the middle sacrificial layers 1018M and the at least one upper sacrificial layer 1018U, and an upper interlayer layer 1014nU interposed between the at least one upper sacrificial layers 1018U, and an uppermost insulating layer 1014U disposed on the at least one upper sacrificial layer 1018U.

Figure 36B:
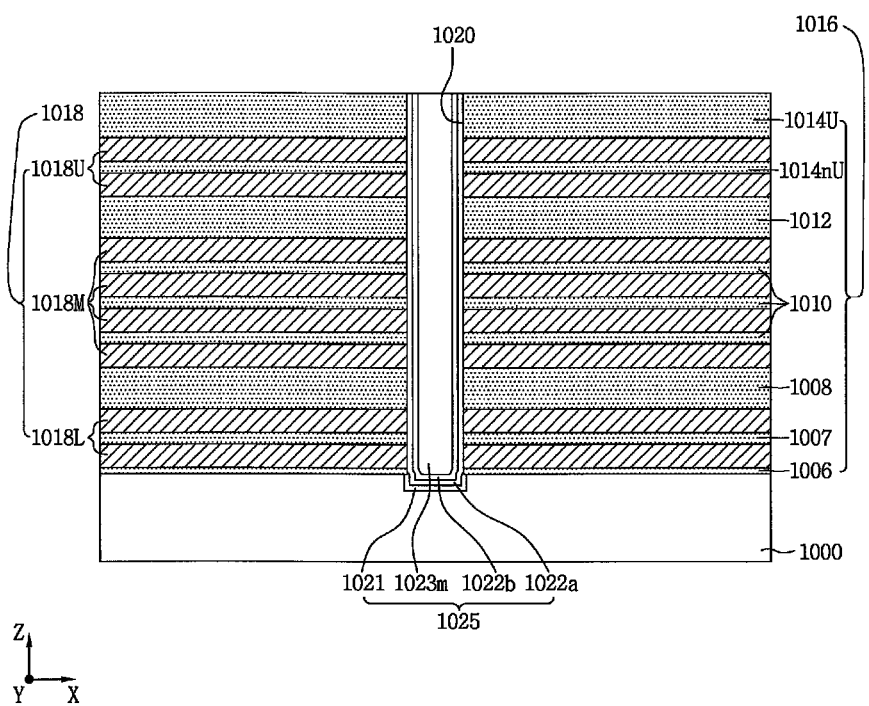

Referring to FIG. 36B, support patterns 1025 may be formed within first openings 1020 to penetrate the horizontal layers 1016 and 1018.

Each of the support patterns 1025 may have the same shape as in FIG. 32A. That is, each of the support patterns 1025 may include an oxide 1021 formed by oxidizing the substrate 1000 exposed by the corresponding one of the first openings 1020, a first support pattern 1022a and a second support pattern 1022b disposed on the oxide 1021 and sequentially conformally formed on an inner wall of the corresponding one of the first openings 1020, and a third support pattern 1023m filling the remaining portion of the corresponding one of the first openings 1020. However, the inventive concept is not limited thereto, and the support patterns 1025 may have the same shape as in FIG. 30C or the same shape as in FIG. 31A.

Figure 36C:
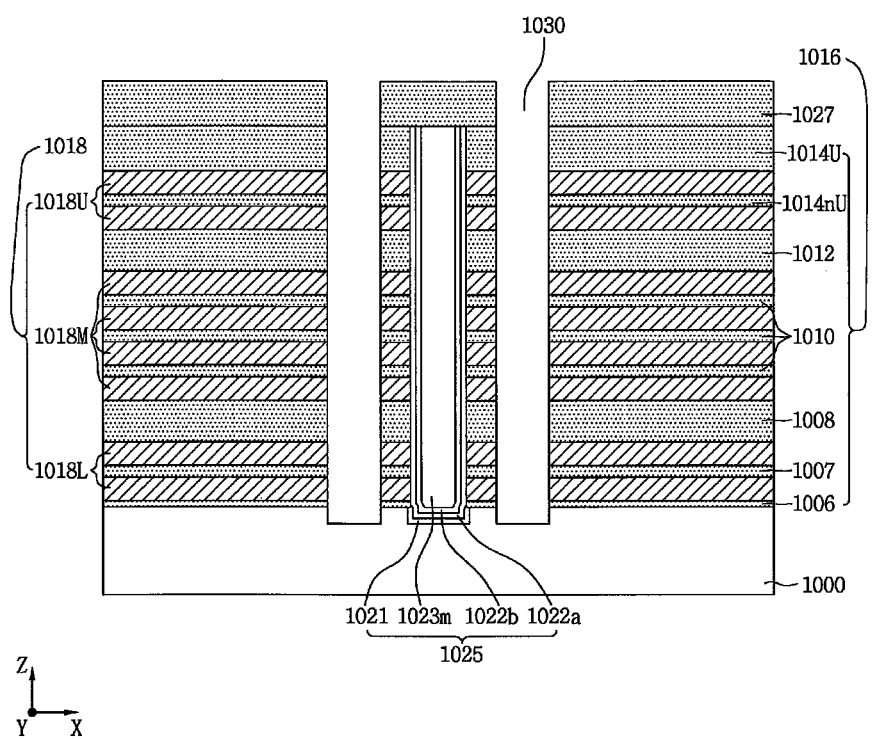

Referring to FIG. 36C, a first capping layer 1027 may be formed on the substrate 1000 having the support patterns 1025. Thereafter, holes 1030 may be formed to penetrate the first capping layer 1027 and the horizontal layers 1016 and 1018. Meanwhile, to form the same semiconductor device as in FIG. 27, the formation of the first capping layer 1027 may be omitted.

Figure 36D:
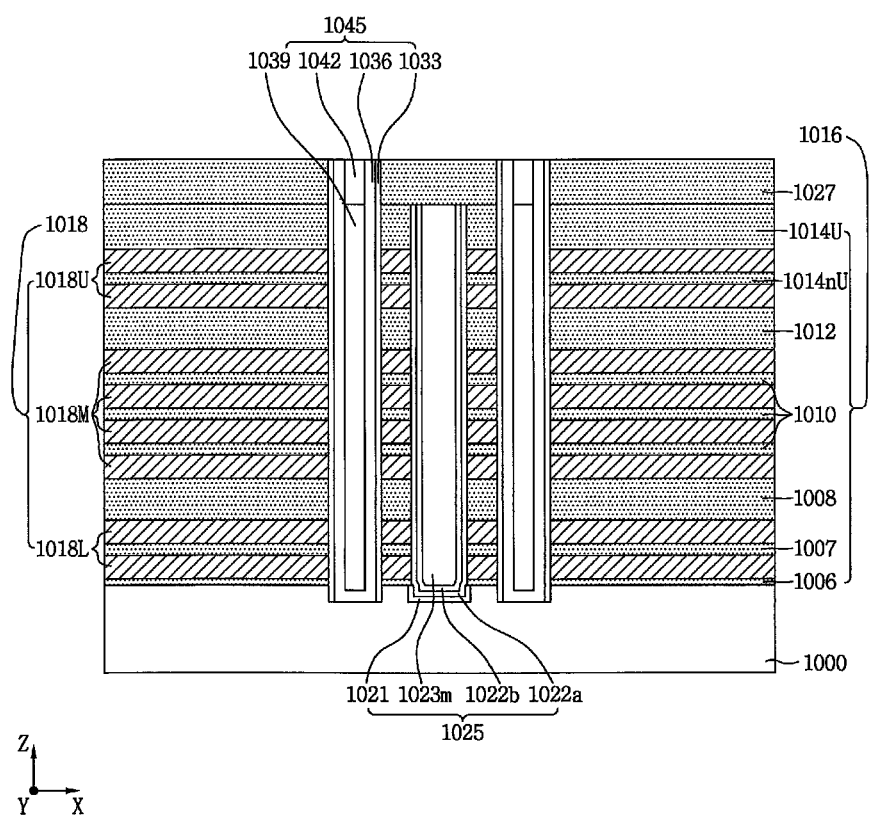

Referring to FIG. 36D, vertical structures 1045 may be formed within the holes 1030. The vertical structures 1045 may be formed using substantially the same method as the method of forming the vertical structures 50 described with reference to FIGS. 30D through 30H. As a result, as described with reference to FIG. 30H, each of the vertical structures 1045 may include a first dielectric pattern 1033 formed on sidewalls of the hole 1030, an active pattern 1036 covering inner walls of the hole 1030 on which the first dielectric pattern 1033 is formed, a gap filling pattern 1039 formed on the active pattern 1036 to partially fill the hole 1030, a pad pattern 1042 disposed on the gap filling pattern 1039.

Figure 36E:
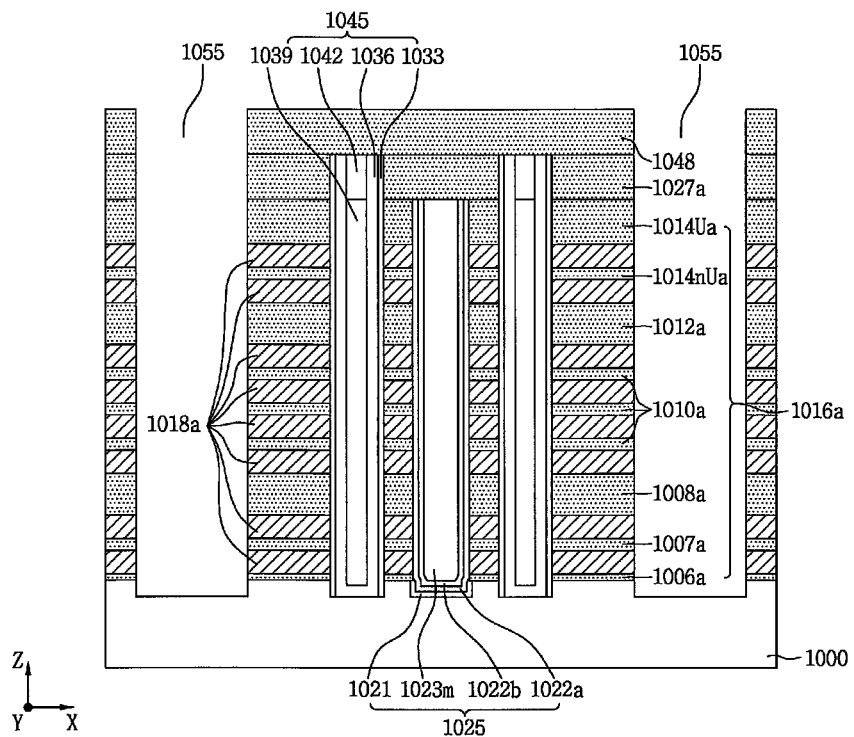

Referring to FIG. 36E, a second capping layer may be formed on the substrate 1000 having the vertical structures 1045. Thereafter, as described with reference to FIG. 30J, second openings 1055 may be formed to sequentially penetrate the second capping layer, the first capping layer 1027, and the horizontal layers 1016 and 1018. Sacrificial patterns 1018a, interlayer insulating patterns 1016a, first capping pattern 1027a, and second capping pattern 1048 may be defined between the second openings 1055.

Figure 36F:
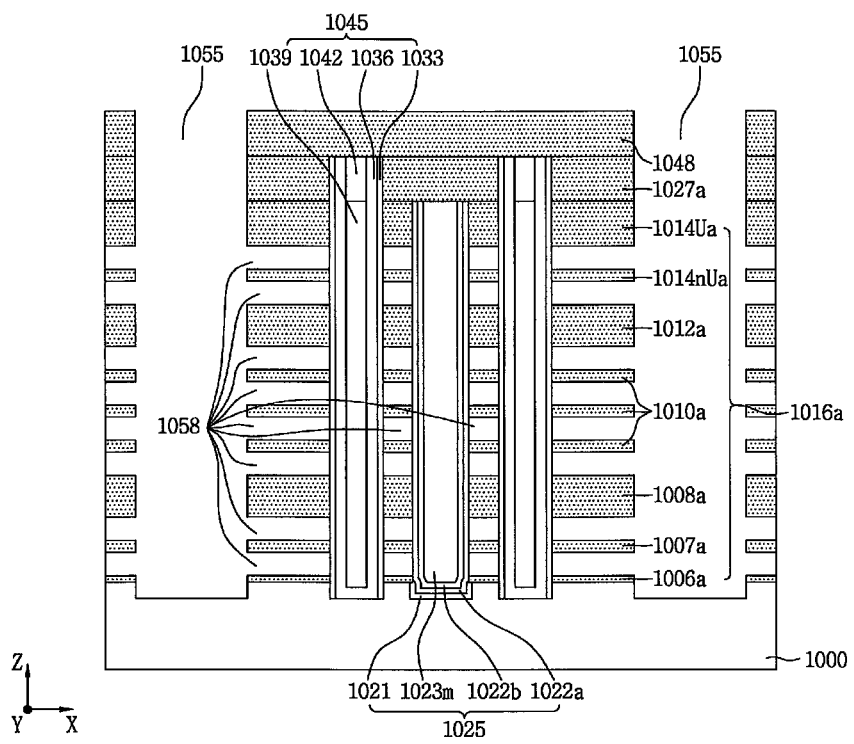

Referring to FIG. 36F, the sacrificial patterns 1018a exposed by the second openings 1055 may be removed to form vacant regions 1058.

Figure 36G:
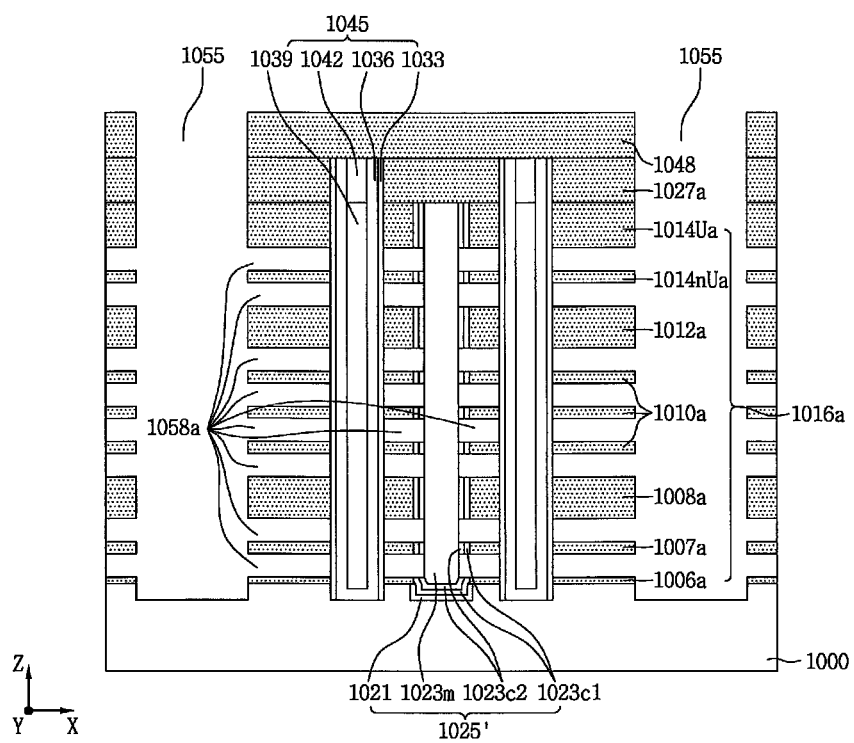
Figure 36H:
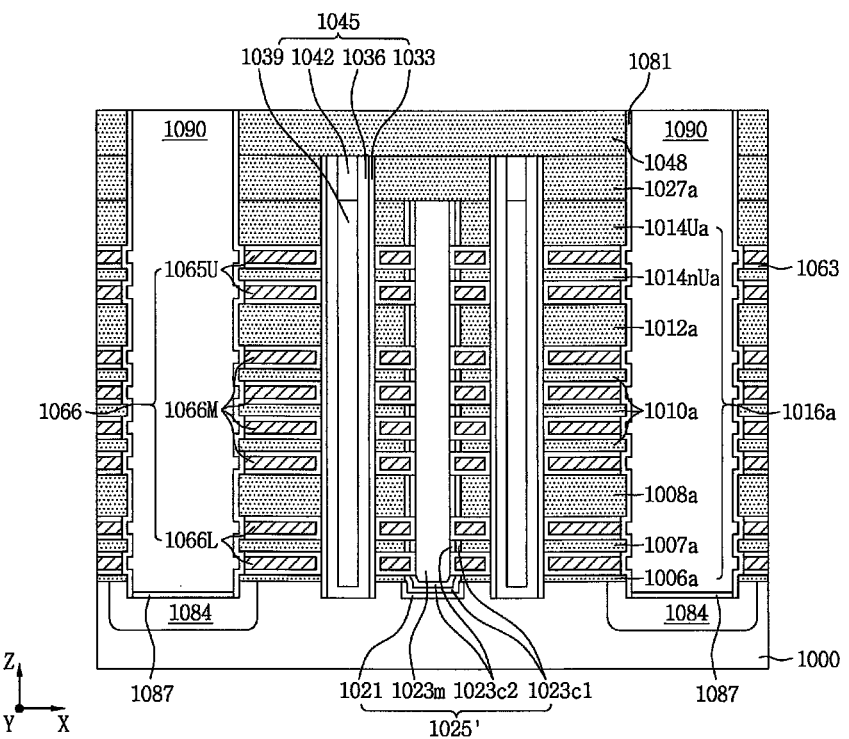

Referring to FIG. 36G, the first and second support patterns 1022a and 1022b may be etched to form expanded vacant regions 1058a. Also, the remaining first and second support patterns 1022a and 1022b may be defined as first and second subsidiary support patterns 1023c1 and 1023c2. In this case, the third support pattern 1023m may be defined as a main support pattern 1023m. Accordingly, support patterns 1025' including the first and second subsidiary support patterns 1023a and 1023b, the main support pattern 1023m, and the oxide 1021 and having rough side surfaces may be formed. Subsequently, referring to FIG. 36H, substantially the same process as described with reference to FIGS. 30M through 30R may be performed, thereby fabricating the semiconductor device described with reference to FIG. 10.

Next, a method of fabricating the semiconductor device according to the fourth embodiment of the inventive concept, will be described with reference to FIG. 14B, will be described with reference to FIGS. 37A through 37D.

Figure 37A:
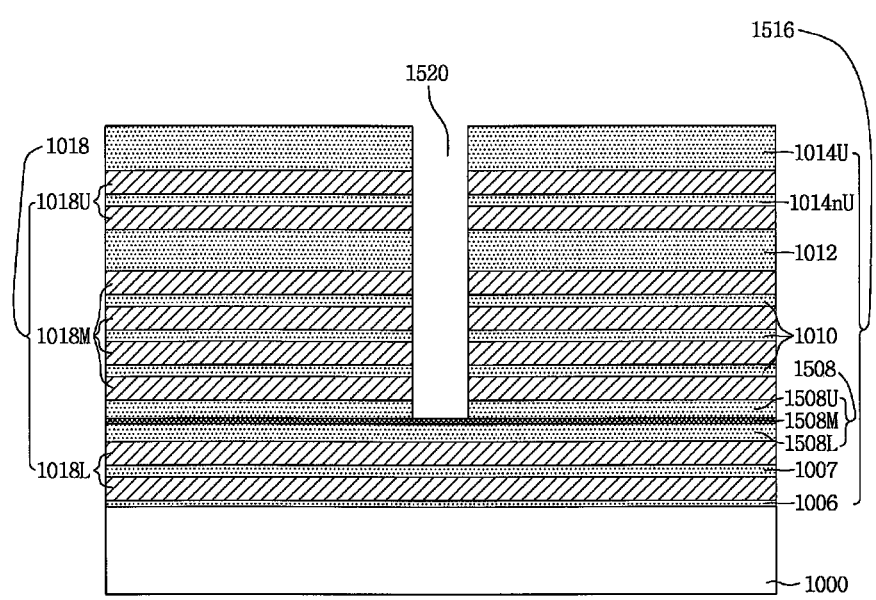
FIGS. 37A through 37E are cross-sectional views illustrating a method of fabricating a semiconductor device according to the fourth embodiment of the inventive concept and modified examples thereof.

Referring to FIG. 37A, horizontal layers 1516 and 1018 may be formed on a substrate 1000. As described with reference to FIG. 36A, the horizontal layers 1516 and 1018 may include a plurality of interlayer insulating layers 1516 and a plurality of sacrificial layers 1018 stacked alternately and repetitively.

As described with reference to FIG. 36A, the sacrificial layers 1018 may include at least one lower sacrificial layer 1018L, a plurality of middle sacrificial layers 1018M, and at least one upper sacrificial layer 1018U.

The interlayer insulating layers 1516 may include a lowermost insulating layer 1006 interposed between the at least one sacrificial layer 1018L and the substrate 1000, a lower interlayer layer 1007 interposed between the at least one sacrificial layer 1018L, a lower insulating layer 1508 interposed between the at least one lower sacrificial layer 1018L and the middle sacrificial layers 1018M, middle interlayer layers 1010 interposed between the middle sacrificial layers 1018M, an upper insulating layer 1012 interposed between the middle sacrificial layers 1018M and the upper sacrificial layers 1018U, an upper interlayer layer 1014nU interposed between the upper sacrificial layers 1018U, and an uppermost insulating layer 1014U disposed on the upper sacrificial layers 1018U.

Among the interlayer insulating layers 1516, the lower insulating layer 1508 may have a stack structure including a plurality of layers. For example, the lower insulating layer 1508 may include a first lower insulating layer 1508L, a second lower insulating layer 1508M disposed on the first lower insulating layer 1508L, and a third lower insulating layer 1508U disposed on the second lower insulating layer 1508M. The second lower insulating layer 1508M may be formed of a material layer having an etch selectivity with respect to the third lower insulating layer 1508U. For example, when the third lower insulating layer 1508U is formed of silicon oxide, the second lower insulating layer 1508M may be formed of a high-k dielectric material, such as hafnium oxide or aluminum oxide or a material, such as silicon. Here, silicon may be a-Si or poly-Si.

Thereafter, the horizontal layers 1516 and 1018 may be partially etched to form first openings 1520. The first openings 1520 may be formed to penetrate the upper sacrificial layer 1018U, the middle sacrificial layers 1018M, the uppermost insulating layer 1014U, the upper interlayer layer 1014nU, the upper insulating layer 1012, and the middle interlayer layers 1010. Furthermore, the first openings 1520 may extend into the lower insulating layer 1508. In this case, the second lower insulating layer 1508M may serve as an etch stop layer. Accordingly, the first openings 1520 may penetrate the third lower insulating layer 1508U of the lower insulating layer 1508. Meanwhile, the first openings 1520 may penetrate even the second lower insulating layer 1508M.

The first openings 1520 may have bottom surfaces disposed at a higher level than the lower sacrificial layers 1018L.

In another modified example, to form the semiconductor device described with reference to FIG. 14A, the first openings 1520 may penetrate the lower insulating layer 1508 and extend to the lower sacrificial layers 1018L. In this case, the lower insulating layer 1508 may be a single layer like the lower insulating layer 1008 of FIG. 36A.

Figure 37B:
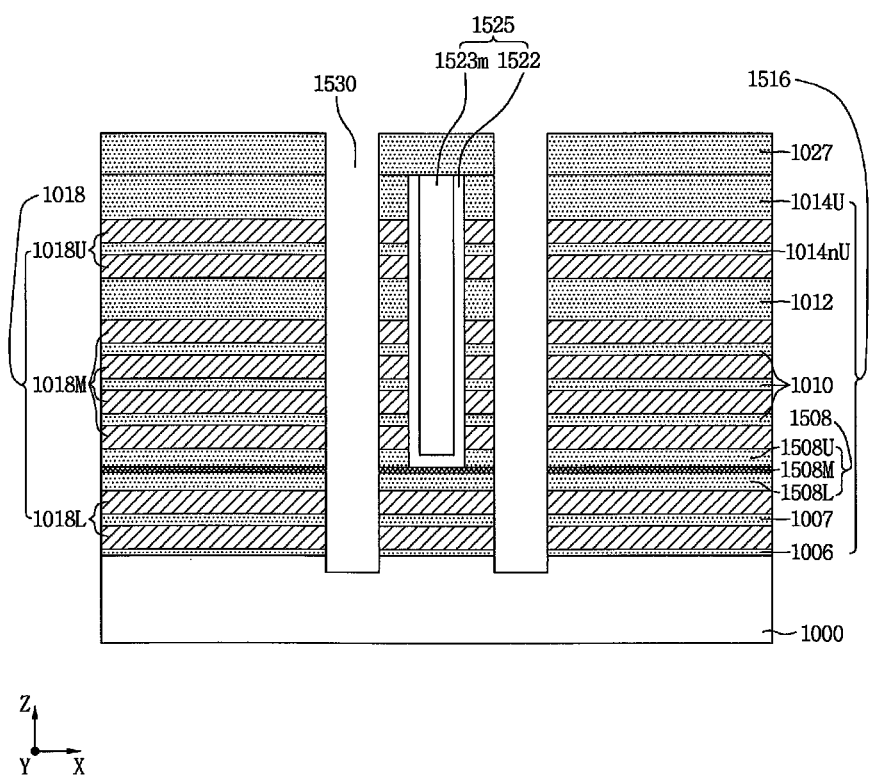

Referring to FIG. 37B, support patterns 1525 may be disposed within the first openings 1520. The support patterns 1525 may be a single layer or a composite layer. For instance, each of the support patterns 1525 may include a first support pattern 1522 conformally formed along an inner wall of the first opening 1520, and a second support pattern 1523m disposed on the first support pattern 1522 to fill the first opening 1520. The second support pattern 1523m may be formed of a material layer having an etch selectivity with respect to the first support pattern 1522. For instance, the second support pattern 1523m may be formed of silicon oxide or silicon nitride, while the first support pattern 1522 may be formed of a conductive material, such as poly-Si.

A first capping layer 1027 may be formed on the uppermost insulating layer 1014U to cover the support patterns 1525.

Thereafter, as described with reference to FIG. 30D, holes 1530 may be formed to penetrate the first capping layer 1027 and the horizontal layers 1516 and 1018.

Meanwhile, to form the semiconductor device of FIG. 28, the formation of the first capping layer 1027 may be omitted.

Figure 37C:
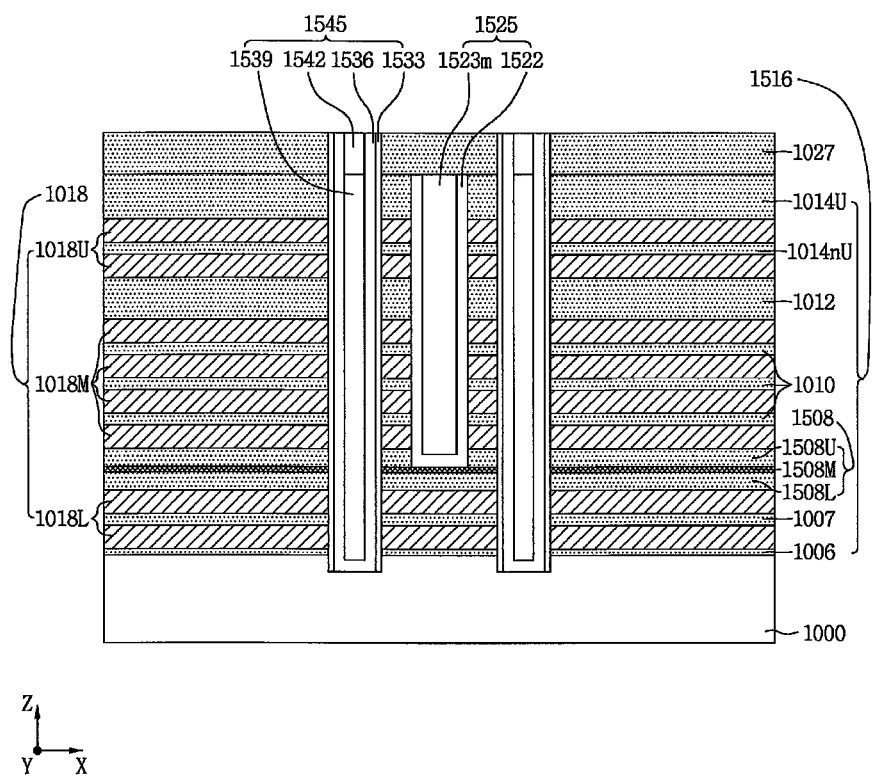

Referring to FIG. 37C, as described with reference to FIG. 36D, vertical structures 1545 may be formed within the holes 1530. Accordingly, each of the vertical structures 1545 may include a first dielectric pattern 1533 formed on sidewalls of the hole 1530, an active pattern 1536 covering an inner wall of the hole 1530 on which the first dielectric pattern 1533 is formed, a gap filling pattern 1539 formed on the active pattern 1536 to partially fill the hole 1530, and a pad pattern 1542 disposed on the gap filling pattern 1539.

Figure 37D:
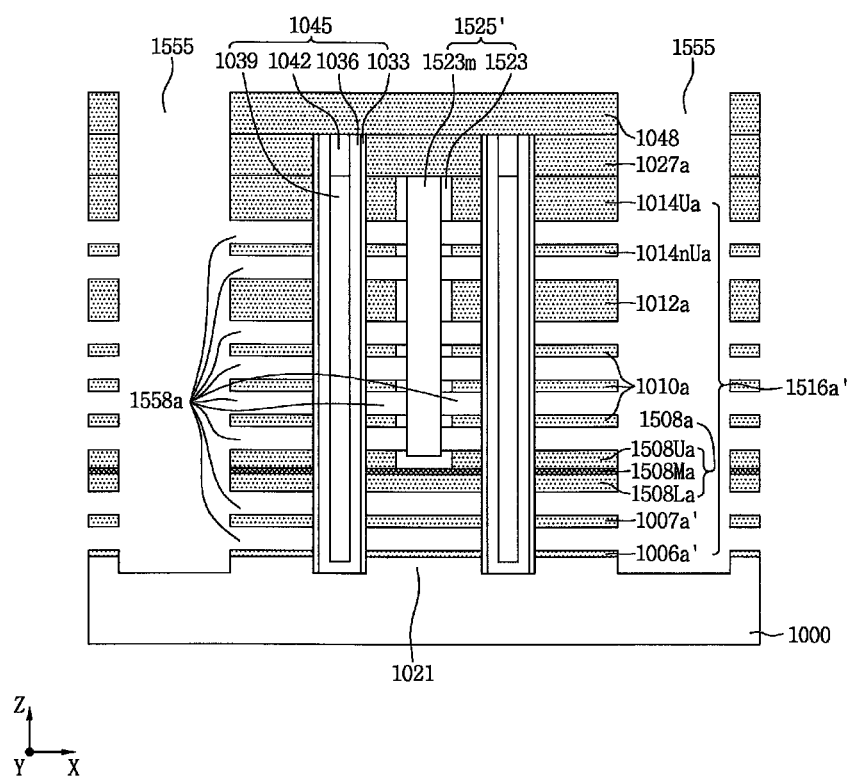

Referring to FIG. 37D, as described with reference to FIG. 36E, a second capping layer may be formed on the substrate 1000 having the vertical structures 1545, and second openings 1555 may be formed to sequentially penetrate the second capping layer, the first capping layer 1027, and the horizontal layers 1516 and 1018. Sacrificial patterns, interlayer insulating patterns 1016a', first capping pattern 1027a, and second capping pattern 1048 may be defined between the second openings 1555. Afterwards, the sacrificial patterns may be removed to form vacant regions, and the first support patterns 1522, which are disposed outermost among the support patterns 1525, may be selectively etched to form expanded vacant regions 1558a. In this case, the remaining first support patterns 1522 may be defined as subsidiary support patterns 1523, and the second support pattern 1523m may be defined as a main support pattern 1523m. Accordingly, support patterns 1525' having rough side surfaces may be formed.

Figure 37E:
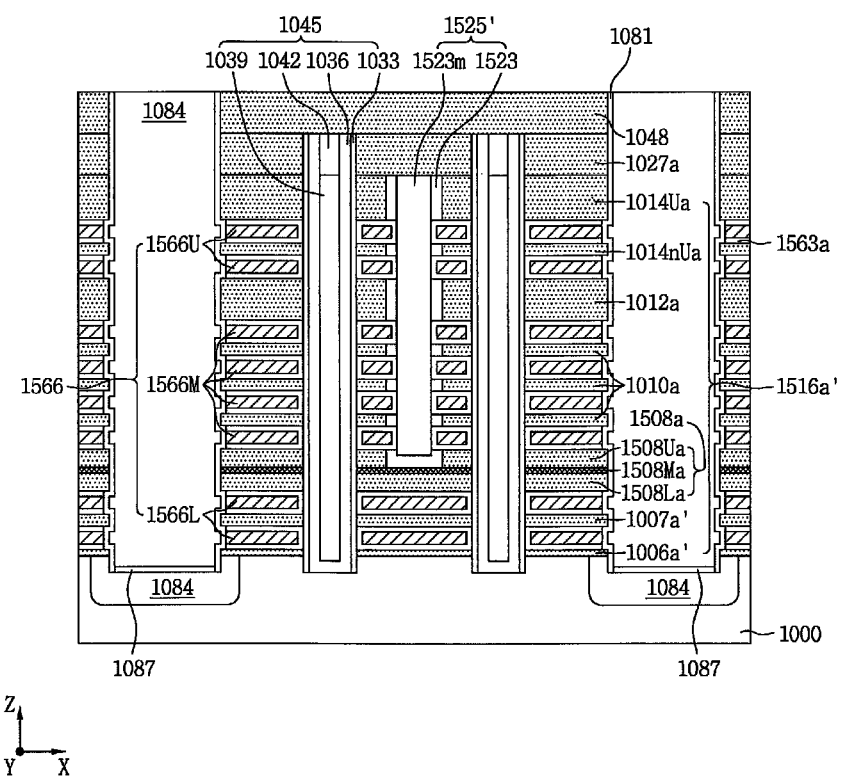

Afterwards, referring to FIG. 37E, substantially the same process as described with reference to FIGS. 30M through 30R may be performed to form the semiconductor device described with reference to FIG. 14B.

Next, methods of fabricating semiconductor devices according to the sixth through eighth embodiments of the inventive concept and modified examples thereof will be described with reference to FIG. 38.

Figure 38:
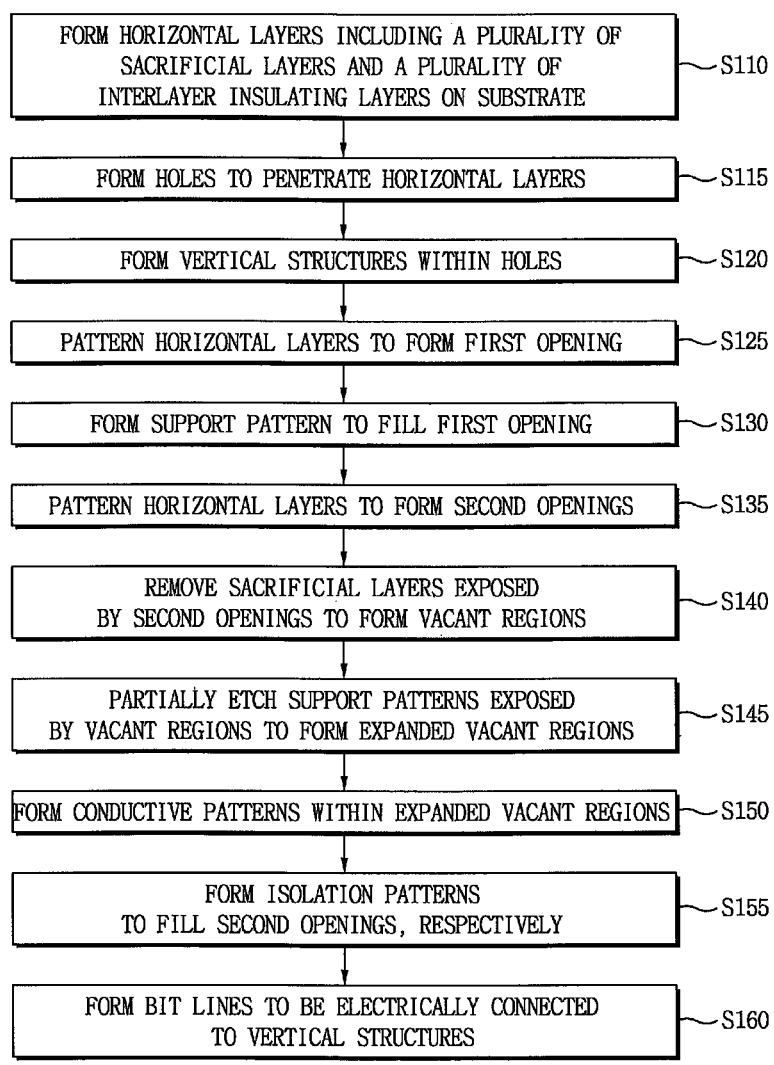
FIG. 38 is a flowchart illustrating fifth through seventh embodiments of the inventive concept and modified examples thereof.

Referring to FIG. 38, horizontal layers including a sacrificial layer and an interlayer insulating layer may be formed on a substrate (operation S110). Holes may be formed to penetrate the horizontal layers (operation S115). Vertical structures may be formed within the holes (operation S120). The horizontal layers may be patterned to form a first opening (operation S125). A support pattern may be formed to fill the first opening (operation S130). The horizontal layers may be patterned to form second openings (operation S135). The sacrificial layers exposed by the second openings may be removed to form vacant regions (operation S140). The support pattern exposed by the vacant regions may be partially etched, thereby forming expanded vacant regions (operation S145). Conductive patterns may be formed within the expanded vacant regions (operation S150). Isolation patterns may be respectively formed to fill the second openings (operation S155). Bit lines may be formed to be electrically connected to the vertical structures (operation S160).

Next, a method of fabricating the semiconductor device according to the fifth embodiment of the inventive concept, which is described with reference to FIG. 16, will be described with reference to FIGS. 38 and 39A through 39G.

Figure 39A:
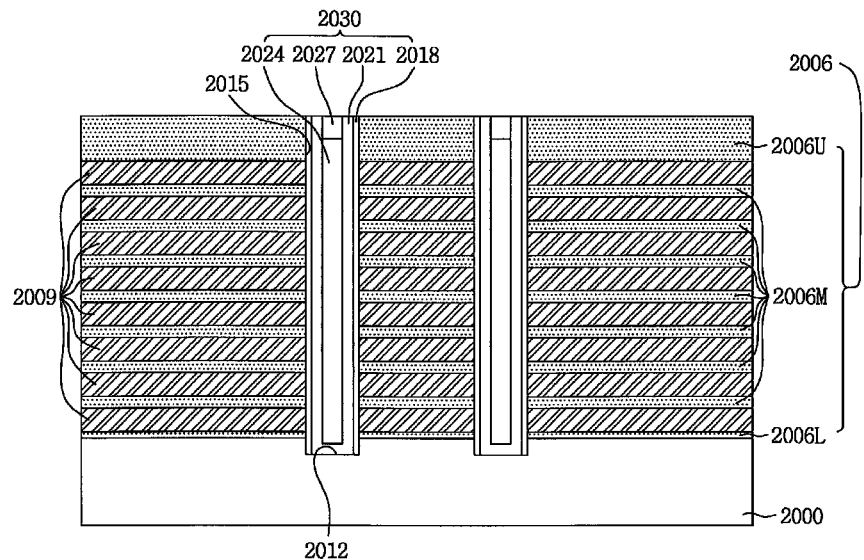
FIGS. 39A through 39G are cross-sectional views illustrating a method of fabricating a semiconductor device according to the fifth embodiment of the inventive concept and modified examples thereof.

Referring to FIGS. 38 and 39A, as described with reference to FIG. 30A, horizontal layers 2006 and 2009 including a plurality of sacrificial layers 2009 and a plurality of interlayer insulating layers 2006 may be formed on a substrate 2000 (operation S110). The substrate 2000 may be a semiconductor substrate. The horizontal layers 2006 and 2009 may include the interlayer insulating layers 2006 and the sacrificial layers 2009 stacked alternately and repetitively. As shown in FIG. 30A, the interlayer insulating layers 2006 may include a lowermost interlayer insulating layer 2006L, middle interlayer insulating layers 2006M, and an uppermost interlayer insulating layer 2006U.

Holes 2015 may be formed to penetrate the horizontal layers 2006 and 2009 (operation S115). As described with reference to FIG. 30D, the holes 2015 may include portions extending under the surface of the substrate 2000, that is, recessed portions 1012 of the substrate 2000.

Vertical structures 2030 may be formed within the holes 2015 (operation S120). The vertical structures 2030 may be formed using substantially the same method as described with reference to FIGS. 30E through 30H. As a result, each of the vertical structures 2030 may include a gap filling pattern 2024 penetrating the horizontal layers 2006 and 2009, a pad pattern 2027 disposed on the gap filling pattern 2024; an active pattern 2021 covering bottom and side surfaces of the gap filling pattern 2024 and extending onto side surfaces of the pad pattern 2027, and a first dielectric pattern 2018 interposed between side surfaces of the active pattern 2021 and sidewalls of the corresponding one of the holes 2015.

Figure 39B:
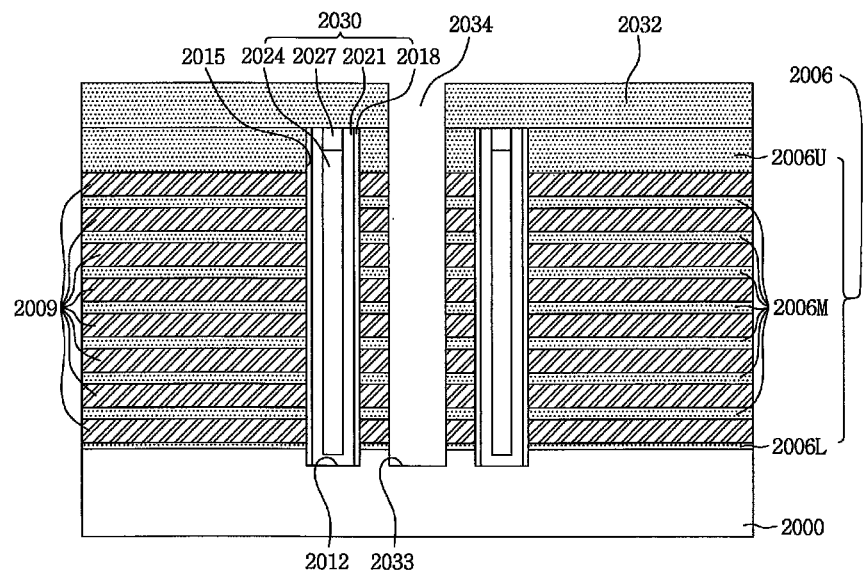

Referring to FIGS. 38 and 39B, a first capping layer 2030 may be formed on the substrate 2000 having the vertical structures 2030. Thereafter, first openings 2034 may be formed to penetrate the first capping layer 2032 and the horizontal layers 2006 and 2009 (operation S125). The first openings 2034 may penetrate the horizontal layers 2006 and 2009 and extend under the surface of the substrate 2000. That is, the first openings 2034 may include recessed portions 2033 of the substrate 2000.

Figure 39C:
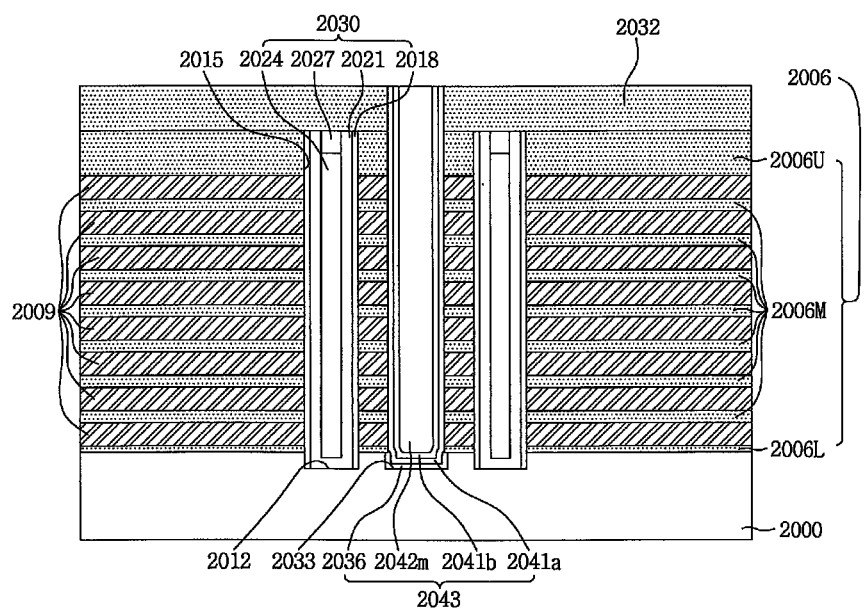

Referring to FIGS. 38 and 39C, support patterns 2043 may be formed within the first openings 2034 (operation S130). The support patterns 2043 may have the same shape as in FIG. 32A. That is, the support patterns 2043 may include an oxide 2036 formed by oxidizing the substrate 2000 exposed by the first openings 2034, a first support pattern 2041a and a second support pattern 2041b formed on the oxide 2036 and sequentially conformally formed on inner walls of the first openings 2034, and a third support pattern 2042m filling the remaining portions of the first openings 2034. However, the inventive concept is not limited thereto, and the support patterns 2043 may have the same shape as in FIG. 30C, or the same shape as in FIG. 31A.

Figure 39D:
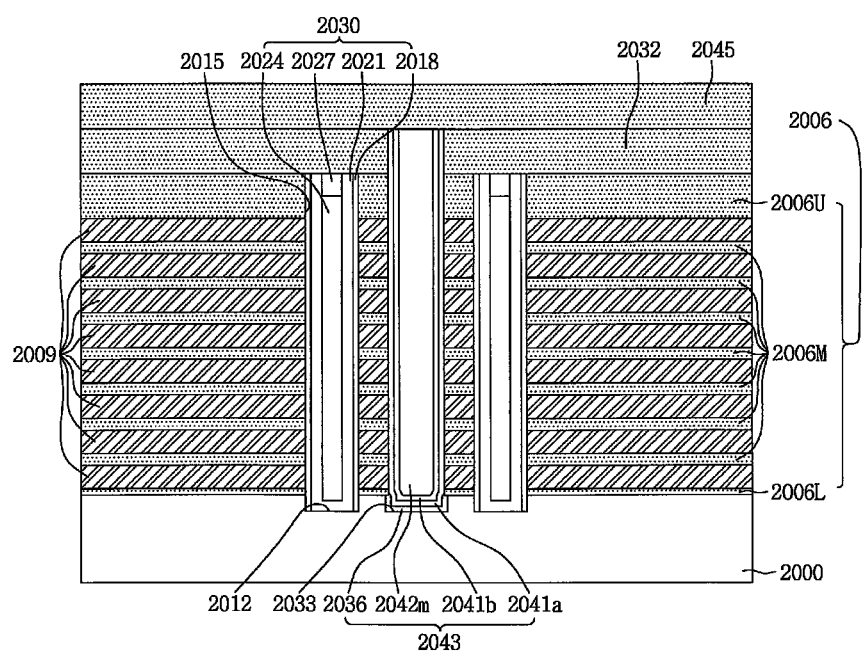

Referring to FIG. 39D, a second capping layer 2045 may be formed on the substrate 2000 having the support patterns 2043.

Figure 39E:
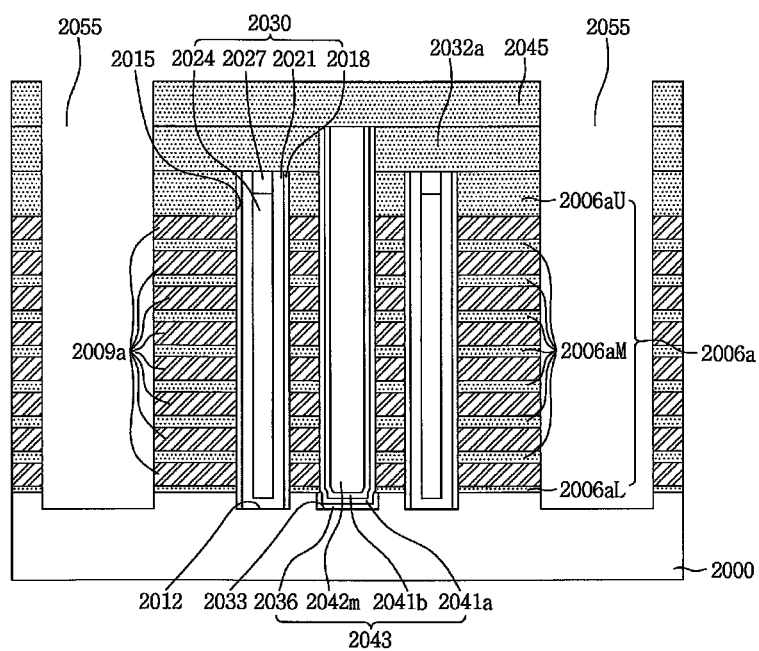

Referring to FIGS. 38 and 39E, second openings 2055 may be formed to penetrate the second capping layer 2045, the first capping layer 2032, and the horizontal layers 2006 and 2009 (operation S135). Due to the openings 2055, the sacrificial layers 2009 may be defined as sacrificial patterns 2009a, the interlayer insulating layers 2006 may be defined as interlayer insulating patterns 2006a, and the first and second capping layers 2032 and 2045 may be defined as first and second capping patterns 2032a and 2045a.

Figure 39F:
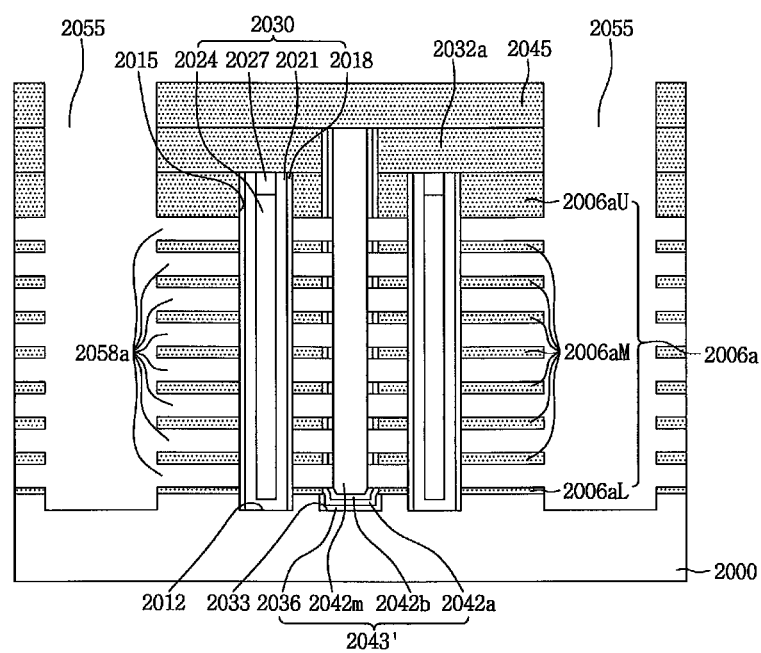

Referring to FIGS. 38 and 39F, the sacrificial layers (i.e., sacrificial patterns 2009a) exposed by the second openings 2055 may be removed to form vacant regions (operation S140). Thereafter, the first and second support patterns 2041a and 2041b of the support patterns 2043 may be sequentially etched to form expanded vacant regions 2058a (operation S145). In this case, the third support patterns 2042m may be defined as main support patterns, while the remaining first and second support patterns may be defined as first and second subsidiary support patterns 2042a and 2042b.

Figure 39G:
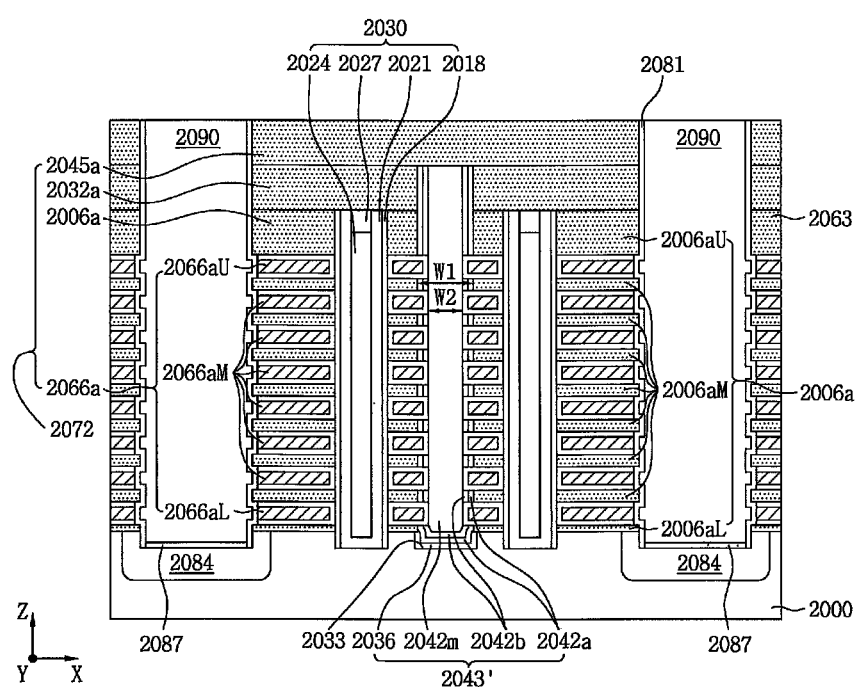

Referring to FIGS. 38 and 39G, substantially the same method as described with reference to FIGS. 30M through 30P may be performed on the substrate 2000 having the expanded vacant regions 2058a so that second dielectric patterns 2063 and conductive patterns 2066a may be formed within the expanded vacant regions 2058a (S150).

Subsequently, as described with reference to FIGS. 30Q through 30R, impurity regions 2084 may be formed in the substrate 2000 under the second openings 2055, and spacers 2081 may be formed on sidewalls of the second openings 2055. Metal-semiconductor compounds 2087 may be formed on the substrate 2000 exposed by the second openings 2055. Thereafter, isolation patterns 2090 may be formed to fill the second openings 2055 (operation S155). Next, as described with reference to FIG. 16, plugs 2093 may be formed to penetrate the first and second capping patterns 2045a and 2045a and electrically connected to the vertical structures 2030, and conductive lines (i.e., bit lines 2096) electrically connected to the plugs 2093 may be formed on the plugs 2093 (S160).

Next, a method of fabricating the semiconductor device according to the sixth embodiment of the inventive concept, which is described with reference to FIG. 20, will be described with reference to FIGS. 40A through 40D.

Figure 40A:
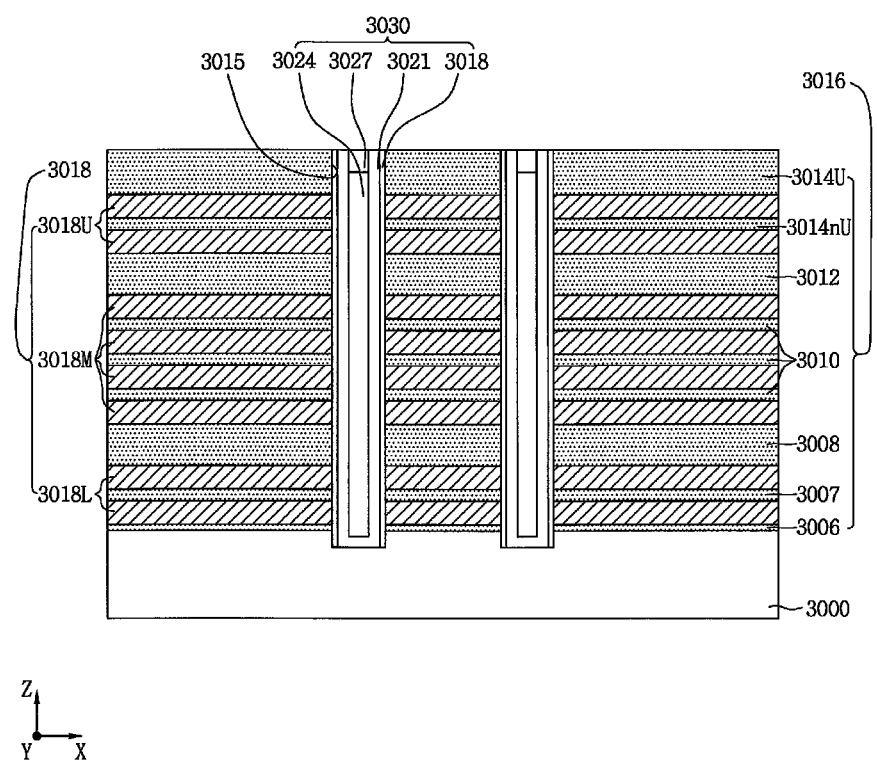
FIGS. 40A through 40D are cross-sectional views illustrating a method of fabricating a semiconductor device according to the sixth embodiment of the inventive concept and modified examples thereof.

Referring to FIG. 40A, as described with reference to FIG. 36A, horizontal layers 3016 and 3018 including a plurality of sacrificial layers 3018 and a plurality of interlayer insulating layers 3016 may be formed on a substrate 3000. The sacrificial layers 3018 and the interlayer insulating layers 3016 may be alternately and repetitively stacked on the substrate 3000.

As described with reference to FIGS. 36C and 36D, holes 3015 may be formed to penetrate the horizontal layers 3016 and 3018, and vertical structures 3030 may be formed within the holes 3015. As a result, each of the vertical structures 3030 may include a first dielectric pattern 3018 formed on sidewalls of the hole 3015, an active pattern 3021 covering an inner wall of the hole 3015 in which the first dielectric pattern 3018 is formed, a gap filling pattern 3024 formed on the active pattern 3021 to partially fill the hole 3015, and a pad pattern 3027 disposed on the gap filling pattern 3024.

Figure 40B:
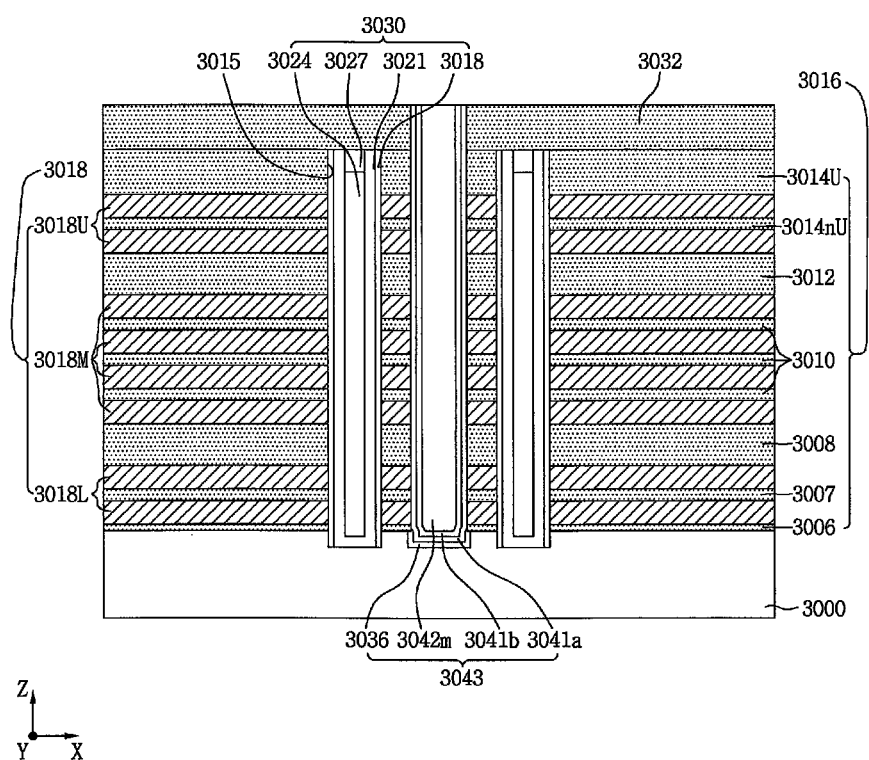

Referring to FIG. 40B, a first capping pattern 3032 may be formed on the substrate 3000 having the vertical structures 3030. Thereafter, first openings 3034 may be formed to penetrate the first capping layer 3032 and the horizontal layers 3016 and 3018, and support patterns 3043 may be formed within the first openings 3034.

Each of the support patterns 3043 may have the same shape as in FIG. 36B. That is, each of the support patterns 3043 may include an oxide 3036 formed by oxidizing the substrate 3000 exposed by the first openings 3043, a first support pattern 3041a and a second support pattern 3041b disposed on the oxide 3036 and sequentially conformally formed on inner walls of the first openings 3034, and a third support pattern 3042m filling the remaining portions of the first openings 3034. However, the inventive concept is not limited thereto, and the support patterns 3043 may have the same shape as in FIG. 30C, or the same shape as in FIG. 31A.

Figure 40C:
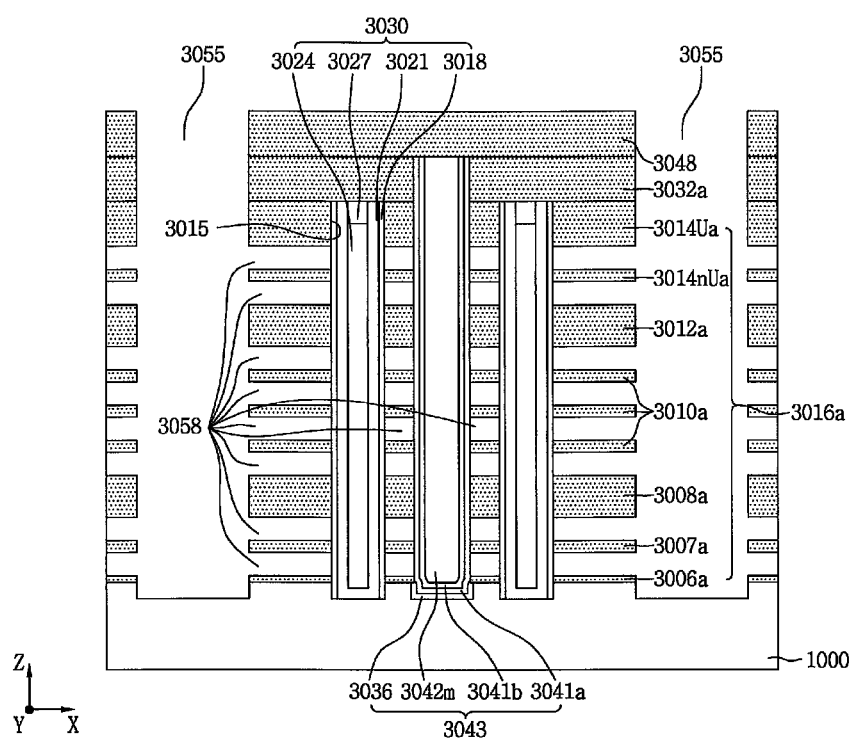

Thereafter, referring to FIG. 40C, a second capping layer may be formed on the substrate 3000 having the support patterns 3043, and second openings 3055 may be formed to penetrate the second capping layer, the first capping layer 3032a, and the horizontal layers 3016 and 3018.

Subsequently, the sacrificial layers 3018 exposed by the second openings 3055 may be removed to form vacant regions 3058.

Figure 40D:
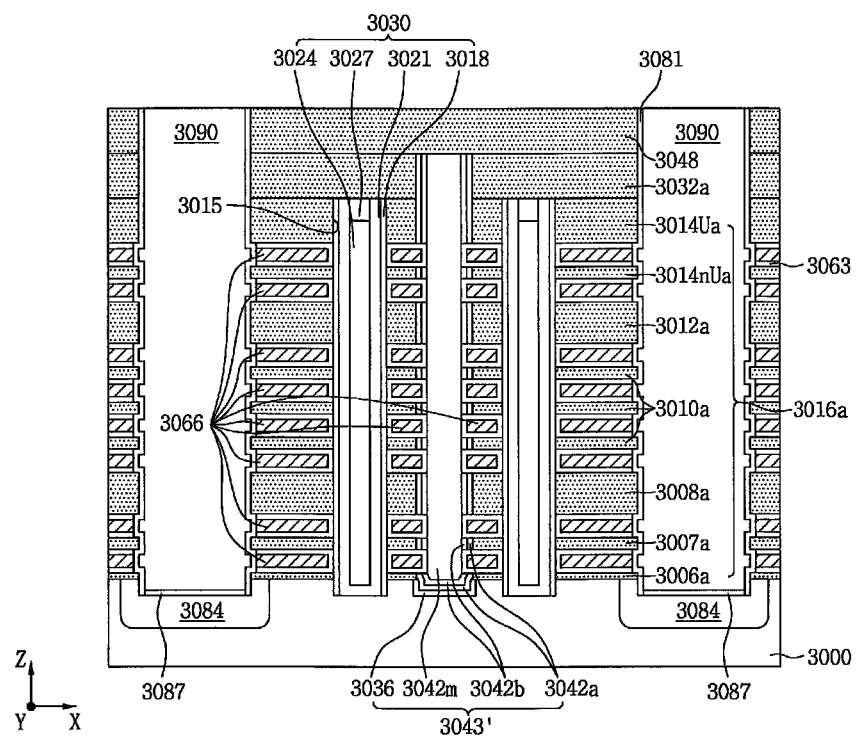

Referring to FIG. 40D, the support patterns 3043 exposed by the vacant regions 3058 may be partially etched to form expanded vacant regions and support patterns 3043' having rough side surfaces. Accordingly, the support patterns 3043' described with reference to FIG. 20 may be formed.

Substantially the same method as described with reference to FIGS. 30M through 30P may be performed on the substrate 3000 having the expanded vacant regions, thereby forming second dielectric patterns 3063 and conductive patterns 3066 within the expanded vacant regions. Thereafter, as described with reference to FIGS. 30Q through 30R, impurity regions 3084 may be formed in the substrate 3000 under the second openings 3055, and spacers 3081 may be formed on sidewalls of the second openings 3055. Metal-semiconductor compounds 3087 may be formed on the substrate 3000 exposed by the second openings 3055. Thereafter, isolation patterns 3090 may be formed to fill the second openings 3055. Subsequently, plugs 3093 and conductive lines 3096 may be sequentially formed as described with reference to FIG. 20.

Next, methods of fabricating the semiconductor device according to the sixth embodiment described with reference to FIG. 23 and modified examples thereof will be described with reference to FIGS. 41A through 41D.

Figure 41A:
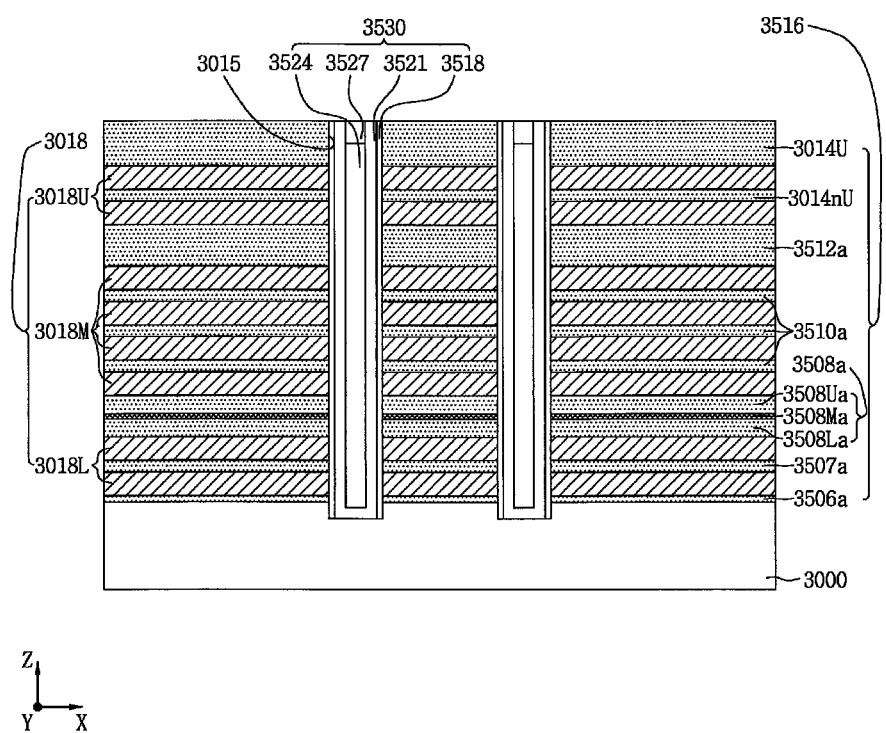
FIGS. 41A through 41D are cross-sectional views illustrating a method of fabricating a semiconductor device according to the seventh embodiment of the inventive concept and modified examples thereof.

Referring to FIG. 41A, as described with reference to FIG. 37A, horizontal layers 3516 and 3018 including a plurality of interlayer insulating layers 1516 and a plurality of sacrificial layers 1018 may be formed on a substrate 3000. The interlayer insulating layers 1516 and the sacrificial layers 1018 may be alternately and repetitively stacked on the substrate 3000.

As in FIG. 37A, the sacrificial layers 3018 may include at least one lower sacrificial layer 3018L, a plurality of middle sacrificial layers 3018M, and at least one upper sacrificial layer 3018U.

The interlayer insulating layers 3516 may include a lowermost insulating layer 3006a interposed between the lower sacrificial layers 3018L and the substrate 3000, a lower interlayer layer 3007 interposed between the at least one lower sacrificial layer 3018L, a lower insulating layer 3508 interposed between the lower sacrificial layers 3018L and the middle sacrificial layers 3018M, middle interlayer layers 3010a interposed between the middle sacrificial layers 3018M, an upper insulating layer 3012a interposed between the middle sacrificial layers 3018M and the upper sacrificial layers 3018U, an upper interlayer layer 3014U interposed between the at least one upper sacrificial layer 3018U, and an uppermost insulating layer 3014U disposed on the at least one upper sacrificial layer 3018U.

As described with reference to FIG. 37a, among the interlayer insulating layers 3516, the lower insulating layer 3508 may include a first lower insulating layer 3508L, a second lower insulating layer 3508M, and a third lower insulating layer 3508U stacked sequentially.

Thereafter, as described with reference to FIG. 40A, holes 3015 may be formed to penetrate the horizontal layers 3516 and 3018, and vertical structures 3530 may be formed within the holes 3015.

Figure 41B:
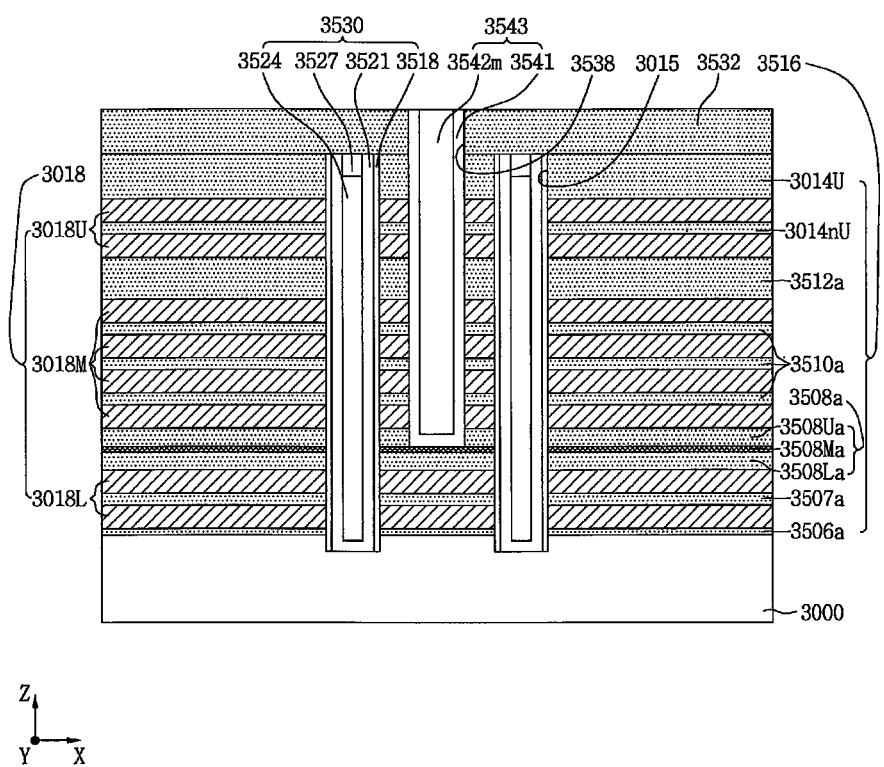

Referring to FIG. 41B, a first capping layer 3532 may be formed on the substrate 3000 having the vertical structures 3530. First openings 3538 may be formed to penetrate the first capping layer 3532, the upper sacrificial layer 3018U, the middle sacrificial layers 3018M, the uppermost insulating layer 3014U, the upper interlayer layer 3014nU, the upper insulating layer 3012, and the middle interlayer layers 3010. Furthermore, as described with reference to FIG. 37A, the first openings 3538 may extend into the lower insulating layer 3508a. The first openings 3538 may have bottom surfaces disposed at a higher level than the lower sacrificial layer 3508a.

Support patterns 3543 having a single layer or a composite layer may be formed within the first openings 3538. As described with reference to FIG. 37B, each of the support patterns 3543 may include a first support pattern 3541 conformally formed along an inner wall of the first opening 3538, and a second support pattern 3542m disposed on the first support pattern 3541 to fill the first opening 3538.

Figure 41C:
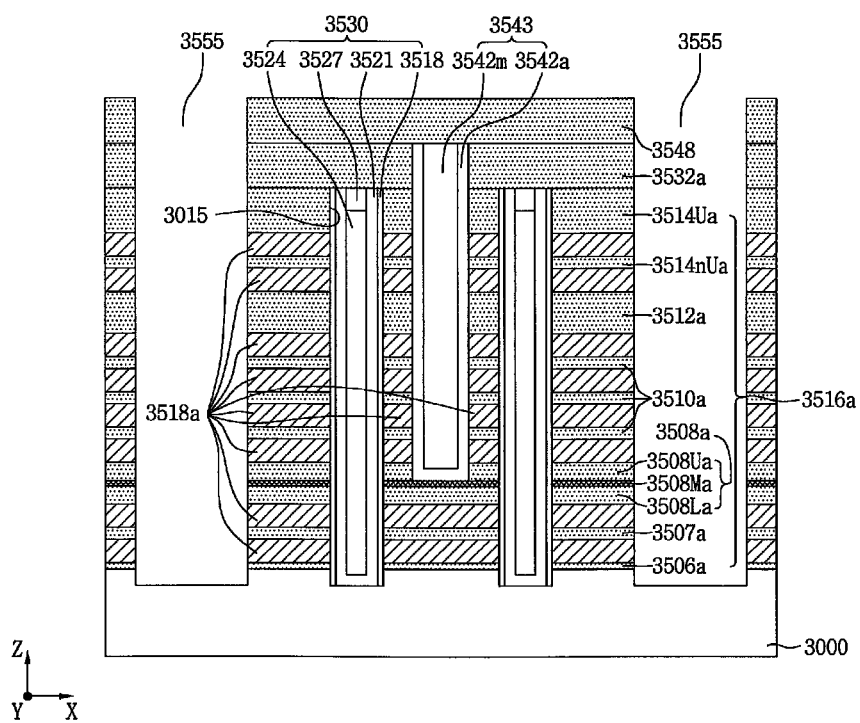

Referring to FIG. 41C, a second capping layer may be formed on the substrate 3000 having the support patterns 3543. Next, second openings 3555 may be formed to sequentially penetrate the second capping layer, the first capping layer 3532a, and the horizontal layers 3516a and 3518a.

Sacrificial patterns 3518a, interlayer insulating patterns 3516a', a first capping pattern 3532a, and a second capping pattern 3548 may be defined between the second openings 3555.

Figure 41D:
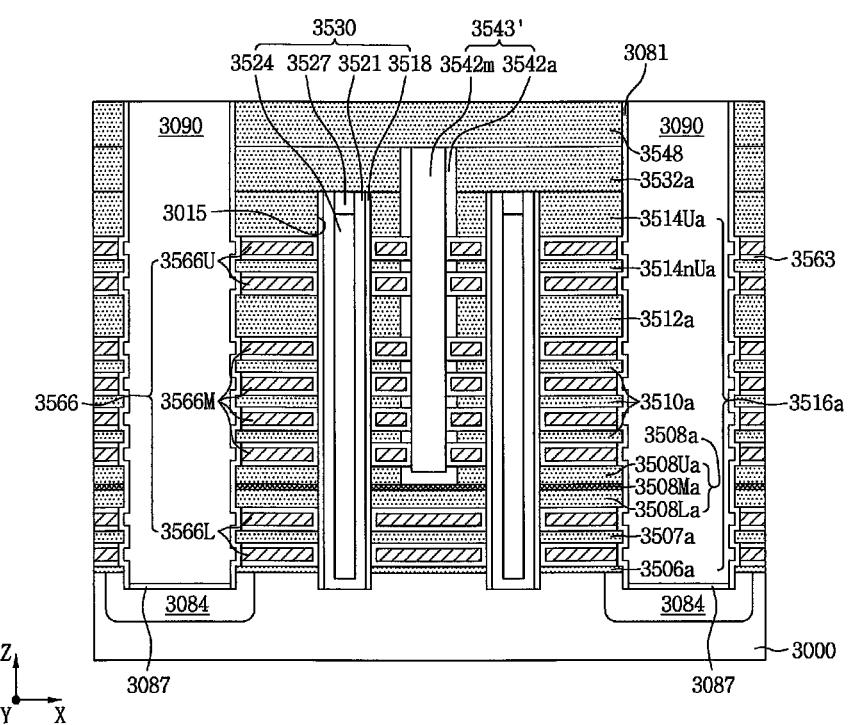

Referring to FIG. 41D, the sacrificial patterns 3518a may be removed to form vacant regions. The first support patterns 3541, which may be disposed outermost among the support patterns 3543, may be selectively etched to form expanded vacant regions and support patterns 3543' having rough side surfaces. Thereafter, substantially the same process as described with reference to FIGS. 30M through 30R may be performed to form the semiconductor device described with reference to FIG. 23.

The embodiments of the inventive concept provide structures for and methods of preventing damage to semiconductor devices or the occurrence of failures in the semiconductor devices during processes of fabricating the semiconductor devices, and provide highly reliable 3-dimensional semiconductor devices.

Figure 42:
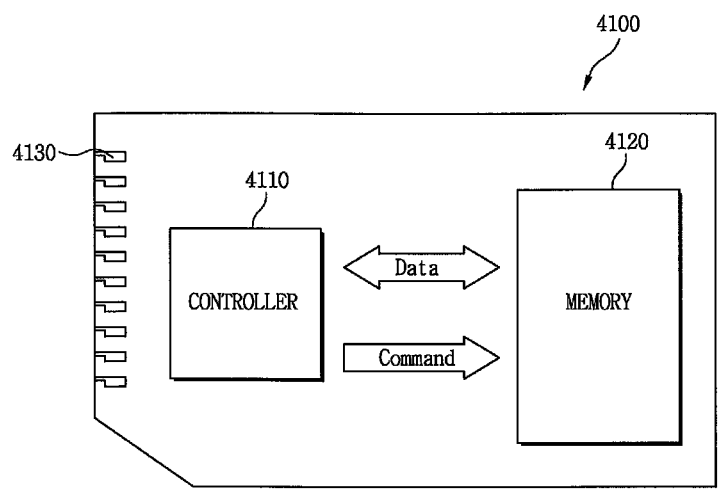
FIG. 42 is a schematic view of a memory card system including a semiconductor device according to embodiments of the inventive concept.

FIG. 42 is a diagram of a memory card system including a semiconductor device according to any one of the embodiments of the inventive concept described with reference to FIGS. 1 through 41D.

Referring to FIG. 42, a memory card system 4100 may be provided. The memory card system 4100 may include a controller 4110, a memory 4120, and an interfacer 4130. The controller 4110 and the memory 4120 may be configured to transmit and receive commands and/or data. For example, the memory 4120 may be used to store commands executed by the controller 4110 and/or data input by users. Accordingly, the memory card system 4100 may store data in the memory 4120 or externally output data from the memory 4120. The memory 4120 may include the semiconductor device according to any one of the embodiments of the inventive concept described with reference to FIGS. 1 through 41D, for example, a non-volatile memory device.

The interfacer 4130 may serve to externally input and output data. The memory card system 4100 may be a multimedia card (MMC), a secure digital card (SD), or a portable data storage device.

Figure 43:
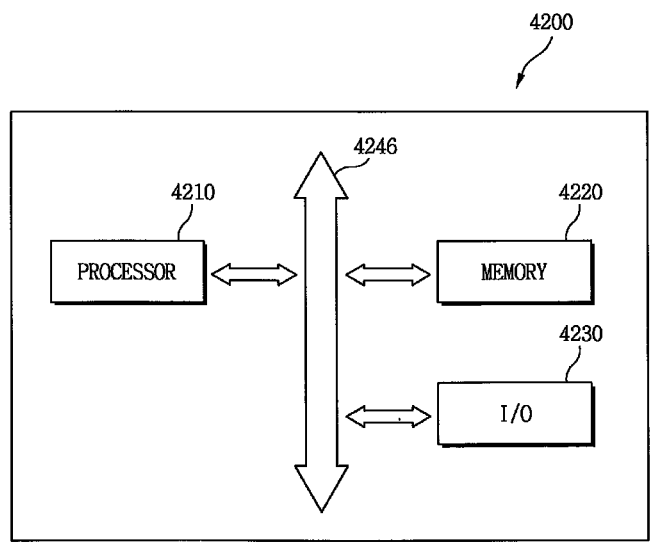
FIG. 43 is a block diagram of an electronic device including a semiconductor device according to embodiments of the inventive concept.

FIG. 43 is a block diagram of an electronic device including a semiconductor device according to one of the embodiments of the inventive concept described with reference to FIGS. 1 through 41D.

Referring to FIG. 43, an electronic device 4200 may be provided. The electronic device 4200 may include a processor 4210, a memory 4220, and an input/output (I/O) device 4230. The processor 4210, the memory 4220, and the I/O device 4230 may be connected through a bus 4246.

The memory 4220 may receive control signals, such as RAS*, WE*, and CAS*, from the processor 4210. The memory 4220 may store codes and data for operations of the processor 4210. The memory 4220 may be used to store data accessed through the bus 4246.

The memory 4220 may include a semiconductor device according to the embodiments of the inventive concept and modified examples thereof. For specific realization and modification of the inventive concept, additional circuits and control signals may be provided.

The electronic device 4200 may constitute various electronic control systems that may require the memory 4220. For example, the electronic device 4200 may be used for a computer system, a wireless communication system (e.g., a personal digital assistant (PDA), a laptop computer, a portable computer, a web tablet, a wireless phone, a portable phone, a digital music player, an MP3 player, a navigation, a solid-state disk (SSD), or a household appliance), or any device capable of transceiving information in wireless environments.

Specifically embodied and modified examples of the electronic device 4200 will now be described with reference to FIGS. 44 and 45.

Figure 44:
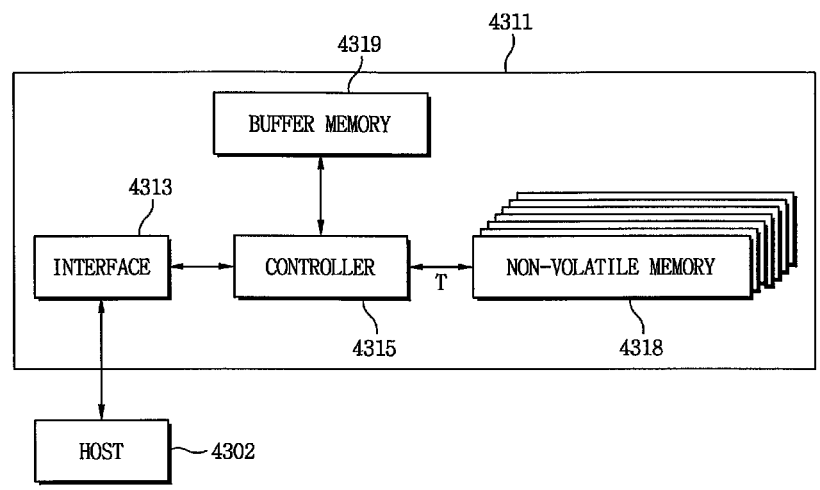
FIG. 44 is a block diagram of an electronic device (e.g., data storage device) including a semiconductor device according to embodiments of the inventive concept.

FIG. 44 is a system block diagram of an electronic device including the semiconductor device according to any one of the embodiments of the inventive concept described with reference to FIGS. 1 through 41D.

Referring to FIG. 44, the electronic device may be a data storage device, such as a solid-state disk (SSD) 4311. The SSD 4311 may include an interface 4313, a controller 4315, a non-volatile memory 4318, and a buffer memory 4319.

The SSD 4311 may store information using a semiconductor device. As compared with a hard disk drive (HDD), the SSD 4311 may operate at high speed, reduce mechanical delay, failure rate, generation of heat, and noise, and be downscaled and made lightweight. The SSD 4311 may be widely used for laptop personal computers (laptop PCs), netbooks, desktop PCs, MP3 players, or portable storage devices.

The controller 4315 may be formed adjacent to and electrically connected to the interface 4313. The controller 4315 may be a microprocessor (MP) including a memory controller and a buffer controller. The non-volatile memory 4318 may be formed adjacent to and electrically connected to the controller 4315 through a connection terminal T. The SSD 4311 may have data capacity corresponding to the non-volatile memory 4318. The buffer memory 4319 may be formed adjacent to and electrically connected to the controller 4315.

The interface 4313 may be connected to a host 4302 and serve to transmit and receive electric signals, such as data. For example, the interface 4313 may be an apparatus using a standard, such as serial advanced technology attachment (SATA), integrated drive electronics (IDE), small computer system interface (SCSI), and/or a combination thereof. The non-volatile memory 4318 may be connected to the interface 4313 through the controller 4315.

The non-volatile memory 4318 may function to store data received through the interface 4313. The non-volatile memory 4318 may include any one of the semiconductor devices according to the embodiments of the inventive concept described with reference to FIGS. 1 through 41D.

Even if power supplied to the SSD 4311 is interrupted, the non-volatile memory 4318 may be characterized by retaining the stored data.

The buffer memory 4319 may include a volatile memory device. The volatile memory device may be a dynamic random access memory (DRAM) and/or a static random access memory (SRAM). The buffer memory 4319 may operate at a higher speed than the non-volatile memory device 4318.

Data processing speed of the interface 4313 may be higher than operation speed of the non-volatile memory device 4318. Here, the buffer memory 4319 may function to temporarily store data. After data received through the interface 4313 is temporarily stored in the buffer memory 4319 through the controller 4315, the received data may be permanently stored in the non-volatile memory 4318 at a data write speed of the non-volatile memory 4318. Also, among the data stored in the non-volatile memory 4318, frequently used data may be previously read and temporarily stored in the buffer memory 4319. That is, the buffer memory 4319 may function to increase effective operating speed of the SSD 4311 and reduce error rate.

Figure 45:
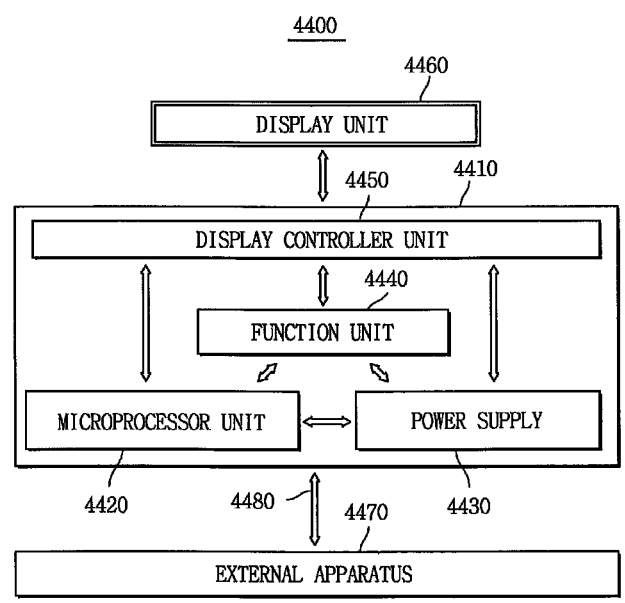
FIG. 45 is a block diagram of an electronic system including a semiconductor device according to embodiments of the inventive concept.

FIG. 45 is a system block diagram of an electronic system including the semiconductor device according to one of the embodiments of the inventive concept described with reference to FIGS. 1 through 41D.

Referring to FIG. 45, the semiconductor device according to one of the embodiments of the inventive concept described with reference to FIGS. 1 through 41D may be applied to an electronic system 4400. The electronic system 4400 may include a body 4410, an Microprocessor (MP) unit 4420, a power supply 4430, a function unit 4440, and a display controller unit 4450. The body 4410 may be a mother board including a PCB. The MP unit 4420, the power supply 4430, the function unit 4440, and the display controller unit 4450 may be mounted on the body 4410. The display unit 4460 may be disposed inside or outside the body 4410. For example, the display unit 4460 may be disposed on the surface of the body 4410 and display an image processed by the display controller unit 4450.

The power supply 4430 may function to receive a predetermined voltage from an external battery (not shown), divide the voltage into required voltage levels, and supply the divided voltages to the MP unit 4420, the function unit 4440, and the display controller unit 4450. The MP unit 4420 may receive a voltage from the power supply 4430 and control the function unit 4440 and the display unit 4460. The function unit 4440 may serve various functions of the electronic system 4400. For example, when the electronic system 4400 is a portable phone, the function unit 4440 may include several components capable of serving various functions of the portable phone, for example, outputting an image to the display unit 4460 or outputting a voice to a speaker, by dialing or communicating with an external apparatus 4470. When a camera is also mounted, the function unit 4440 may serve as a camera image processor.

In applied embodiments, when the electronic system 4400 is connected to a memory card to increase capacity, the function unit 4440 may be a memory card controller. The function unit 4440 may transmit/receive signals to/from the external apparatus 4470 through a wired or wireless communication unit 4480. Furthermore, when the electronic system 4400 requires a universal serial bus (USB) to increase functionality, the function unit 4440 may serve as an interface controller. The semiconductor device according to one of the embodiments of the inventive concept described with reference to FIGS. 1 through 41D may be applied to at least one of the MP unit 4420 and the function unit 4440.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor device comprising:
   first and second isolation patterns disposed on a substrate;
   interlayer insulating patterns and conductive patterns that are alternately stacked on a surface of the substrate between the first and second isolation patterns;
   a support pattern that penetrates the conductive patterns and the interlayer insulating patterns, the support pattern having a smaller width than a width of the first and second isolation patterns; and
   first and second vertical structures that respectively penetrate the conductive patterns and the interlayer insulating patterns at opposite sides of the support pattern,
   wherein a distance between top and bottom surfaces of the support pattern is greater than a distance between the bottom surface of the support pattern and the surface of the substrate.

2. The device of claim 1, wherein, from a plan view, the support pattern and the first and second isolation patterns have linear shapes substantially parallel to one another.

3. The device of claim 1,
   wherein the support pattern includes first portions having a first width, and second portions having a second width less than the first width.

4. The device of claim 3, wherein the first portions of the support pattern are disposed between the interlayer insulating patterns, and
   wherein the second portions of the support pattern are disposed between the conductive patterns.

5. The device of claim 4, wherein each of the first and second isolation patterns has a third width at substantially a same level as the interlayer insulating patterns, and has a fourth width greater than the third width at substantially a same level as the conductive patterns.

6. The device of claim 1, wherein the support pattern has a top surface disposed at a different level from top surfaces of the first and second vertical structures and wherein the first and second isolation patterns have top surfaces disposed at a higher level than the support pattern and the first and second vertical structures.

7. The device of claim 1, wherein the support pattern includes a main support pattern and subsidiary support patterns disposed on side surfaces of the main support pattern,
wherein the subsidiary support patterns are disposed between the interlayer insulating patterns and the main support pattern and formed of a material different from a material of the main support pattern.

8. The device of claim 1, wherein a distance between the first isolation pattern and the first vertical structure is different from a distance between the support pattern and the first vertical structure.

9. A semiconductor device comprising:
isolation patterns disposed on a semiconductor substrate;
conductive patterns and interlayer insulating patterns that are alternately stacked and disposed on the semiconductor substrate between the isolation patterns;
vertical structures penetrating the conductive patterns and the interlayer insulating patterns; and
a support pattern penetrating the conductive patterns and the interlayer insulating patterns between the vertical structures, the support pattern having a smaller width than the isolation patterns,
wherein the support pattern has a first width in portions adjacent the interlayer insulating patterns, and has a second width in portions adjacent the conductive patterns, and the second width is different from the first width.

10. The device of claim 9, wherein the support pattern includes a main support pattern and subsidiary support patterns formed of a material layer having an etch selectivity with respect to the main support pattern,
wherein the main support pattern penetrates the conductive patterns and the interlayer insulating patterns, and
wherein the subsidiary support patterns include side subsidiary patterns interposed between the interlayer insulating patterns and the main support pattern, and a bottom subsidiary pattern interposed between the main support pattern and the semiconductor substrate.

11. The device of claim 9, further comprising a recess region disposed in a surface of the semiconductor substrate,
wherein the support pattern extends into the recess region.

12. The device of claim 9, wherein the support pattern includes a conductive material layer and an insulating oxide layer interposed between the conductive material layer and the semiconductor substrate.

13. The device of claim 9, wherein, from a plan view, the vertical structures are arranged such that vertical structures adjacent one another are non-colinear in between the isolation patterns and support pattern.

14. The device of claim 1,
wherein the conductive patterns include a lower conductive pattern, a plurality of middle conductive patterns disposed on the lower conductive pattern, and an upper conductive pattern disposed on the plurality of middle conductive patterns,
wherein the interlayer insulating patterns include a lowermost insulating pattern interposed between the lower conductive pattern and the semiconductor substrate, the lowermost insulating pattern interposed between the lower conductive pattern and the plurality of middle conductive patterns, middle insulating patterns interposed between the plurality of middle conductive patterns, an upper insulating pattern interposed between the plurality of middle conductive patterns and the upper conductive pattern, and an uppermost insulating pattern disposed on the upper conductive pattern, and
wherein a capping pattern is disposed on the uppermost insulating pattern.

15. The device of claim 14, wherein the support pattern further extends into the lowermost insulating pattern, and
wherein a bottom surface of the support pattern is disposed at a higher level than the lower conductive pattern.

16. The device of claim 14, wherein the support pattern extends below a surface of the semiconductor substrate.

17. The device of claim 14, further comprising a conductive line disposed on the interlayer insulating patterns and conductive patterns that are alternately stacked
wherein the conductive line has a smaller width than the first vertical structure.

18. The device of claim 14, wherein one of the first vertical structure and the support pattern extends upward to penetrate the capping pattern, and the other thereof is covered with the capping pattern.

19. The device of claim 18, further comprising an electrically conductive contact plug extending from a conductive line to the first vertical structure.

20. The device of claim 19, wherein the electrically conductive contact plug penetrates the capping pattern.

* * * * *